(12) United States Patent
Kang et al.

(10) Patent No.: US 8,543,881 B2
(45) Date of Patent: Sep. 24, 2013

(54) APPARATUS AND METHOD FOR HIGH THROUGHPUT UNIFIED TURBO DECODING

(75) Inventors: Insung Kang, San Diego, CA (US); Ju Won Park, Santa Clara, CA (US); Brian C. Bannister, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 797 days.

(21) Appl. No.: 12/558,325

(22) Filed: Sep. 11, 2009

(65) Prior Publication Data

US 2011/0066913 A1 Mar. 17, 2011

(51) Int. Cl.
*H03M 13/29* (2006.01)
*H03M 13/53* (2006.01)

(52) U.S. Cl.
USPC .......................................... 714/752; 714/796

(58) Field of Classification Search
None
See application file for complete search history.

(56) References Cited

U.S. PATENT DOCUMENTS

| | | | | |
|---|---|---|---|---|
| 6,513,140 | B2* | 1/2003 | Dotsch et al. | 714/786 |
| 7,388,521 | B2* | 6/2008 | Lu et al. | 341/51 |
| 2006/0126761 | A1* | 6/2006 | Bernhardsson et al. | 375/340 |
| 2008/0059772 | A1* | 3/2008 | Pisek et al. | 712/220 |
| 2009/0067554 | A1* | 3/2009 | Govindarajulu | 375/341 |
| 2009/0322961 | A1* | 12/2009 | Limberg | 348/725 |
| 2009/0327834 | A1* | 12/2009 | Drory et al. | 714/757 |
| 2010/0070819 | A1* | 3/2010 | Stein et al. | 714/752 |

FOREIGN PATENT DOCUMENTS

| | | | |
|---|---|---|---|
| EP | 1521374 A1 | 4/2005 | |
| WO | WO2004028004 A2 | 4/2004 | |

OTHER PUBLICATIONS

Kitty Wong, The Soft-Output M-Algorithm and its applications, a PHD Thesis, Department of Electrical and Computer Engineering, Queen's University, Ontario, Canada, Aug. 2006, pp. 58-76 http://www.ece.queensu.ca/Research/Labs/WCL/thesis/PhDThesis_KittyWong.pdf.*

Boutillon E., et al., "VLSI Architectures for the MAP Algorithm", IEEE Transactions on Communications, IEEE Service Center, Piscataway, NJ. USA, vol. 51, No. 2, Feb. 1, 2003, pp. 175-185, XP001164390 ISSN: 0090-6778 DOI: DOI:10.1109/TCOMM.2003.809247.

Dielissen J, et al., "State vector initialization of sliding window MAP", Proc International Symposium on Turbo Codes and Related Topics, Sep. 4, 2000, pp. 387-390, XP009039864.

International Search Report and Written Opinion—PCT/US2010/048436, International Search Authority—European Patent Office—Mar. 28, 2011.

Ji-Noon Kim, et al., "Energy-Efficient Double-Binary Tail—Biting Turbo Decoder Based on Border Metric Encoding" IEEE International Symposium on Circuits and Systems, ISCAS 2007, IEEE, PI, May 1, 2007, pp. 1325-1328, XP031181517, ISBN: 978-1-4244-0920-4.

(Continued)

*Primary Examiner* — Ajay Bhatia
*Assistant Examiner* — Dipakkumar Gandhi
(74) *Attorney, Agent, or Firm* — Paul Kuo

(57) ABSTRACT

An apparatus and method for high throughput unified turbo decoding comprising loading data from a first data window; computing a first forward state metric using the data from the first data window; storing the first forward state metric in a memory; computing a first reverse state metric using the data from the first data window; storing the first reverse state metric in the memory; and computing the log likelihood ratio (LLR) of the first forward state metric and the first reverse state metric. In one aspect, the above-mentioned steps are repeated with data from a second data window. In another aspect, extrinsic information for the first data window associated with the unified turbo decoding is computed.

91 Claims, 28 Drawing Sheets

(56) References Cited

OTHER PUBLICATIONS

Schurgers C., et al., "Energy efficient data transfer and storage organization for a MAP turbo decoder module", Proc IEEE International Symposium on Low Power Electronics and Design, ISLPED 99, San Diego, CA, Aug. 16, 1999, pp. 76-81, XP010355952 DOI: DOI:10.1145/313817.313863 ISBN: 978-1-58113-133-8.

Schurgers C., et al., "Memory Optimization of MAP Turbo Decoder Algorithms", IEEE Transactions on Very Large Scale Integration (VLSI) Systems, IEEE Service Center, Piscataway, NJ, US, vol. 9, No. 2, Apr. 1, 2001, XP011063161, ISSN: 1063-8210.

Yoon, et al., IEEE Communications Letters, Jul. 2002. vol. 6, No. 7, pp. 288-290. "A Parallel MAP Algorithm for Low Latency Turbo Decoding".

* cited by examiner

APPARATUS AND METHOD FOR HIGH THROUGHPUT UNIFIED TURBO DECODING

FIELD

This disclosure relates generally to apparatus and methods for error correction decoding. More particularly, the disclosure relates to high throughput unified turbo decoding.

BACKGROUND

Wireless communications systems are susceptible to errors introduced in the communications link between the transmitter and receiver. Various error mitigation schemes including, for example, error detection, error correction, interleaving, etc. may be applied to control the error rate in the communications link. Error detection techniques employ parity bits to detect errors at the receiver. If an error is detected, then typically the transmitter is notified to resend the bits that were received in error. In contrast, error correction techniques employ redundant bits to both detect and correct bits that were received in error.

The total number of transmitted bits in a codeword is equal to the sum of information bits and redundant bits. The code rate of an error correction code is defined as the ratio of information bits to the total number of transmitted bits. Error correction codes include block codes, convolutional codes, turbo codes, low density parity check (LDPC) codes, and combinations thereof. Turbo codes are popular error correction codes in modern wireless communications systems.

Turbo codes were first introduced in 1993 by Berrou, Glavieux, and Thitimajshima and have been extensively developed since then. Turbo codes provide near-Shannon limit decoding by employing a combination of simpler encoders and an iterative decoding structure which exchanges soft decision information among a plurality of decoders.

Many wireless system are being introduced today such as Long Term Evolution (LTE) as part of the evolution of third generation partnership project (3GPP) systems, Worldwide Interoperability Microwave Access (WiMAX), wideband code division multiple access (WCDMA), evolution-data optimized (EVDO)/cdma2000, etc. These newer wireless systems utilize various forms of turbo encoding and decoding.

Conventional turbo decoding introduces overhead which reduces throughput. Improvements are desired which minimize turbo decoding overhead to allow enhancement of decoder throughput. In addition, a unified turbo decoder architecture which can be employed across a variety of wireless systems such as LTE, WiMAX, WCDMA, EVDO, etc. is desirable.

SUMMARY

Disclosed is an apparatus and method for error correction decoding using high throughput unified turbo decoding. According to one aspect, a method for high throughput unified turbo decoding comprising loading data from a first data window; computing a first forward state metric using the data from the first data window; storing the first forward state metric in a memory; computing a first reverse state metric using the data from the first data window; storing the first reverse state metric in the memory; and computing the log likelihood ratio (LLR) of the first forward state metric and the first reverse state metric.

According to another aspect, a receiver for high throughput unified turbo decoding comprising an antenna for receiving an electromagnetic wave comprising a received signal; a receiver front-end for generating a digital signal from the received signal; a demodulator coupled to the receiver front-end for demodulating the digital signal and outputting a demodulated bit stream; and a turbo decoder for performing the following: loading data from a first data window of the demodulated bit stream; computing a first forward state metric using the data from the first data window; storing the first forward state metric in a memory; computing a first reverse state metric using the data from the first data window; storing the first reverse state metric in the memory; and computing the log likelihood ratio (LLR) of the first forward state metric and the first reverse state metric.

According to another aspect, a receiver for high throughput unified turbo decoding comprising means for receiving an electromagnetic wave comprising a received signal; means for generating a digital signal from the received signal; means for demodulating the digital signal and outputting a demodulated bit stream; and means for performing the following: loading data from a first data window of the demodulated bit stream; computing a first forward state metric using the data from the first data window; storing the first forward state metric in a memory; computing a first reverse state metric using the data from the first data window; storing the first reverse state metric in the memory; and computing the log likelihood ratio (LLR) of the first forward state metric and the first reverse state metric.

According to another aspect, a computer-readable medium storing a computer program, wherein execution of the computer program is for: loading data from a first data window; computing a first forward state metric using the data from the first data window; storing the first forward state metric in a memory; computing a first reverse state metric using the data from the first data window; storing the first reverse state metric in the memory; and computing the log likelihood ratio (LLR) of the first forward state metric and the first reverse state metric.

Advantages of the present disclosure include the ability to use a single turbo decoder for a variety of wireless systems.

It is understood that other aspects will become readily apparent to those skilled in the art from the following detailed description, wherein it is shown and described various aspects by way of illustration. The drawings and detailed description are to be regarded as illustrative in nature and not as restrictive.

DETAILED DESCRIPTION

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
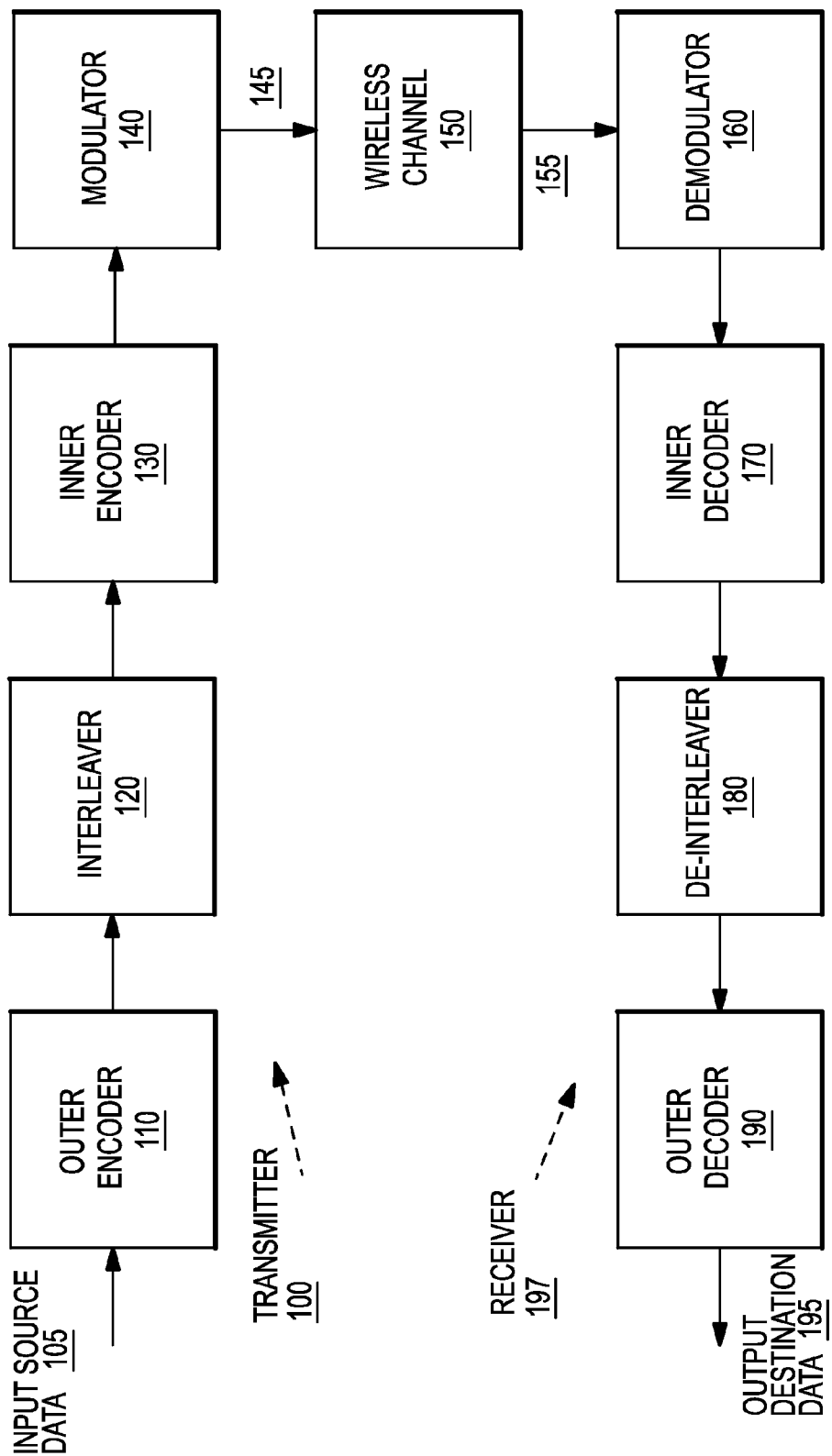
FIG. 1 illustrates an example wireless communications system which employs a concatenated code.

FIG. 1 illustrates an example of a wireless communication system which employs a concatenated code. In one aspect, the wireless communication system comprises a transmitter 100, a wireless channel 150, and a receiver 197 coupled to an output destination data 195. The transmitter 100 receives an input source data 105. A concatenated code consists of two codes: an outer code and an inner code. In one aspect, the transmitter 100 comprises an outer encoder 110, an interleaver 120, an inner encoder 130, and a modulator 140 for processing the input source data 105 to produce a transmitted signal 145 (not shown). The wireless channel 150 propagates the transmitted signal 145 from the transmitter 100 and delivers a received signal 155 (not shown). The received signal 155 is an attenuated, distorted version of transmitted signal 145 along with additive noise. The receiver 197 receives the received signal 155. In one aspect, the receiver 197 comprises a demodulator 160, an inner decoder 170, a deinterleaver 180, and an outer decoder 190 for processing the received signal 155 to produce the output destination data 195. Not shown in FIG. 1 are a high power amplifier and a transmit antenna associated with the transmitter 100. Also not shown are a receive antenna and a low noise amplifier associated with the receiver 197.

Table 1 summarizes the peak data rates and code block size for four different wireless systems. In one aspect, the turbo decoder should provide a throughput consistent with all of the peak data rates and provide both a sliding window mode and no window mode operations.

TABLE 1

|  | LTE | WiMAX | WCDMA | EVDO |
|---|---|---|---|---|
| Peak data rate | 50 Mbps | 46.1 Mbps average 70 Mbps peak | 28.8 Mbps | 14.75[1] Mbps |
| Code block size in bits per stream | 40 to 6144 | 48 to 480 | 40 to 5114 | 128 to 8192 |

In one aspect, the turbo decoder unifies the decoding needs of LTE, WiMAX, WCDMA, CDMA2000, and EVDO. As shown in Table 2, all these wireless standards have the same feedback polynomial (denominator of the generator polynomial), except WiMAX. Since the feedback polynomial determines the state transition, WiMAX will have a different state transition from other standards. In this table G(D) refers to a generator polynomial for a non-interleaved bit sequence and G'(D) refers to a generator polynomial for an interleaved bit sequence.

TABLE 2

|  | LTE | WiMAX | WCDMA | EVDO/CDMA2000 | |
|---|---|---|---|---|---|
| Mother code | 1/3 binary | 1/3 duo-binary | 1/3 binary | 1/5 binary | |
| G(D) | $\frac{1+D+D^3}{1+D^2+D^3}$ | $\frac{1+D^2+D^3}{1+D+D^3}$ | $\frac{1+D+D^3}{1+D^2+D^3}$ | $\frac{1+D+D^3}{1+D^2+D^3}$, | $\frac{1+D+D^2+D^3}{1+D^2+D^3}$ |
| G'(D) | Same as G(D) | $\frac{1+D^3}{1+D+D^3}$ | Same as G(D) | Same as G(D) | |
| Turbo interleaver Trellis Termination | LTE-specific 6 tail bits | WiMAX-specific No tail bits -- tail-biting trellis | WCDMA-specific 6 tail bits | CDMA-specific 6 tail bits | |

LTE Turbo

Figure 2:
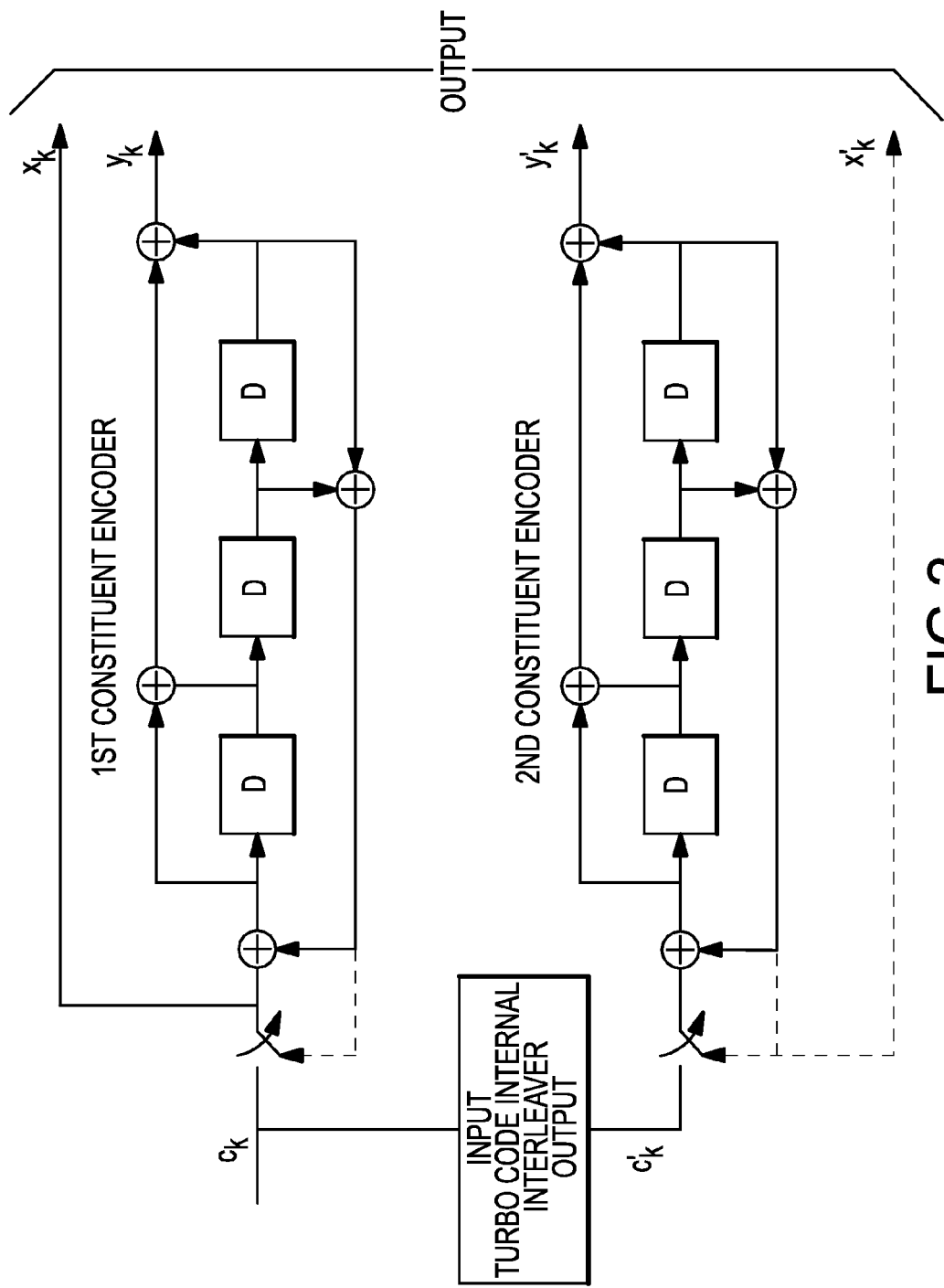
FIG. 2 illustrates an example structure of a LTE turbo encoder.

One example of a LTE turbo encoder scheme is a Parallel Concatenated Convolutional Code (PCCC) with two 8-state constituent encoders and one 1 code internal interleaver. In one example, the coding rate of the turbo encoder is ⅓. FIG. 2 illustrates an example structure of a LTE turbo encoder. In one aspect, the LTE turbo encoder is used for high throughput unified turbo encoding.

The transfer function of the 8-state constituent code for the PCCC is:

$$G(D) = \left[1, \frac{g_1(D)}{g_0(D)}\right],$$

where $g_0(D) = 1 + D^2 + D^3$, $g_1(D) = 1 + D + D^3$.

The initial value of the shift registers of the 8-state constituent encoders shall be all zeros when starting to encode the input bits. The output from the turbo encoder is:

$d_k^{(0)} = x_k$ $d_k^{(1)} = y_k$ $d_k^{(2)} = y'_k$ for $k = 0, 1, 2, \ldots, K-1$.

If the code block to be encoded is the 0-th code block and the number of filler bits is greater than zero, i.e., F>0, then the encoder shall set $c_k = 0$, $k = 0, \ldots, (F-1)$ at its input and shall set $d_k^{(0)} = <NULL>$, $k = 0, \ldots, (F-1)$ and $d_k^{(1)} = <NULL>$, $k = 0, \ldots, (F-1)$ at its output.

The bits input to the turbo encoder are denoted by $c_0, c_1, c_2, c_3, \ldots, c_{K-1}$, and the bits output from the first and second 8-state constituent encoders are denoted by $y_0, y_1, y_2, y_3, \ldots, y_{K-1}$ and $y'_0, y'_1, y'_2, y'_3, \ldots, y'_{K-1}$, respectively. The bits output from the turbo code internal interleaver are denoted by $c'_0, c'_1, \ldots, c'_{K-1}$, and these bits are the input to the second 8-state constituent encoder.

One example of trellis termination for the LTE turbo encoder is performed by taking the tail bits from the shift register feedback after all information bits are encoded. Tail bits are padded after the encoding of information bits.

The first three tail bits shall be used to terminate the first constituent encoder (upper switch of FIG. 2 in lower position) while the second constituent encoder is disabled. The last three tail bits shall be used to terminate the second constituent encoder (lower switch of FIG. 2 in lower position) while the first constituent encoder is disabled.

The transmitted bits for trellis termination shall then be:

$d_K^{(0)} = x_K$, $d_{K+1}^{(0)} = y_{K+1}$, $d_{K+2}^{(0)} = x'_K$, $d_{K+3}^{(0)} = y'_{K+1}$ $d_K^{(1)} = y_K$, $d_{K+1}^{(1)} = x_{K+2}$, $d_{K+2}^{(1)} = y'_K$, $d_{K+3}^{(1)} = x'_{K+2}$ $d_K^{(2)} = x_{K+1}$, $d_{K+1}^{(2)} = y_{K+2}$, $d_{K+2}^{(2)} = x'_{K+1}$,
$d_{K+3}^{(2)} = y'_{K+2}$

The bits input to the turbo code internal interleaver are denoted by $c_0, c_1, \ldots, c_{K-1}$, where K is the number of input bits. The bits output from the turbo code internal interleaver are denoted by $c'_0, c'_1, \ldots, c'_{K-1}$.

The relationship between the input and output bits is as follows:

$c'_i = c_{\pi(i)}, i = 0, 1, \ldots, (K-1)$ where the relationship between the output index i and the input index $\pi(i)$ satisfies the following quadratic form:

$\pi(i) = (f_1 \cdot i + f_2 \cdot i^2) \bmod K$

The parameters $f_1$ and $f_2$ depend on the block size K and are summarized in Table 3.

TABLE 3

| i | $K_i$ | $f_1$ | $f_2$ |
|---|---|---|---|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |

TABLE 3-continued

| i | $K_i$ | $f_1$ | $f_2$ |
|---|---|---|---|
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 169 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |
| 26 | 240 | 29 | 60 |
| 27 | 248 | 33 | 62 |
| 28 | 256 | 15 | 32 |
| 29 | 264 | 17 | 193 |
| 30 | 272 | 33 | 68 |
| 31 | 230 | 103 | 210 |
| 32 | 283 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 532 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 237 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2132 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 110 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 450 |
| 165 | 4672 | 37 | 146 |

TABLE 3-continued

| i | $K_i$ | $f_1$ | $f_2$ |
|---|---|---|---|
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 156 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6050 | 47 | 190 |
| 188 | 6144 | 263 | 450 |

WiMAX Turbo Encoder

Figure 3:
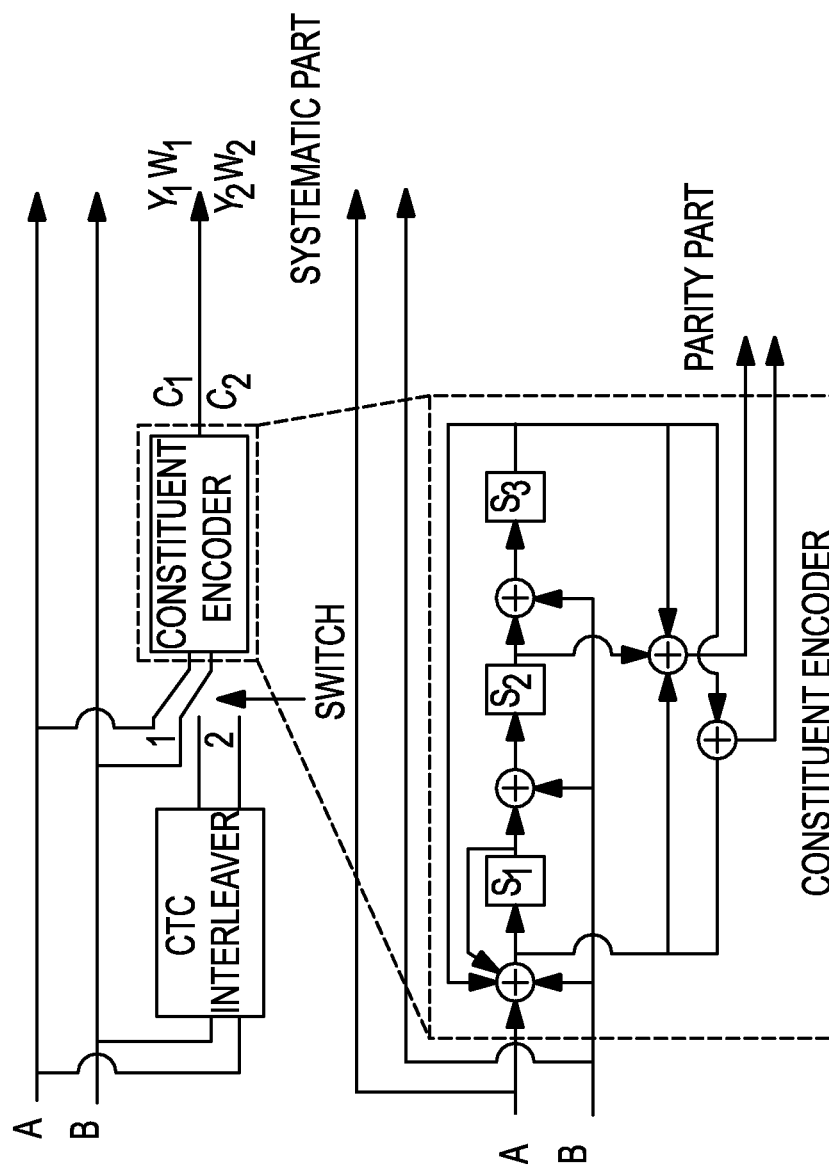
FIG. 3 illustrates an example structure of a WiMAX turbo encoder.

Another example of a turbo scheme is the WiMAX turbo encoder, also known as a convolutional turbo code (CTC) encoder, including its constituent encoder, as depicted in FIG. 3. FIG. 3 illustrates an example structure of a WiMAX turbo encoder. It uses a double-binary Circular Recursive Systematic Convolutional code. The bits of data to be encoded are alternately fed to A and B. The encoder is fed by blocks of k bits or N couples (k=2*N bits). For all frame sizes, k is a multiple of 8 and N is a multiple of 4. The polynomials defining the connections are described in octal and symbolic notations as follows:

For the feedback branch: 0xB, equivalently $1+D+D^3$
For the Y parity bit: 0xD, equivalently $1+D^2+D^3$ The CTC interleaver requires the parameters $P_0$, $P_1$, $P_2$, and $P_3$, as shown in Table 4.

TABLE 4

| N | $P_0$ | $P_1$ | $P_2$ | $P_3$ |
|---|---|---|---|---|
| 24 | 5 | 0 | 0 | 0 |
| 36 | 11 | 18 | 0 | 18 |
| 48 | 13 | 24 | 0 | 24 |
| 72 | 11 | 6 | 0 | 6 |
| 96 | 7 | 48 | 24 | 72 |
| 108 | 11 | 54 | 56 | 2 |
| 120 | 13 | 60 | 0 | 60 |
| 144 | 17 | 74 | 72 | 2 |
| 180 | 11 | 90 | 0 | 90 |
| 192 | 11 | 96 | 48 | 144 |
| 216 | 13 | 108 | 0 | 108 |
| 240 | 13 | 120 | 60 | 180 |

The two-step interleaver shall be performed as follows:

Step 1: Switch Alternate Couples

Let the sequence $u_0=[(A_0,B_0), (A_1,B_1), (A_2,B_2), \ldots, (A_{N-1},B_{N-1})]$ be the input to the first encoding $C_1$.

for i=0, ..., N−1
if (i mode 2), let $(A_i,B_i) \rightarrow (B_i,A_i)$ (i.e., switch the couple)

This step gives a sequence $u_1=[u_1(0), u_1(1), u_1(2), u_1(3), \ldots, u_1(N-1)]=[(A_0,B_0), (B_1,A_1), (A_2,B_2), (B_3,A_3), \ldots (B_{N-1},A_{N-1})]$.

Step 2: P(j)

The function P(j) provides the address of the couple of the sequence u1 that shall be mapped onto address j of the interleaved sequence (i.e., u2(j)=u1(P(j))).

for j=0, ..., N−1
switch (j mod 4)
case 0: $P(j)=(P_0*j+1) \mod N$
case 1: $P(j)=(P_0*j+1+N/2+P_1) \mod N$
case 2: $P(j)=(P_0*j+1+P_2) \mod N$
case 3: $P(j)=(P_0*j+1+N/2+P_3) \mod N$ This step gives a sequence $u_2=[u_1(P(0)), u_1(P(1)), u_1(P(2)), u_1(P(3)), \ldots, u_1(P(N-1))]$. Sequence $u_2$ us the input to the second encoding $C_2$.

WCDMA Turbo Encoder

In another example, the WCDMA turbo encoder is the same as the LTE Turbo encoder, except for the internal interleaver. The WCDMA turbo code internal interleaver consists of bits-input to a rectangular matrix with padding, intra-row and inter-row permutations of the rectangular matrix, and bits-output from the rectangular matrix with pruning. The bits input to the Turbo code internal interleaver are denoted by $x_1$, $x_2, x_3, \ldots, x_K$, where K is the integer number of the bits and takes one value of 40≤K≤5114. The relationship between the bits input to the turbo code internal interleaver and the bits input to the channel coding is defined by $x_k=o_{irk}$ and $K=K_i$.

The following specific symbols are used herein regarding the WCDMA turbo encoder:

K Number of bits input to turbo code internal interleaver
R Number of rows of rectangular matrix
C Number of columns of rectangular matrix
p Prime number
v Primitive root
$\langle s(j) \rangle_{j \in \{0, 1, \ldots, p-2\}}$ Base sequence for intra-row permutation
$q_i$ Minimum prime integers
$r_i$ Permuted prime integers
$\langle T(i) \rangle_{i \in \{0, 1, \ldots, R-1\}}$ Inter-row permutation pattern
$\langle U_i(j) \rangle_{j \in \{0, 1, \ldots, C-1\}}$ Intra-row permutation pattern of i-th row
i Index of row number of rectangular matrix
j Index of column number of rectangular matrix
k Index of bit sequence The bit sequence $x_1, x_2, x_3, \ldots, x_K$ input to the turbo code internal interleaver is written into the rectangular matrix as follows:

(1) Determine the number of rows of the rectangular matrix, R, such that:

$$R = \begin{cases} 5, & \text{if } (40 \leq K \leq 159) \\ 10, & \text{if } ((160 \leq K \leq 200) \text{ or } (481 \leq K \leq 530)) \\ 20, & \text{if } (K = \text{any other value}). \end{cases}$$

The rows of the rectangular matrix are numbered 0, 1, ..., R−1 from top to bottom.

(2) Determine the prime number to be used in the intra-permutation, p, and the number of columns of the rectangular matrix, C, such that:

if(481 ≤ K ≤ 530), then
p = 53 and C = p.
else

Find minimum prime number p from Table 5 such that:

$K \leq R \times (p+1),$ and determine C such that:

$$C = \begin{cases} p-1 & \text{if } K \leq R \times (p-1) \\ p & \text{if } R \times (p-1) < K \leq R \times p \\ p+1 & \text{if } R \times p < K. \end{cases}$$

end if:
The columns of the rectangular matrix are numbered 0, 1, ..., C−1 from left to right.
Table 5 lists the prime number p and associated primitive root v.

TABLE 5

| p | v | p | v | p | v | p | v | p | v |
|---|---|---|---|---|---|---|---|---|---|
| 7 | 3 | 47 | 5 | 101 | 2 | 157 | 5 | 223 | 3 |
| 11 | 2 | 53 | 2 | 103 | 5 | 163 | 2 | 227 | 2 |
| 13 | 2 | 59 | 2 | 107 | 2 | 167 | 5 | 229 | 6 |
| 17 | 3 | 61 | 2 | 109 | 6 | 173 | 2 | 233 | 3 |
| 19 | 2 | 67 | 2 | 113 | 3 | 179 | 2 | 239 | 7 |
| 23 | 5 | 71 | 7 | 127 | 3 | 181 | 2 | 241 | 7 |
| 29 | 2 | 73 | 5 | 131 | 2 | 191 | 19 | 251 | 6 |
| 31 | 3 | 79 | 3 | 137 | 3 | 193 | 5 | 257 | 3 |
| 37 | 2 | 83 | 2 | 139 | 2 | 197 | 2 | | |
| 41 | 6 | 89 | 3 | 149 | 2 | 199 | 3 | | |
| 43 | 3 | 97 | 5 | 151 | 6 | 211 | 2 | | |

(3) Write the input bit sequence $x_1, x_2, x_3, \ldots, x_K$ into the R×C rectangular matrix row by row, starting with bit $y_1$ in column 0 of row 0:

$$\begin{bmatrix} y_1 & y_2 & y_3 & \cdots & y_C \\ y_{(C+1)} & y_{(C+2)} & y_{(C+3)} & \cdots & y_{2C} \\ \vdots & \vdots & \vdots & \cdots & \vdots \\ y_{((R-1)C+1)} & y_{((R-1)C+2)} & y_{((R-1)C+3)} & \cdots & y_{R \times C} \end{bmatrix}$$

where $y_k = x_k$ for k=1, 2, ..., K and if R×C>K, the dummy bits are padded such that $y_k$=0 or 1 for k=K+1, K+2, ..., R×C. These dummy bits are pruned away from the output of the rectangular matrix after the intra-row and inter-row permutations.

After the bits-input to the R×C rectangular matrix, the intra-row and inter-row permutations for the R×C rectangular matrix are performed stepwise by using the following algorithm with steps 1 through 6:

(1) Select a primitive root v from Table 5 which is indicated on the right side of the prime number p.
(2) Construct the base sequence $\langle s(j) \rangle_{j \in \{0, 1, \ldots, p-2\}}$ for intra-row permutation as:

$s(j) = (v \times s(j-1)) \bmod p, j=1, 2, \ldots, (p-2),$ and $s(0)=1.$ (3) Assign $q_0=1$ to be the first prime integer in the sequence $\langle q_i \rangle_{i \in \{0, 1, \ldots, R-1\}}$ and determine the prime integer $q_i$ in the sequence $\langle q_i \rangle_{i \in \{0, 1, \ldots, R-1\}}$ to be a least prime integer, such that $g.c.d(q_i, p-1)=1$, $q_i > 6$, and $q_i > q_{(i-1)}$ for each i=1, 2, ..., R−1. Here g.c.d is greatest common divisor.

(4) Permute the sequence $\langle q_i \rangle_{i \in \{0, 1, \ldots, R-1\}}$ to make the sequence $\langle r_i \rangle_{i \in \{0, 1, \ldots, R-1\}}$ such that $r_{T(i)} = q_i, i=0, 1, \ldots, R-1$ where $\langle T(i) \rangle_{i \in \{0, 1, \ldots, R-1\}}$ is the inter-row permutation pattern defined as one of the four kinds of patterns, which are shown in Table 6, depending on the number of input bits K.

(5) Perform the i-th (i=0, 1, ..., R−1) intra-row permutation as:
if (C=p) then:

$U_i(j) = s((j \times r_i) \bmod (p-1)), j=0, 1, \ldots, (p-2),$ and $U_i(p-1)=0,$ where $U_i(j)$ is the original bit position of j-th permuted bit of i-th row. End if:
if (C=p+1) then:

$U_i(j) = s((j \times r_i) \bmod (p-1)), j=0, 1, \ldots, (p-2).$
$U_i(p-1)=0,$ and $U_i(p)=p,$ where $U_i(j)$ is the original bit position of j-th permuted bit of i-th row and if (K=R×C) then:
exchange $U_{R-1}(p)$ with $U_{R-1}(0)$.
End if:
if (C=p−1) then:

$U_i(j) = s((j \times r_i) \bmod (p-1)) - 1, j=0, 1, \ldots, (p-2),$ where $U_i(j)$ is the original bit position of j-th permuted bit of i-th row.
End if:
(6) Perform the inter-row permutation for the rectangular matrix based on the pattern $\langle T(i) \rangle_{i \in \{0, 1, \ldots, R-1\}}$
where T(i) is the original row position of the i-th permuted row.
Table 6 lists the inter-row permutation patterns for turbo code internal interleaver.

TABLE 6

| Number of input bits K | Number of rows R | Inter-row permutation patterns <T(0), T(1), ..., T(R − 1)> |
|---|---|---|
| (40 ≤ K ≤ 159) | 5 | <4, 3, 2, 1, 0> |
| (160 ≤ K ≤ 200) or (481 ≤ K ≤ 530) | 10 | <9, 8, 7, 6, 5, 4, 3, 2, 1, 0> |
| (2281 ≤ K ≤ 2480) or (3161 ≤ K ≤ 3210) | 20 | <19, 9, 14, 4, 0, 2, 5, 7, 12, 18, 16, 13, 17, 15, 3, 1, 6, 11, 8, 10> |
| K = any other value | 20 | <19, 9, 14, 4, 0, 2, 5, 7, 12, 18, 10, 8, 13, 17, 3, 1, 16, 6, 15, 11> |

After intra-row and inter-row permutations, the bits of the permuted rectangular matrix are denoted by $y'_k$:

$$\begin{bmatrix} y'_1 & y'_{(R+1)} & y'_{(2R+1)} & \cdots & y'_{((C-1)R+1)} \\ y'_2 & y'_{(R+2)} & y'_{(2R+2)} & \cdots & y'_{((C-1)R+2)} \\ \vdots & \vdots & \vdots & \cdots & \vdots \\ y'_R & y'_{2R} & y'_{3R} & \cdots & y'_{C \times R} \end{bmatrix}$$

The output of the turbo code internal interleaver is the bit sequence read out column by column from the intra-row and inter-row permuted R×C rectangular matrix, starting with bit $y'_1$ in row 0 of column 0 and ending with bit $y'_{CR}$ in row R−1 of column C−1. The output is pruned by deleting dummy bits that were padded to the input of the rectangular matrix before intra-row and inter row permutations, i.e. bits $y'_k$ that correspond to bits $y_k$ with k>K are removed from the output. The bits output from the turbo code internal interleaver are denoted by $x'_1, x'_2, \ldots, x'_K$, where $x'_1$ corresponds to the bit $y'_k$ with the smallest index k after pruning, $x'_2$ to the bit $y'_k$ with the second smallest index k after pruning, and so on. The number of bits output from the turbo code internal interleaver is K and the total number of pruned bits is:

R×C−K.

EVDO/CDMA 2000 Turbo Encoder
In another example, the EVDO/cdma2000 turbo encoder employs two systematic, recursive, convolutional encoders that are connected in parallel, with the turbo interleaver preceding the second recursive, convolutional encoder. The two recursive convolutional codes are called the constituent codes of the turbo code. The outputs of the constituent encoders are punctured and repeated to achieve the desired number of turbo encoder output symbols. The transfer function for the constituent code shall be:

$$G(D) = \left[ 1 \quad \frac{n_0(D)}{d(D)} \quad \frac{n_1(D)}{d(D)} \right]$$

where $d(D)=1+D^2+D^3$, $n_0(D)=1+D+D^3$, and $n_1(D)=1+D+D^2+D^3$.

Figure 4:
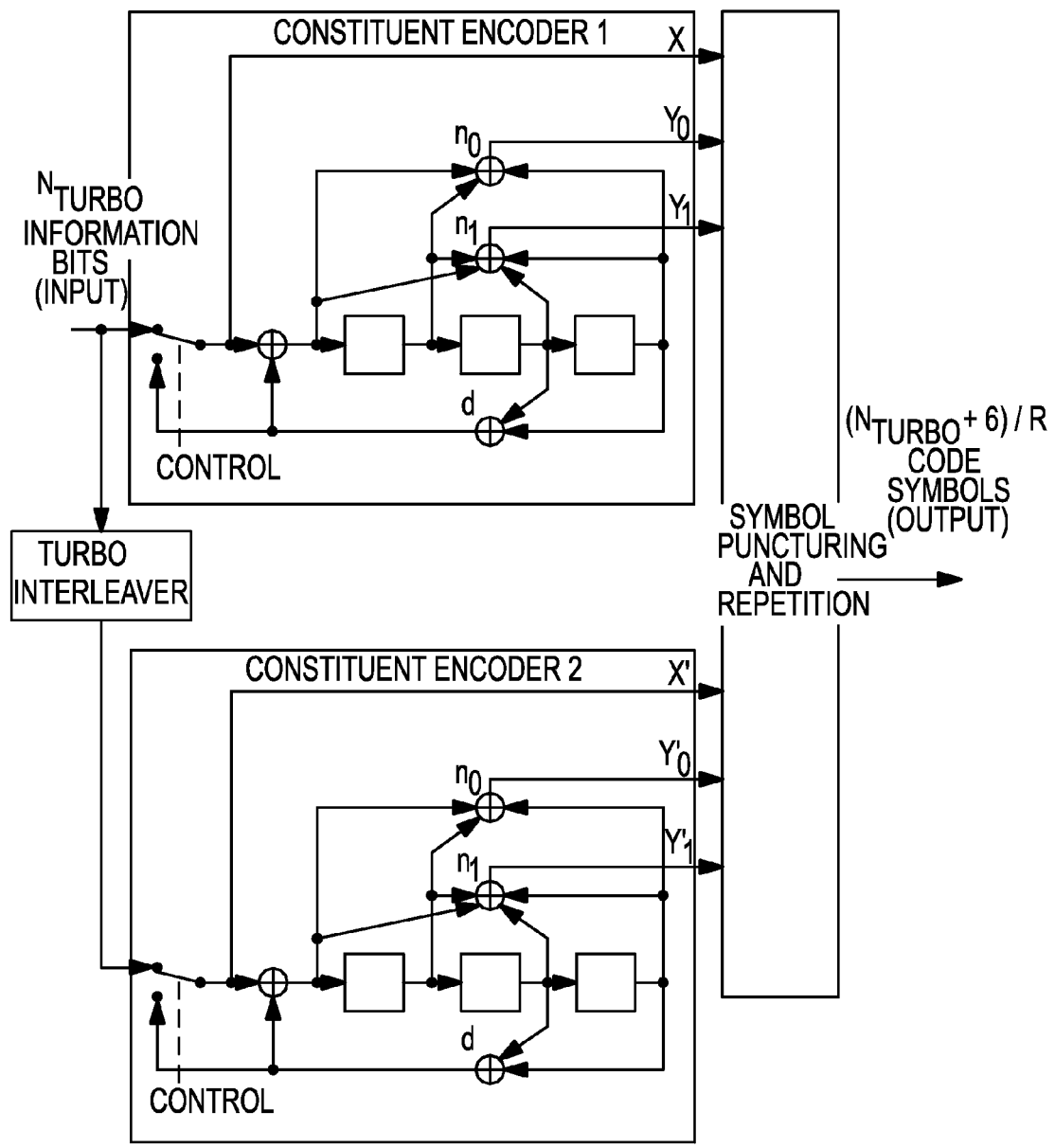
FIG. 4 illustrates an example structure of an EVDO/cdma2000 turbo encoder.

The turbo encoder shall generate an output symbol sequence that is identical to the one generated by the encoder shown in FIG. 4. FIG. 4 illustrates an example structure of an EVDO/cdma2000 turbo encoder. Initially, the states of the constituent encoder registers in this figure are set to zero. Then, the constituent encoders are clocked with the switches in the positions noted.

Let $N_{turbo}$ be the number of bits into the turbo encoder after the 6-bit physical layer packet TAIL field is discarded. Then, the encoded data output symbols are generated by clocking the constituent encoders $N_{turbo}$ times with the switches in the up positions, and puncturing the outputs as specified in Table 7 and Table 8. Table 7 lists the puncturing patterns for data bit periods in EVDO. Table 8 lists the puncturing patterns for data bit periods in cdma2000. Within a puncturing pattern, a "0" means that the symbol shall be deleted and a "1" means that the symbol shall be passed onward. The constituent encoder outputs for each bit period shall be output in the sequence $X, Y_0, Y_1, X', Y'_0, Y'_1$ with the X output first. Symbol repetition is not used in generating the encoded data output symbols.

TABLE 7

| | Code rate | |
|---|---|---|
| Output | 1/3 | 1/5 |
| X | 1 | 1 |
| $Y_0$ | 1 | 1 |
| $Y_1$ | 0 | 1 |
| X' | 0 | 0 |
| $Y'_0$ | 1 | 1 |
| $Y'_1$ | 0 | 1 |

For each rate, the puncturing table shall be read from top to bottom.

TABLE 8

| | Code rate | | |
|---|---|---|---|
| Output | 1/2 | 1/3 | 1/4 |
| X | 11 | 11 | 11 |
| $Y_0$ | 10 | 11 | 11 |
| $Y_1$ | 00 | 00 | 10 |
| X' | 00 | 00 | 00 |
| $Y'_0$ | 01 | 11 | 01 |
| $Y'_1$ | 00 | 00 | 11 |

For each rate, the puncturing table shall be read first from top to bottom and then from left to right.

The turbo encoder shall generate 6/R tail output symbols following the encoded data output symbols. This tail output symbol sequence shall be identical to the sequence generated by the encoder shown in FIG. 4. The tail output symbols are generated after the constituent encoders have been clocked $N_{turbo}$ times with the switches in the up position. The first 3/R tail output symbols are generated by clocking Constituent Encoder 1 three times with its switch in the down position while Constituent Encoder 2 is not clocked, and puncturing and repeating the resulting constituent encoder output symbols. The last 3/R tail output symbols are generated by clocking Constituent Encoder 2 three times with its switch in the down position while Constituent Encoder 1 is not clocked, and puncturing and repeating the resulting constituent encoder output symbols. The constituent encoder outputs for each bit period shall be output in the sequence $X, Y_0, Y_1, X', Y'_0, Y'_1$ with the X output first.

The constituent encoder output symbol puncturing for the tail symbols shall be as specified in Table 9. Within a puncturing pattern, a "0" means that the symbol shall be deleted, a "1" means that the symbol shall be passed onward, and a "2" means that the symbol shall be repeated. Table 9 lists the puncturing patterns for tail bit periods in EVDO. Table 10 lists the puncturing patterns for tail bit periods in cdma2000.

TABLE 9

| | Code rate | |
|---|---|---|
| Output | 1/3 | 1/5 |
| X | 222 000 | 222 000 |
| $Y_0$ | 111 000 | 111 000 |
| $Y_1$ | 000 000 | 222 000 |
| X' | 000 222 | 000 222 |
| $Y'_0$ | 000 111 | 000 111 |
| $Y'_1$ | 000 000 | 000 222 |

For rate-1/3 turbo codes, the puncturing table shall be read first from top to bottom repeating X and X', and then from left to right.
For rate-1/5 turbo codes, the puncturing table shall be read first from top to bottom repeating X, X', $Y_1$, and $Y'_1$ and then from left to right.

TABLE 10

| | Code rate | | |
|---|---|---|---|
| Output | 1/2 | 1/3 | 1/4 |
| X | 111 000 | 222 000 | 222 000 |
| $Y_0$ | 111 000 | 111 000 | 111 000 |
| $Y_1$ | 000 000 | 000 000 | 111 000 |
| X' | 000 111 | 000 222 | 000 222 |
| $Y'_0$ | 000 111 | 000 111 | 000 111 |
| $Y'_1$ | 000 000 | 000 000 | 000 111 |

Note:
For rate 1/2 turbo codes, the puncturing table shall be read first from top to bottom and then from left to right.
For rate 1/3 and 1/4 turbo codes, the puncturing table shall be read first from top to bottom repeating X and X', and then from left to right.

The turbo interleaver, which is part of the turbo encoder, shall block-interleave the turbo encoder input data that is fed to Constituent Encoder 2. The turbo interleaver shall be functionally equivalent to an approach where the entire sequence of turbo interleaver input bits are written sequentially into an array at a sequence of addresses, and then the entire sequence is read out from a sequence of addresses that are defined by the procedure described below.

Figure 5:
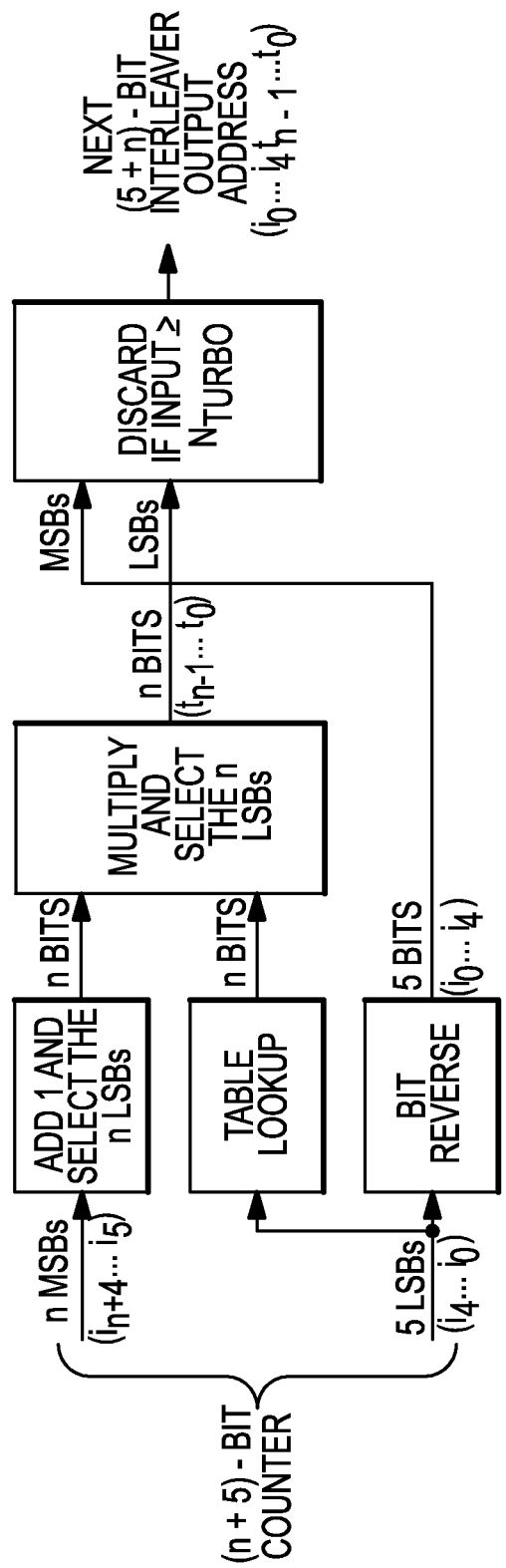
FIG. 5 illustrates an example turbo interleaver output address calculation procedure.

Let the sequence of input addresses be from 0 to $N_{turbo}-1$. Then, the sequence of interleaver output addresses shall be equivalent to those generated by the procedure illustrated in FIG. 5. FIG. 5 illustrates an example turbo interleaver output address calculation procedure. The example procedure illustrated in FIG. 5 is equivalent to one where the counter values are written into a $2^5$-row by $2^n$-column array by rows, the rows are shuffled according to a bit-reversal rule, the elements within each row are permuted according to a row-specific linear congruential sequence, and tentative output addresses are read out by column. The linear congruential sequence rule is $x(i+1)=(x(i)+c) \mod 2^n$, where $x(0)=c$ and c is a row-specific value from a table lookup.

1. Determine the turbo interleaver parameter, n, where n is the smallest integer such that $N_{turbo} \leq 2^{n+5}$ Table 11 and Table 12 give this parameter for the different physical layer packet sizes. Table 11 lists the turbo interleaver parameter for EVDO. Table 12 lists the turbo interleaver parameter for cdma2000.
2. Initialize an (n+5)-bit counter to 0.
3. Extract the n most significant bits (MSBs) from the counter and add one to form a new value. Then, discard all except the n Least Significant Bits (LSBs) of this value.
4. Obtain the n-bit output of the table lookup defined in Table 13 and Table 14 with a read address equal to the five LSBs of the counter. Tables 13 and 14 depend on the value of n. Table 13 lists the turbo interleaver lookup table definition for EVDO. Table 14 lists the turbo interleaver lookup table definition for cdma2000.
5. Multiply the values obtained in Steps 3 and 4, and discard all except the n LSBs.
6. Bit-reverse the five LSBs of the counter.
7. Form a tentative output address that has its MSBs equal to the value obtained in Step 6 and its LSBs equal to the value obtained in Step 5.
8. Accept the tentative output address as an output address if it is less than $N_{turbo}$; otherwise, discard it.
9. Increment the counter and repeat Steps 3 through 8 until all $N_{turbo}$ interleaver output addresses are obtained.

TABLE 11

| Physical layer packet size | Turbo interleaver block size $N_{turbo}$ | Turbo interleaver parameter n |
| --- | --- | --- |
| 128 | 122 | 2 |
| 256 | 250 | 3 |
| 512 | 506 | 4 |
| 1,024 | 1,018 | 5 |
| 2,048 | 2,042 | 6 |
| 3,072 | 3,066 | 7 |
| 4,096 | 4,090 | 7 |
| 5,120 | 5,114 | 8 |
| 6144 | 6138 | 8 |
| 7168 | 7162 | 8 |
| 8192 | 8186 | 8 |

TABLE 12

| Turbo interleaver block size $N_{turbo}$ | Turbo interleaver parameter n |
| --- | --- |
| 378 | 4 |
| 570 | 5 |
| 762 | 5 |
| 1,146 | 6 |
| 1,530 | 6 |
| 2,298 | 7 |
| 3,066 | 7 |
| 4,602 | 8 |
| 6,138 | 8 |
| 9,210 | 9 |
| 12,282 | 9 |
| 20,730 | 10 |

TABLE 13

| Table index | n = 2 entries | n = 3 entries | n = 4 entries | n = 5 entries | n = 6 entries | n = 7 entries | n = 8 entries |
| --- | --- | --- | --- | --- | --- | --- | --- |
| 0 | 3 | 1 | 5 | 27 | 3 | 15 | 3 |
| 1 | 3 | 1 | 15 | 3 | 27 | 127 | 1 |
| 2 | 3 | 3 | 5 | 1 | 15 | 89 | 5 |
| 3 | 1 | 5 | 15 | 15 | 13 | 1 | 83 |
| 4 | 3 | 1 | 1 | 13 | 29 | 31 | 19 |
| 5 | 1 | 5 | 9 | 17 | 5 | 15 | 179 |
| 6 | 3 | 1 | 9 | 23 | 1 | 61 | 19 |
| 7 | 1 | 5 | 15 | 13 | 31 | 47 | 99 |
| 8 | 1 | 3 | 13 | 9 | 3 | 127 | 23 |
| 9 | 1 | 5 | 15 | 3 | 9 | 17 | 1 |
| 10 | 3 | 3 | 7 | 15 | 15 | 119 | 3 |
| 11 | 1 | 5 | 11 | 3 | 31 | 15 | 13 |
| 12 | 1 | 3 | 15 | 13 | 17 | 57 | 13 |
| 13 | 1 | 5 | 3 | 1 | 5 | 123 | 3 |
| 14 | 1 | 5 | 15 | 13 | 39 | 95 | 17 |
| 15 | 3 | 1 | 5 | 29 | 1 | 5 | 1 |
| 16 | 3 | 3 | 13 | 21 | 19 | 85 | 63 |
| 17 | 1 | 5 | 15 | 19 | 27 | 17 | 131 |
| 18 | 3 | 3 | 9 | 1 | 15 | 55 | 17 |
| 19 | 3 | 5 | 3 | 3 | 13 | 57 | 131 |
| 20 | 3 | 3 | 1 | 29 | 45 | 15 | 211 |
| 21 | 1 | 5 | 3 | 17 | 5 | 41 | 173 |
| 22 | 3 | 5 | 15 | 25 | 33 | 93 | 231 |
| 23 | 1 | 5 | 1 | 29 | 15 | 87 | 171 |
| 24 | 3 | 1 | 13 | 9 | 13 | 63 | 23 |
| 25 | 1 | 5 | 1 | 13 | 9 | 15 | 147 |
| 26 | 3 | 1 | 9 | 23 | 15 | 13 | 243 |
| 27 | 1 | 5 | 15 | 13 | 31 | 15 | 213 |
| 28 | 3 | 3 | 11 | 13 | 17 | 81 | 189 |
| 29 | 1 | 5 | 3 | 1 | 5 | 57 | 51 |
| 30 | 1 | 5 | 15 | 13 | 15 | 31 | 15 |
| 31 | 3 | 3 | 5 | 13 | 33 | 69 | 67 |

TABLE 14

| Table index | n = 4 entries | n = 5 entries | n = 6 entries | n = 7 entries | n = 8 entries | n = 9 entries | n = 10 entries |
| --- | --- | --- | --- | --- | --- | --- | --- |
| 0 | 5 | 27 | 3 | 15 | 3 | 13 | 1 |
| 1 | 15 | 3 | 27 | 127 | 1 | 335 | 349 |
| 2 | 5 | 1 | 15 | 89 | 5 | 87 | 303 |
| 3 | 15 | 15 | 13 | 1 | 83 | 15 | 721 |
| 4 | 1 | 13 | 29 | 31 | 19 | 15 | 973 |
| 5 | 9 | 17 | 5 | 15 | 179 | 1 | 703 |
| 6 | 9 | 23 | 1 | 61 | 19 | 333 | 761 |
| 7 | 15 | 13 | 31 | 47 | 99 | 11 | 327 |
| 8 | 13 | 9 | 3 | 127 | 23 | 13 | 453 |
| 9 | 15 | 3 | 9 | 17 | 1 | 1 | 95 |
| 10 | 7 | 15 | 15 | 119 | 3 | 121 | 241 |
| 11 | 11 | 3 | 31 | 15 | 13 | 155 | 187 |
| 12 | 15 | 13 | 17 | 57 | 13 | 1 | 497 |
| 13 | 3 | 1 | 5 | 123 | 3 | 175 | 909 |
| 14 | 15 | 13 | 39 | 95 | 17 | 421 | 769 |
| 15 | 5 | 29 | 1 | 5 | 1 | 5 | 349 |
| 16 | 13 | 21 | 19 | 85 | 63 | 509 | 71 |
| 17 | 15 | 19 | 27 | 17 | 131 | 215 | 557 |
| 18 | 9 | 1 | 15 | 55 | 17 | 47 | 197 |
| 19 | 3 | 3 | 13 | 57 | 131 | 425 | 499 |
| 20 | 1 | 29 | 45 | 15 | 211 | 295 | 409 |
| 21 | 3 | 17 | 5 | 41 | 173 | 229 | 259 |
| 22 | 15 | 25 | 33 | 93 | 231 | 427 | 335 |
| 23 | 1 | 29 | 15 | 87 | 171 | 83 | 253 |
| 24 | 13 | 9 | 13 | 63 | 23 | 409 | 677 |
| 25 | 1 | 13 | 9 | 15 | 147 | 387 | 717 |
| 26 | 9 | 23 | 15 | 13 | 243 | 193 | 313 |
| 27 | 15 | 13 | 31 | 15 | 213 | 57 | 757 |
| 28 | 11 | 13 | 17 | 81 | 189 | 501 | 189 |
| 29 | 3 | 1 | 5 | 57 | 51 | 313 | 15 |
| 30 | 15 | 13 | 15 | 31 | 15 | 489 | 75 |
| 31 | 5 | 13 | 33 | 69 | 67 | 391 | 163 |

Logmap Algorithm

Consider a binary phase shift keying (BPSK) communication system model given by:

$$\tilde{r}_t = \sqrt{\left(\frac{E_s}{N_0}\right)_x} (1-2x_t) + n_{r,t}$$

$$\tilde{z}_t = \sqrt{\left(\frac{E_s}{N_0}\right)_y} (1-2y_t) + n_{z,t}$$

where:

$\tilde{r}_t$ is the received signal for systematic bit $x_t$ at time t $\tilde{z}_t$ is the received vector (possibly 1×1) signal for parity bit vector $y_t$ at time t $n_{r,t}$ and $n_{z,t}$ are additive white Gaussian noise (AWGN)

$(E_s/N_0)_x$ and $(E_s/N_0)_y$ are signal/noise ratios (SNRs) of received signal $\tilde{r}_t$ and $\tilde{z}_t$ Further, define the quaternary systematic symbol $c_t$, the systematic bit log likelihood ratio (LLR) vector $r_t$, and the systematic bit vector $s_t$ by:

$$c_t = 2x_{2t+1} + x_{2t},$$

$$r_t = \frac{2\sqrt{E_s}}{N_0} [\tilde{r}_{2t+1} \quad \tilde{r}_{2t}]^T,$$

$$s_t = [1 - 2x_{2t+1} \quad 1 - 2x_{2t}]^T.$$

Then the quaternary log likelihood is given by:

$$\lambda^i(t) = \log\left(\frac{Pr(c_t = i \mid r_1^\tau, z_1^\tau)}{Pr(c_t = 0 \mid r_1^\tau, z_1^\tau)}\right)$$

$$= \log\left(\frac{\sum_{(l',l) \in B_t^i} \alpha_{l'}(t-1)\gamma_{l',l}^i(t)\beta_l(t)}{\sum_{(l',l) \in B_t^0} \alpha_{l'}(t-1)\gamma_{l',l}^0(t)\beta_l(t)}\right)$$

$$= \log\left(\frac{Pr(c_t = i)}{Pr(c_t = 0)}\right) + r_t^T \cdot (s_t^i - s_t^0) + \lambda_e^i(t)$$

$$= (\text{Input Extrinsic}) + (\text{Systematic } LLR) + (\text{Output Extrinsic})$$

where $r_1^T$ and $z_1^T$ are the received vector sequence for the systematic symbols and parity symbols from time 1 to τ, respectively. Also, λ represents log likelihood ratio (LLR).

The quaternary output extrinsic information is obtained from the LLR by:

$$\lambda_e^i(t) = \lambda^i(t) - \log\left(\frac{Pr(c_t = i)}{Pr(c_t = 0)}\right) - r_t^T \cdot (s_t^i - s_t^0).$$

where $\lambda^i(t)$ is the quaternary log likelihood ratio;

log $$\left(\frac{Pr(c_t = i)}{Pr(c_t = 0)}\right)$$

is the input extrinsic log likelihood ratio, defined by the logarithm of the ratio of the probabilities for systematic symbol $c_t$;

$r_t^T (s_t^i - s_t^0)$ is the systematic log likelihood ratio (LLR) defined by the vector dot product between the systematic bit LLR vector $r_t$ and the difference between two systematic bit vectors $s_t^i$ and $s_t^0$.

The forward state metrics, reverse state metrics, and the branch metrics are needed to compute the LLR. The forward state metrics are given by:

$$\alpha_l(t) = Pr(S_t = l, r_1^t, z_1^t)$$

$$= \sum_{l' \in \{0,\ldots,7\}} \alpha_{l'}(t-1) \sum_{i \in \{0,\ldots,3\}} \gamma_{l',l}^i(t)$$

where $S_t$ is the state at time t. The reverse state metrics are given by:

$$\beta_l(t) = Pr(r_{t+1}^\tau, z_{t+1}^\tau \mid S_t = l)$$

$$= \sum_{l' \in \{0,\ldots,7\}} \beta_{l'}(t+1) \sum_{i \in \{0,\ldots,3\}} \gamma_{l,l'}^i(t+1)$$

The branch metrics are given by $$\gamma_{l',l}^j(t) = Pr(c_t = i, S_t = l, r_t, z_t \mid S_{t-1} = l')$$

$$= \begin{cases} \log Pr(c_t = i) + \left(r_t^T \cdot s_t^i + \sum_{j=1}^{n-1} z_{j,t}^T \cdot v_{j,t}^i(l')\right) & \text{for } (l', l) \in B_t^i \\ 0 & \text{otherwise} \end{cases}$$

where n−1 is the number of parity bits per systematic bit in the constituent encoder, $B_t^i$ is the set of branches connecting state l' at time t−1 and state l at time t by the quaternary systematic symbol value of i, $z_{j,t}$ is the parity bit LLR vector for the $j^{th}$ parity symbol, and $v_{j,t}^i(l')$ is the BPSK modulated $j^{th}$ parity bit vector corresponding to $c_t$=i and $S_{t-1}$=l'. Also, α are the forward state metrics, β are the reverse state metrics, γ are the branch metrics of rate ⅓ code, and ζ are the branch metrics of rate ⅕ code.

Architecture

Figure 6:
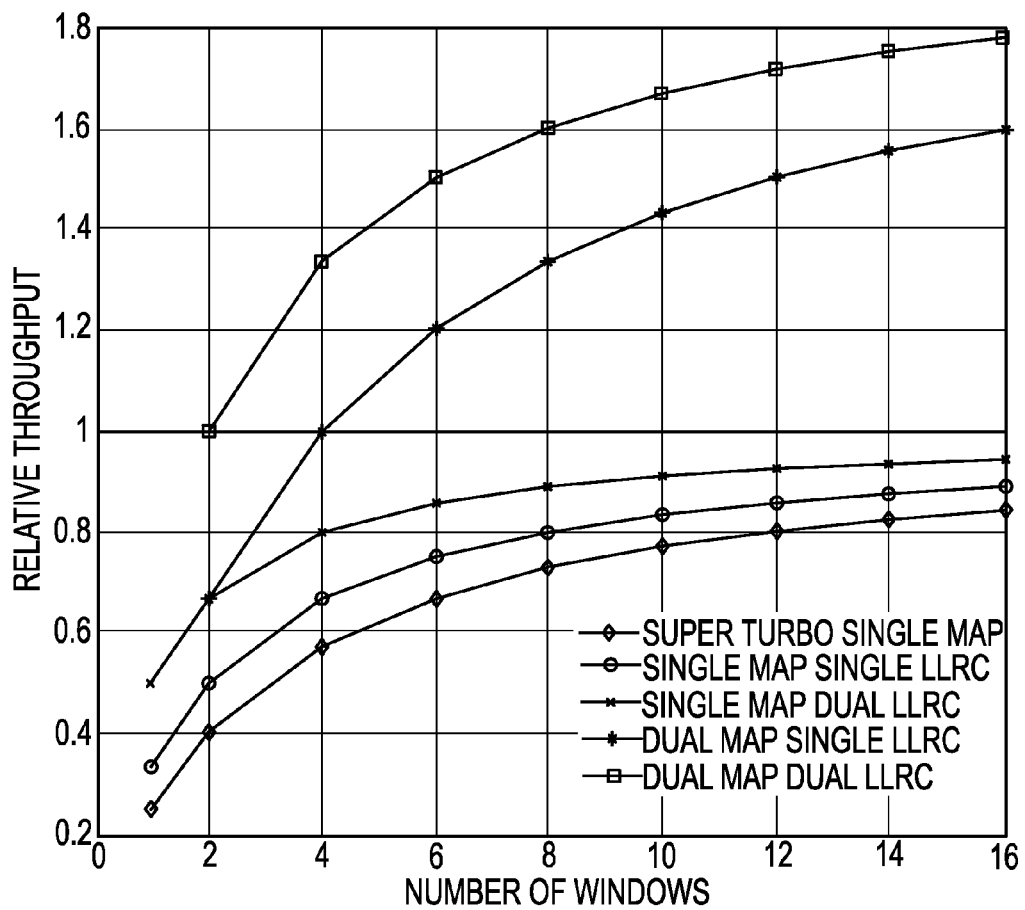
FIG. 6 illustrates the relative throughput with respect to single maximum a posteriori (MAP) without overhead.

The following decoder architectural options are discussed herein: Single maximum a posteriori (MAP), single log likelihood ratio computation (LLRC), single MAP dual LLRC, dual MAP single LLRC, and dual MAP dual LLRC. Table 15 is a summary of architecture comparison, showing the major differences among the different architectures. FIG. 6 illustrates the relative throughput with respect to single maximum a posteriori (MAP) without overhead. That is, in FIG. 6, the relative throughput is illustrated versus the number of windows where the unit throughput is the throughput of single MAP without overheads. As expected, all architectures have lower throughput for less number of windows. An alternative solution tailored to a small packet size will be presented below.

TABLE 15

|  | SuperTurbo single MAP | Single MAP single LLRC | Single MAP dual LLRC | Dual MAP single LLRC | Dual MAP dual LLRC |
|---|---|---|---|---|---|
| Data preloading overhead | 2 windows | 1 window | 1 window | 2 windows | 2 windows |
| MAP engine Overhead | 1 window | 1 window | 0 | 2 windows | 0 |
| Systematic bits memory size | 4 windows | 3 windows | 2 windows | 6 windows | 4 windows |
| Systematic bits/APP throughput requirement | 6 symbols/clock | 4 symbols/clock | 4 symbols/clock | 8 symbols/clock | 8 symbols/clock |
| Systematic bits/APP throughput requirement per loading | 2 symbols/clock | 2 symbols/clock | 2 symbols/clock | 4 symbols/clock | 4 symbols/clock |
| APP memory reuse | Yes | Possible | Possible | Possible | Possible |

APP: A Priori Probability or A Posteriori Probability, depending on context.

The following parameters relate to Table 15.
1. All architectures are based on radix-4 decoder.
2. Data preloading/MAP engine overheads are shown with respect to the total number of windows.
3. APP throughput requirement is the worse one between read and write for binary APP. Throughput requirement for quaternary APP is lower since three extrinsic symbols can be packed together.
4. APP memory reuse is possible if write is sequential and read is (de)interleaved.

One architectural trade-off is whether to use max log or max log*. Since Forward State Metric Computation unit (FSMC) and Reverse State Metric Computation unit (RSMC) must finish state update in a single cycle (otherwise, state update cannot proceed), it is critical to make their timing as short as possible. Table 16 shows the expected timing of FSMC and RSMC in 45 nm. We will discuss mostly max log*, since max log is a subset of max log*.

TABLE 16

|  | maxlog* | maxlog |
|---|---|---|
| FSMC/RSMC | 5 ns | 3 ns |

Figure 7:
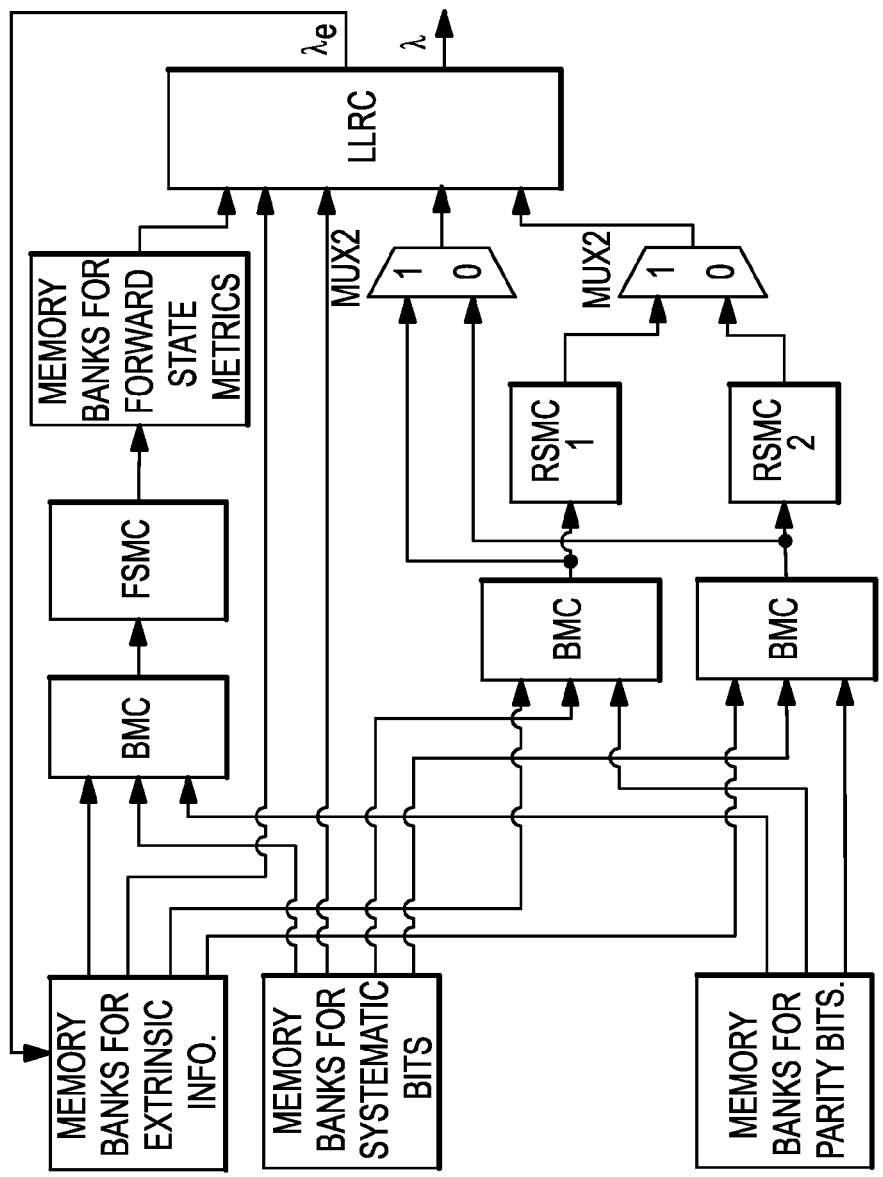
FIG. 7 illustrates an example of a SuperTurbo maximum a posteriori (MAP) architecture.
Figure 8:
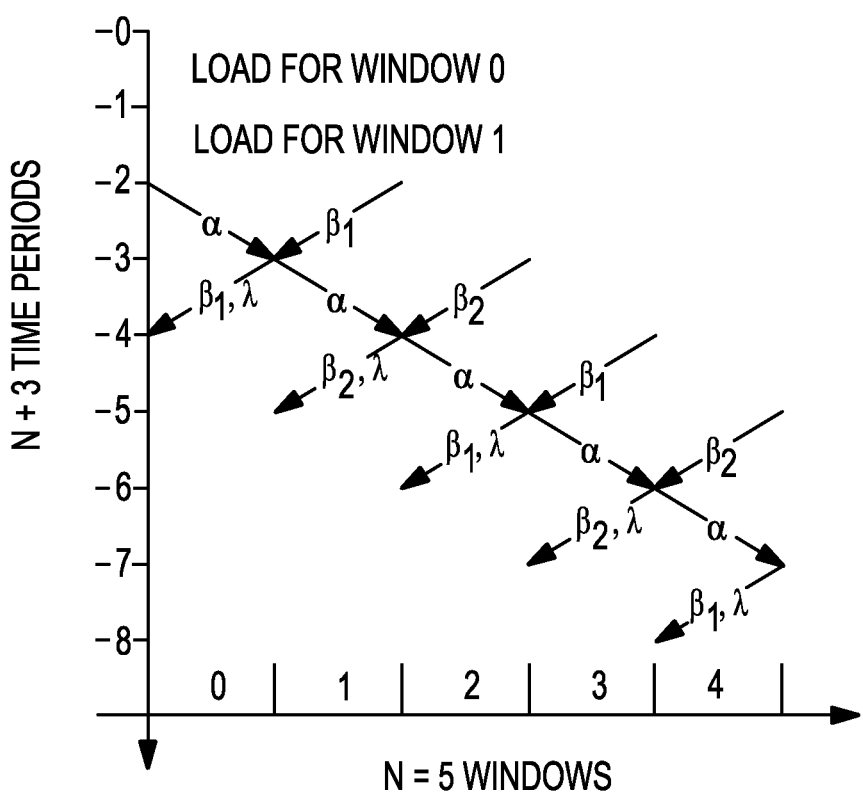
FIG. 8 illustrates an example operational flow diagram of a SuperTurbo single maximum a posteriori (MAP).

In one aspect, a SuperTurbo single MAP architecture is shown in FIG. 7. FIG. 7 illustrates an example of a SuperTurbo maximum a posteriori (MAP) architecture. This consists of one FSMC, two RSMCs, three Branch Metric Computation units (BMCs), and one LLRC, with additional memories. Control machines are not shown. FIG. 8 illustrates an example operational flow diagram of a SuperTurbo single maximum a posteriori (MAP). The operational flow diagram is depicted in FIG. 8 where $\alpha$, $\beta_1$, $\beta_2$, and $\lambda$ denote FSMC, RSMC 1, RSMC 2 and LLRC, respectively.

The example illustrated in FIG. 8 is for 5 windows. In the example, x-axis is the window index and y-axis is the time index where one time period is the time taken to process one window. Decoder starts with preloading two windows of data. After preloading is done, FSMC starts to compute the forward state metrics of the first window and saves them in memory. At the same time, RSMC 1 computes the reverse state metrics of the second data window that are eventually discarded. Data of the third window is loaded at the same time. One window of data loading continues on each time period.

RSMC 1 continues moving onto the first window to compute the reverse state metrics of the first window. As soon as RSMC 1 computes the reverse state metrics on each trellis time in the first window, LLRC uses them together with the saved forward state metrics to compute LLR and extrinsic information. During this period, FSMC computes the forward state metrics of the second data window and saves them. At the same time, RSMC 2 computes the reverse state metrics of the third window. This pattern repeats until the last window is computed. In the example in FIG. 8, LLR and extrinsic information are not obtained until time periods 3. Thus the total overhead is 3 time periods, among which two time periods are for preloading data. Also, there are three active windows on which FSMC, RSMC 1, RSMC 2, or LLRC is working. Thus 6 systematic and 6 APP symbols are needed per clock cycle.

Figure 9:
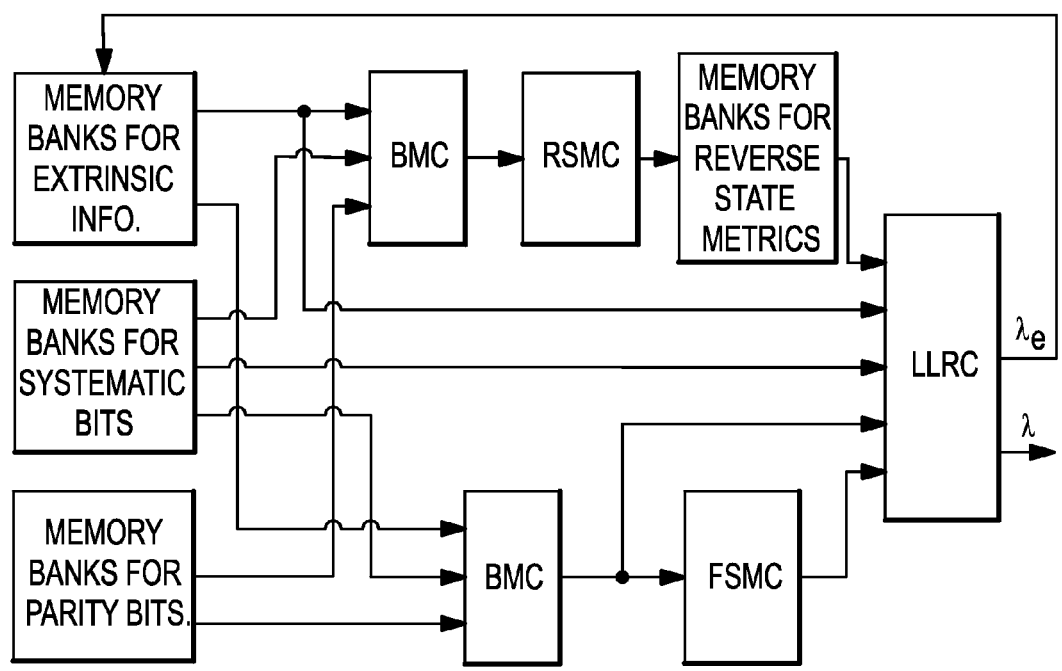
FIG. 9 illustrates an example of a single maximum a posteriori (MAP), single log likelihood ratio computation (LLRC) architecture.
Figure 10:
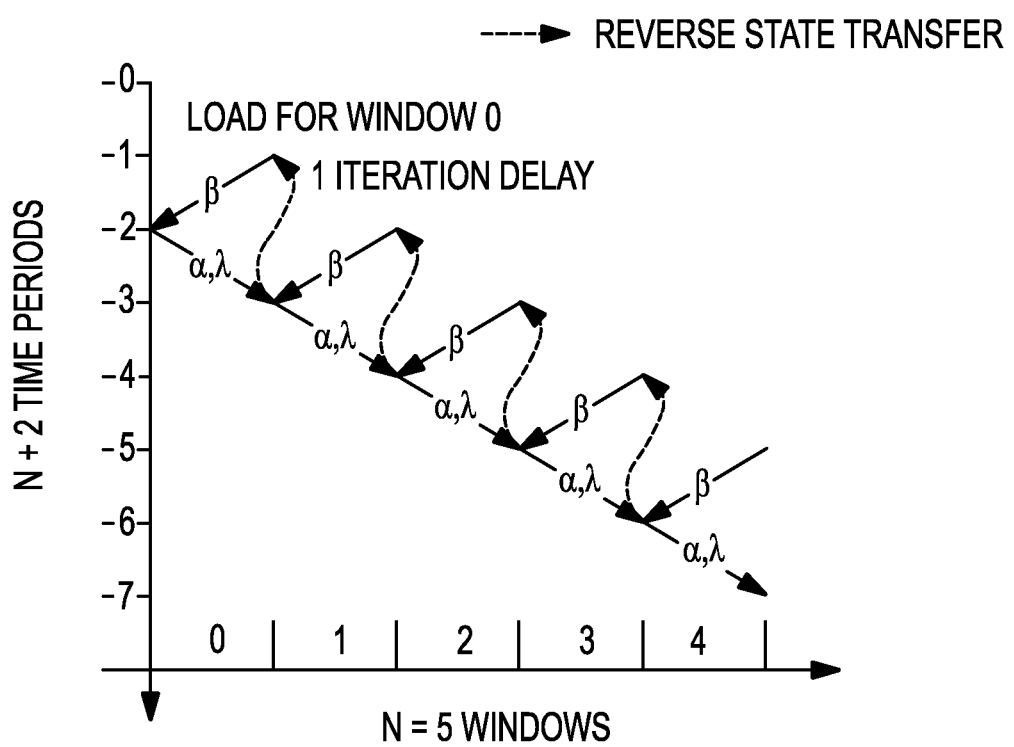
FIG. 10 illustrates an example operational flow diagram of the single maximum a posteriori (MAP), single log likelihood ratio computation (LLRC) architecture depicted in FIG. 9.

FIG. 9 illustrates an example of a single maximum a posteriori (MAP), single log likelihood ratio computation (LLRC) architecture. In one aspect, the single MAP single LLRC architecture shown in FIG. 9 comprises one FSMC, one RSMC, two BMCs, and one LLRC, with additional memories. Control machines are not shown in FIG. 9. FIG. 10 illustrates an example operational flow diagram of the single maximum a posteriori (MAP), single log likelihood ratio computation (LLRC) architecture depicted in FIG. 9 where $\alpha$, $\beta$, and $\lambda$ denote FSMC, RSMC, and LLRC, respectively.

The example illustrated in FIG. 10 is for 5 windows. In the FIG. 10 example, x-axis is the window index and y-axis is the time index where one time period is the time taken to process one window. Decoder starts with preloading one window of data. After preloading is done, RSMC starts to compute the reverse state metrics of the first window and saves them in memory. Once RSMC finishes the first window, it moves to the second data window and FSMC starts to compute the forward state metrics of the first window. Data of the second data window is loaded at the same time. One window of data loading continues on each time period. As soon as FSMC computes the forward state metrics on each trellis time in the first window, LLRC uses them together with the saved reverse state metrics to compute LLR and extrinsic information. During this period, RSMC computes the reverse state metrics of the second data window and saves them. This pattern repeats until the last window is computed.

In the example, the LLR and extrinsic information are not obtained until time periods 2. Thus the total overhead is 2 time periods, among which one time period is for preloading data. And, there are two active windows on which FSMC, RSMC, or LLRC is working. Thus 4 systematic and 4 APP symbols are needed per clock cycle. APP memory is reusable if de-interleaving is done by read address. The initial state metrics of RSMC at each window are propagated from the last state metrics of the next window obtained from the previous iteration.

Figure 11:
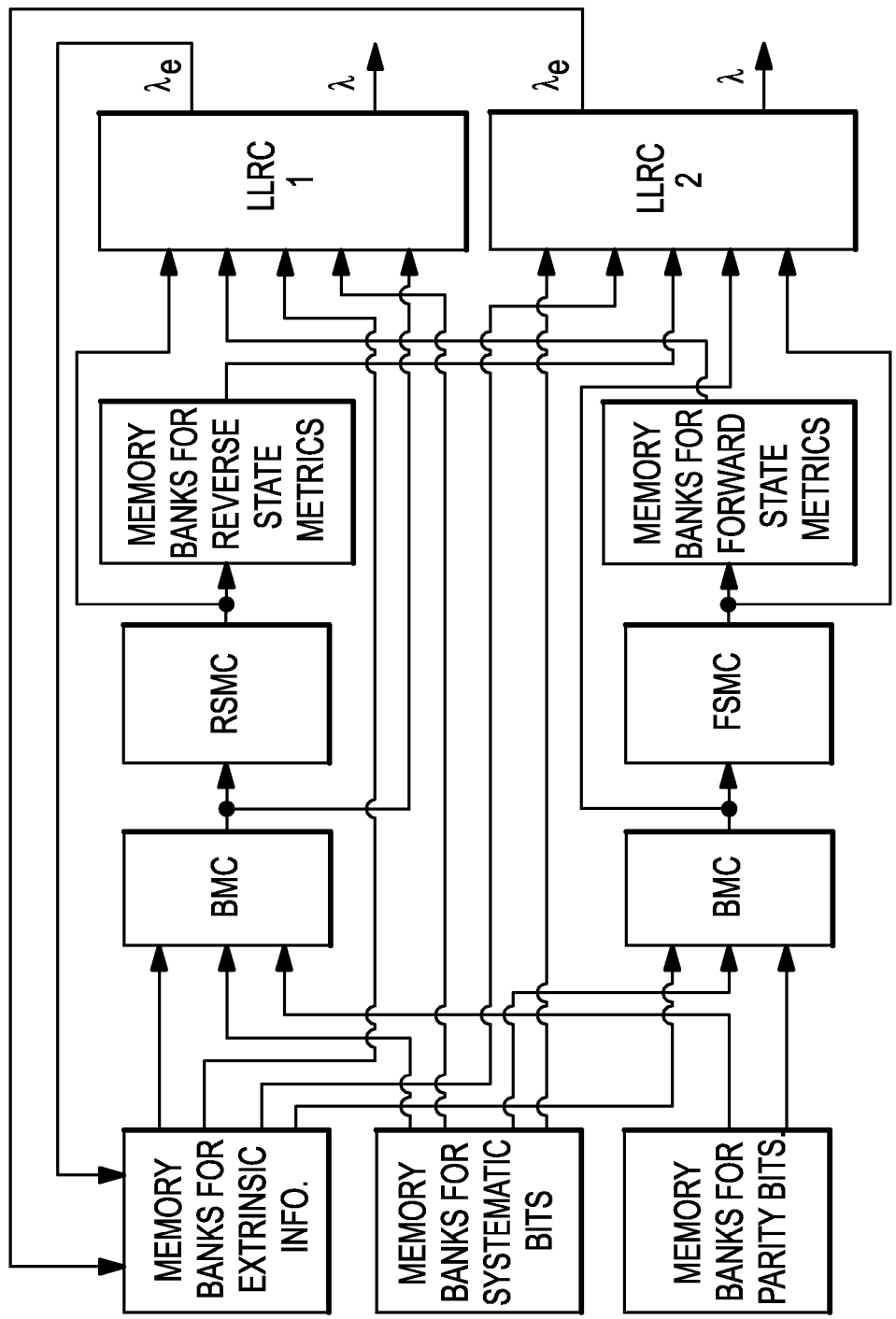
FIG. 11 illustrates another example of a single maximum a posteriori (MAP), dual log likelihood ratio computation (LLRC) architecture.
Figure 12:
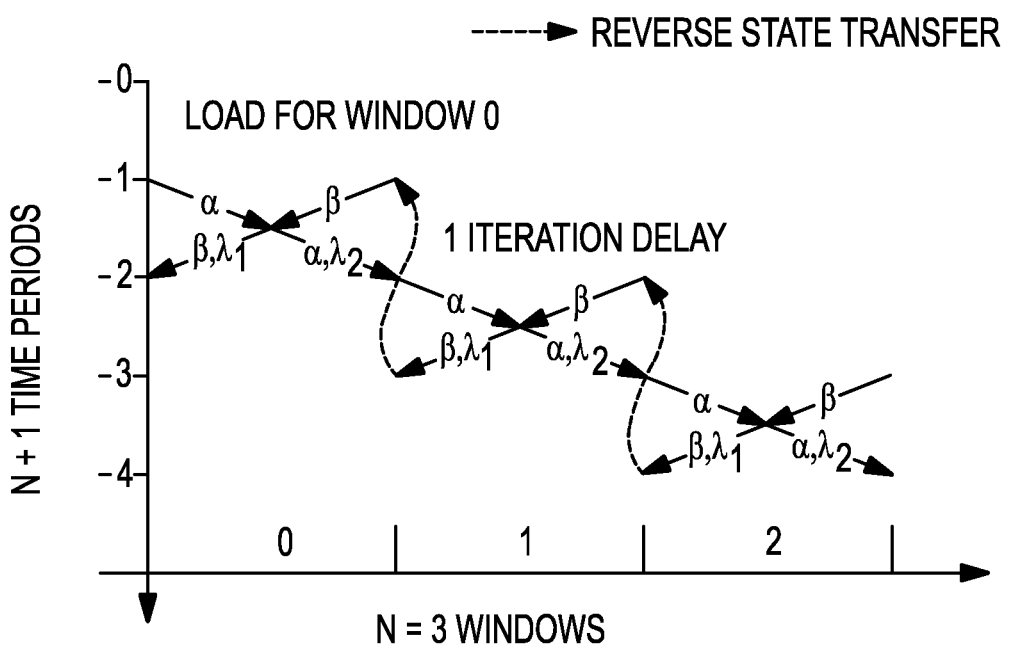
FIG. 12 illustrates an example operational flow of the single maximum a posteriori (MAP), dual log likelihood ratio computation (LLRC) architecture for N=3 windows depicted in FIG. 11.

In another aspect, FIG. 11 illustrates another example of a single maximum a posteriori (MAP), dual log likelihood ratio computation (LLRC) architecture. And, FIG. 12 illustrates an example operational flow of the single MAP, dual log likelihood ratio computation (LLRC) architecture for N=3 windows depicted in FIG. 11.

Figure 13:
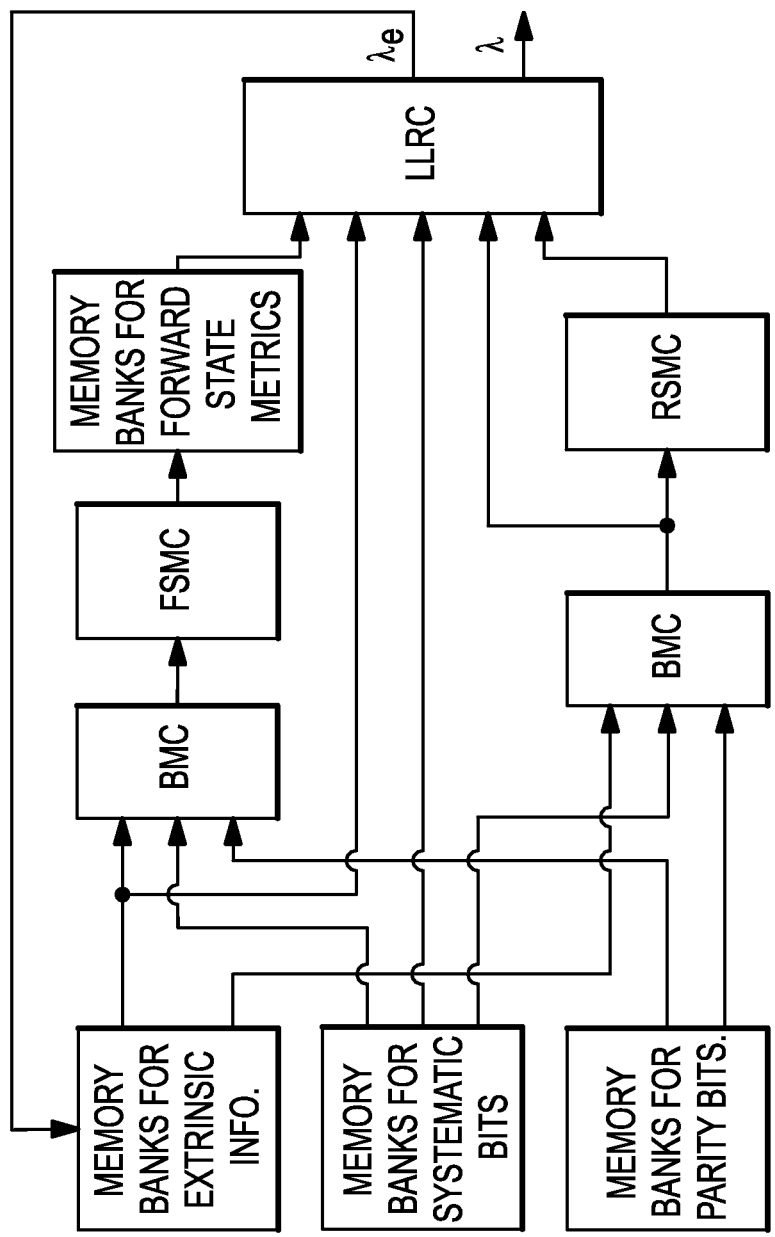
FIG. 13 illustrates an example of a second decoder of a dual maximum a posteriori (MAP), single log likelihood ratio computation (LLRC) architecture.

In another aspect, a dual MAP single LLRC architecture instantiates two of single MAP single LLRC decoders. The total number of windows is equally divided into two halves. One decoder starts from the first window and moves onto the next window. The other decoder starts from the last window and moves onto the previous window. Each decoder computes one half of the total windows. The first decoder is the same as single MAP single LLRC decoder shown in the example in FIG. 9. FIG. 13 illustrates an example of a second decoder of a dual maximum a posteriori (MAP), single log likelihood ratio computation (LLRC) architecture. In the he second decoder illustrated in FIG. 13, the FSRM and RSMC are switched and the forward state metrics are saved.

Figure 14:
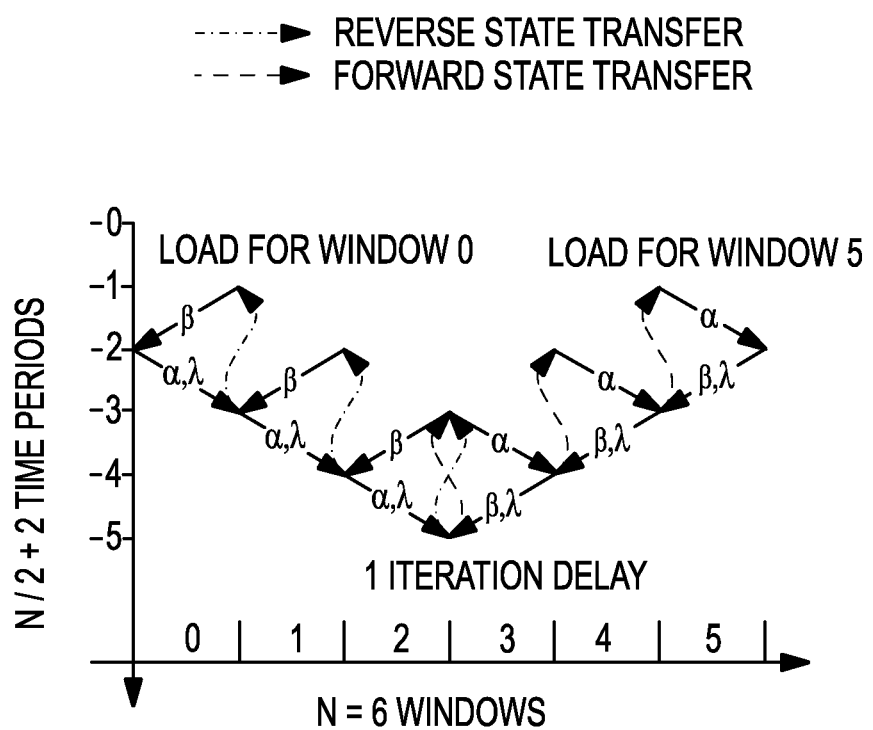
FIG. 14 illustrates an example operational flow of the second decoder of the dual maximum a posteriori (MAP), single log likelihood ratio computation (LLRC) architecture for N=6 windows depicted in FIG. 13.

FIG. 14 illustrates an example operational flow of the second decoder of the dual maximum a posteriori (MAP), single log likelihood ratio computation (LLRC) architecture for N=6 windows depicted in FIG. 13. As depicted in FIG. 14, the operational flow on the first half is the same as one for the single maximum a posteriori (MAP), single log likelihood ratio computation (LLRC) decoder. The operational flow on the second half is similarly done. The only difference is that FSMC and RSMC are switched. The first decoder propagates the reverse state metrics between windows and the second decoder propagates the forward state metrics between windows. In the boundary of two decoders, the two decoders exchange the forward and reverse state metrics.

Figure 15:
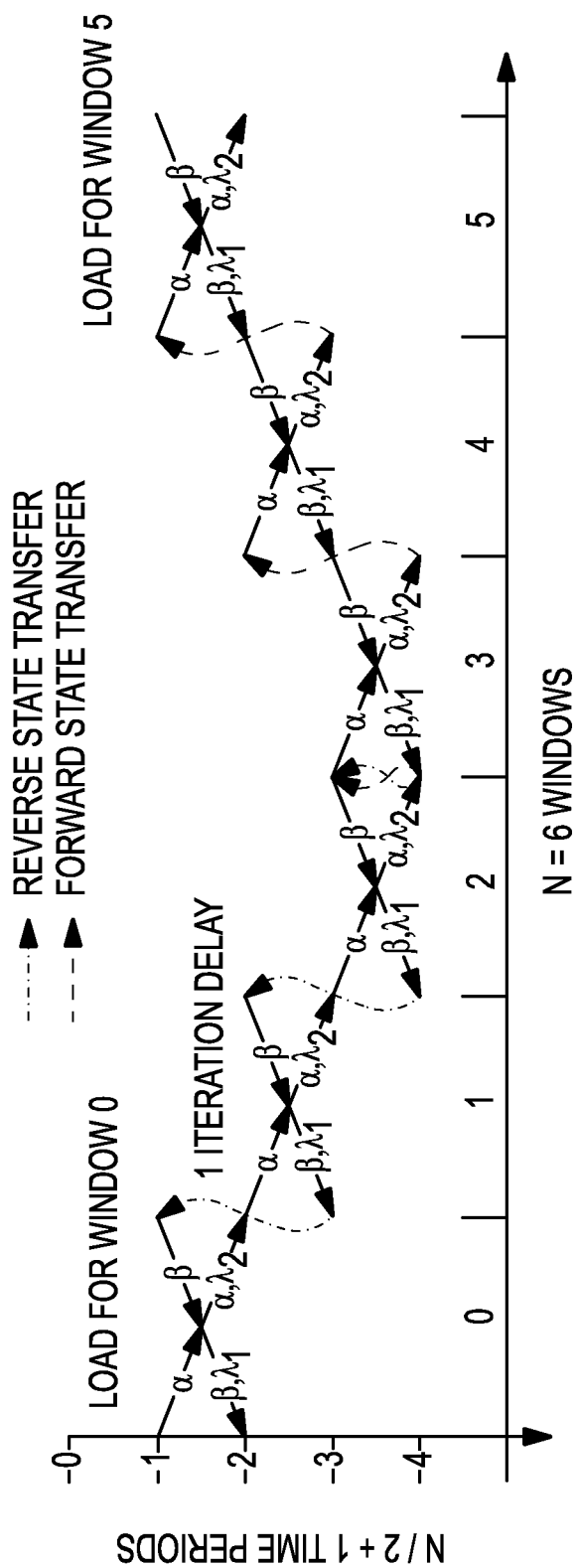
FIG. 15 illustrates an example operational flow of dual maximum a posteriori (MAP), dual log likelihood ratio computation (LLRC) for N=6 windows.

FIG. 15 illustrates an example operational flow of dual maximum a posteriori (MAP), dual log likelihood ratio computation (LLRC) for N=6 windows.

When a packet size is small, both interleaved and non-interleaved sequences can be stored. Then preloading overhead is only needed for the first iteration. As iteration continues, the preloading overhead diminishes. For example, suppose 17 half iterations and no-window operation for single MAP dual LLRC decoder. Then the overhead of the first half iteration is one window for the non-interleaved data preloading. The overhead of the second half iteration is also one window for the interleaved data preloading. Thus the relative throughput is 17 half iterations/19 window time periods=0.895.

Figure 16:
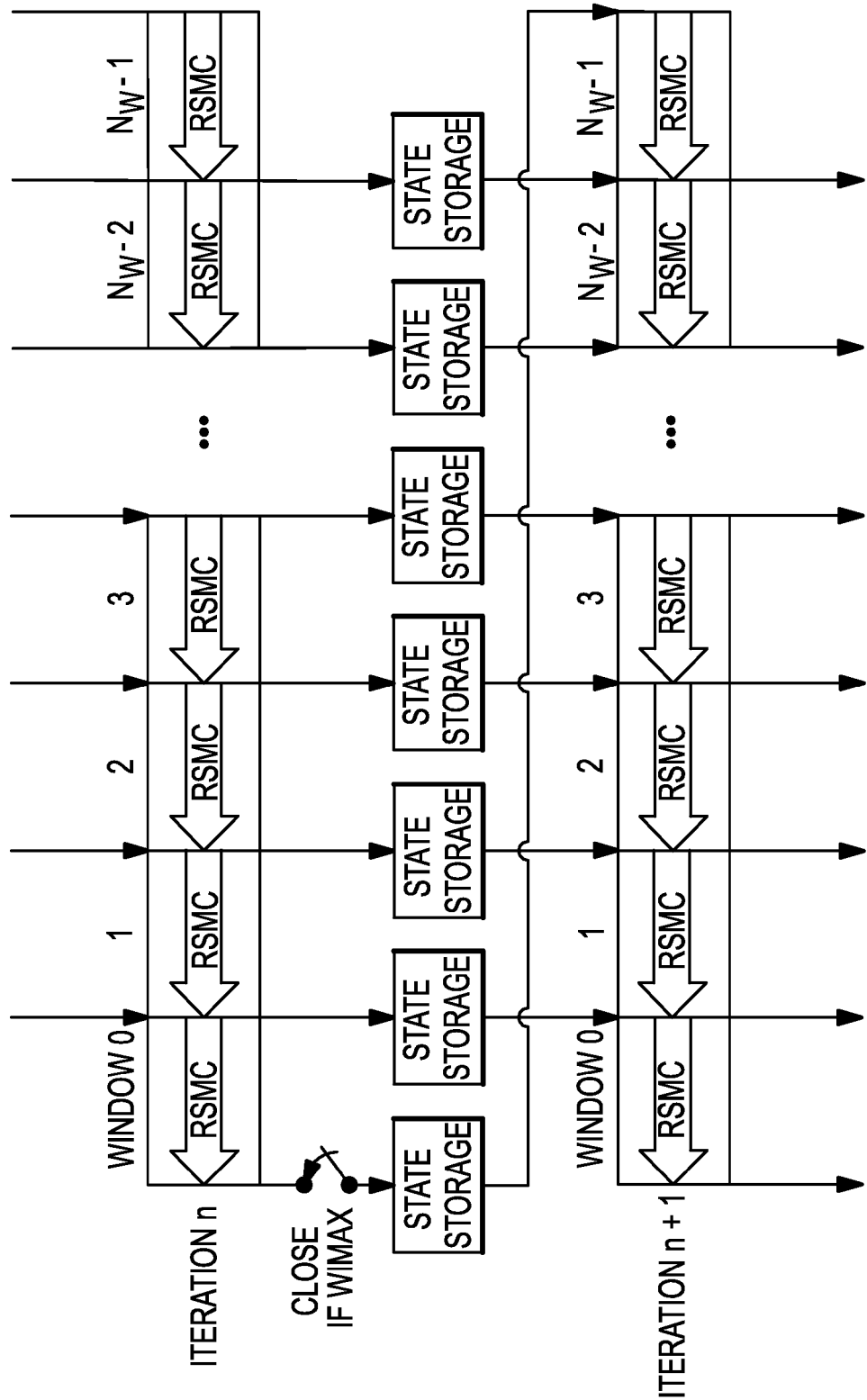
FIG. 16 illustrates a state propagation scheme in a single maximum a posteriori (MAP), single log likelihood ratio computation (LLRC) where RSMC utilizes the state propagation scheme.
Figure 17:
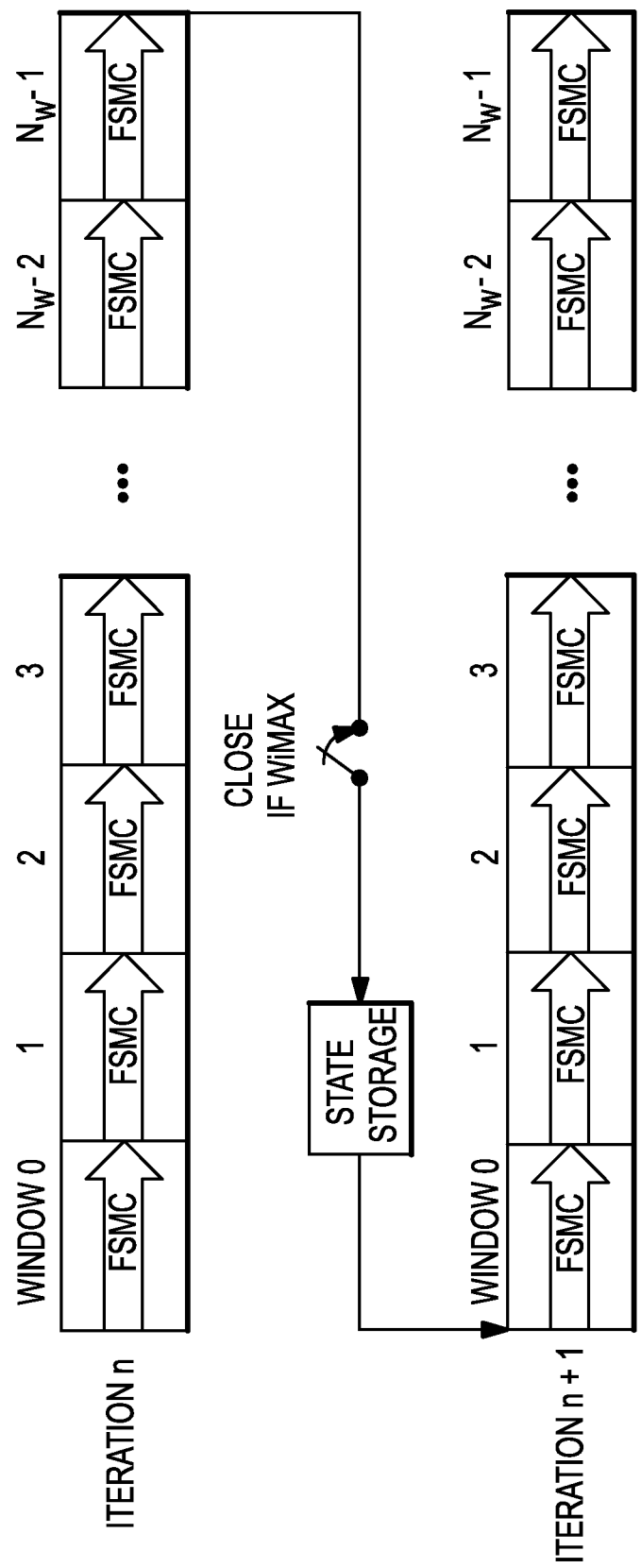
FIG. 17 illustrates a state propagation scheme in a single maximum a posteriori (MAP), single log likelihood ratio computation (LLRC) where FSMC utilizes the state propagation scheme.

In one aspect, a new sliding window scheme with state propagation between adjacent windows is implemented. Depending on which state metrics are first computed and saved, the state propagation is performed mainly in RSMC or in FSMC or both. For illustrational purpose, FIG. 16 illustrates a state propagation scheme in a single maximum a posteriori (MAP), single log likelihood ratio computation (LLRC) where RSMC utilizes the state propagation scheme. In the RSMC, the final state of the current window is transferred to the previous window on the next iteration and is used as the initial state. This is illustrated in FIG. 16. FIG. 17 illustrates a state propagation scheme in a single maximum a posteriori (MAP), single log likelihood ratio computation (LLRC) where FSMC utilizes the state propagation scheme. In the FSMC, the final state of the current window is continuously used as the initial state of the next window in the same iteration, as illustrated in FIG. 17.

In one example, there is a small difference between WiMAX mode and non-WiMAX mode. In the RSMC of the WiMAX mode, the final state of the first window is transferred to the last window on the next iteration and is used as the initial state. In the FSMC of the WiMAX mode, the final state of the last window is transferred to the first window on the next iteration and is used as the initial state. In the non-WiMAX mode, there is no need of state transfers between the first window and the last window. The state storages connected to the last window in the RSMC and the first window in the FSMC is initialized to the known states. If no windowing is used in the WiMAX mode, the final states of the RSMC and FSMC are used as the initial states of each unit on the next iteration. If no windowing is used in the non-WiMAX mode, known states are used as the initial states.

The disclosed sliding window scheme has two distinctive advantages compared to the conventional sliding window scheme: reduced number of RSMC and reduced computational overhead.

Figure 18:
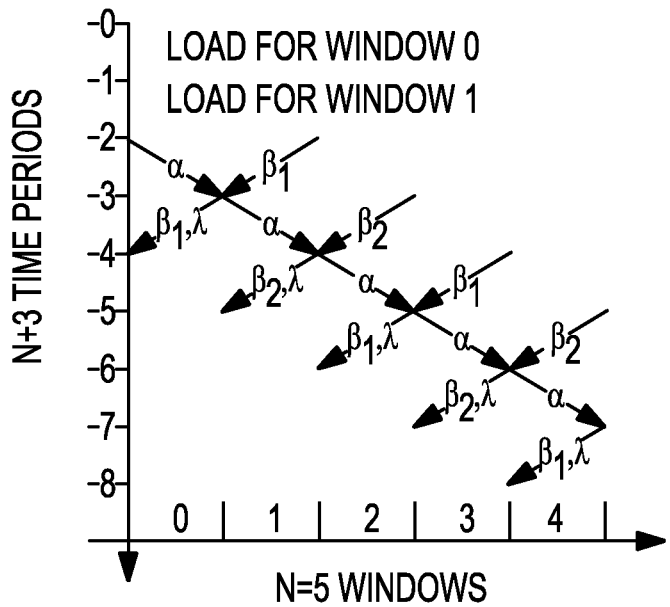
FIG. 18 illustrates an operational flow of a conventional sliding window scheme.

FIG. 18 illustrates an operational flow of a conventional sliding window scheme. The conventional sliding window scheme must run RSMC twice as fast as FSMC or equivalently two RSMC for one FSMC, as shown in FIG. 18, where $\alpha$, $\beta_1$, $\beta_2$, are FSMC, RSMC 1, RSMC 2, and LLRC, respectively. In the conventional sliding window scheme, the RSMC starts one window ahead of the current window to obtain reliable reverse state metrics. Thus, the RSMC computes two windows, while FSMC and LLRC compute one window. And, two RSMCs are needed. This is illustrated in FIG. 18 where five windows are for exemplar purpose, and x-axis denotes the window and y-axis denotes the time period to compute the window. A time period is the duration needed to compute one window. As illustrated, two RSMCs, $\beta_1$ and $\beta_2$, compute window n and window n+2 alternately. To compute N windows in the conventional sliding window scheme, N+3 time periods are needed.

Figure 19:
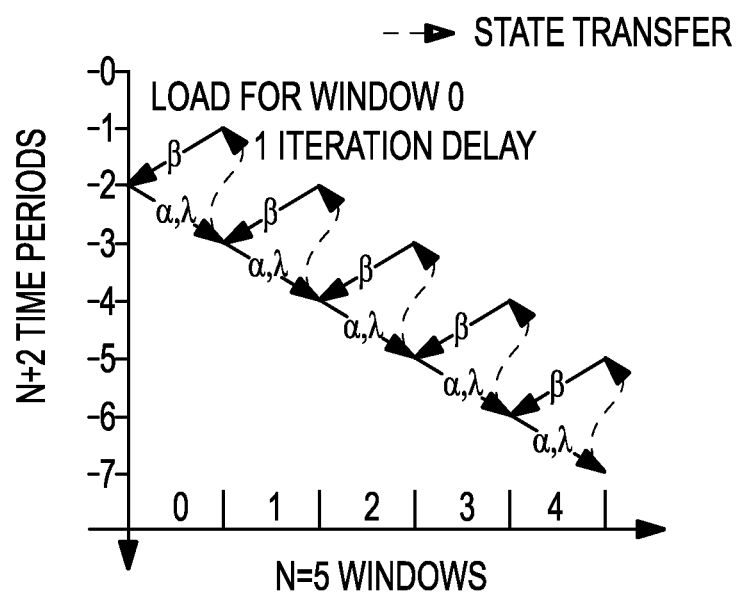
FIG. 19 illustrates an example of an operational flow of a sliding window scheme in accordance with the present disclosure.

FIG. 19 illustrates an example of an operational flow of a sliding window scheme in accordance with the present disclosure. On the contrary, the sliding window scheme can remove one RSMC, as shown in FIG. 19, where the final states propagate through windows in the next iterations. And, only one RSMC is running at any point of the time period. In addition to the reduced number of RSMC, the sliding window scheme needs only N+2 time periods (as opposed to the conventional scheme of needing N+3 time periods) to compute N windows. Thus, one window time period is saved.

As shown in Table 15, the worst case throughput requirement for systematic bits and APP are 4 symbols per clock cycle per loading. Thus, De-Rate-Matching block (DRM), which is an inverse operation of rate matching as defined in the standards, is able to provide 4 systematic symbols and corresponding parity symbols per clock.

In one example, the WiMAX interleaver has the following properties: a) if j, the address for the duo-binary symbol, is even, then $\Pi(j)$ is odd; and b) if j is odd, then $\Pi(j)$ is even. $\Pi$ stands for the contents of the interleaver. In one example, given two banks, one for even addresses and the other for odd addresses, there are 4 interleaved systematic symbols (two duo-binary symbols) per clock cycle. The LTE interleaver has the following properties: a) if j, the address for the binary symbol, is even, then $\Pi(j)$ is even; and b) if j is odd, then $\Pi(j)$ is odd. Since two banks provide only two interleaved systematic (binary) symbols per clock cycle, this LTE interleaver property is not enough. However, the LTE interleaver has an additional property: the address j mod 4 is one-to-one mapped to Π(j) mod 4. This additional property provides 4 interleaved systematic symbols if there are 4 banks and each bank is selected by the interleaved address mod 4; i.e., the two LSBs of the address Π(j).

In one example, an EVDO/CDMA interleaver has the following property: the 5 LSBs of address j are one-to-one mapped to the 5 MSBs of Π(j). This property allows for enabling 4 interleaved systematic symbols if there are 4 banks and each bank is selected by 2 MSBs of the address. However, there are addresses dropped by the interleaver and If the addresses dropped are not account for, then the decoder will stall. To avoid stalls, use 8 banks. Also, each bank should have 4 consecutive addresses in a row to provide 4 non-interleaved symbols.

In one example, an WCDMA interleaver has the following property: the address j mod 5 is one-to-one mapped to ⌊Π(j)/C⌋ mod 5 up to 4 addresses, where C is the number of the column in the interleaver. Here, 5 banks must be used to avoid stalls. Thus, 8 banks are needed for systematic (binary) symbol memory. Each bank contains 4 symbols in one address. The memory access schemes are then tailored to different standards.

Regarding MAP engine components, each MAP engine, for example, commonly contains BMC, FSMC, RSMC, and LLRC. In one example, the BMC computes one cycle ahead the branch metrics that are necessary to the FSMC and RSMC, and stores the metrics in a register bank. The branch metric computation depends on the mother code rate only.

There are two ways to tag branch metrics: state // systematic bits and systematic bits // parity bits. Tagging is a numbering scheme. The first one is more efficient for the rate ⅕ code and the second one is more efficient for the rate ⅓ code. In one example, the first method is used for cdma2000/EVDO mode and the second method is used for all other modes.

Figure 20:
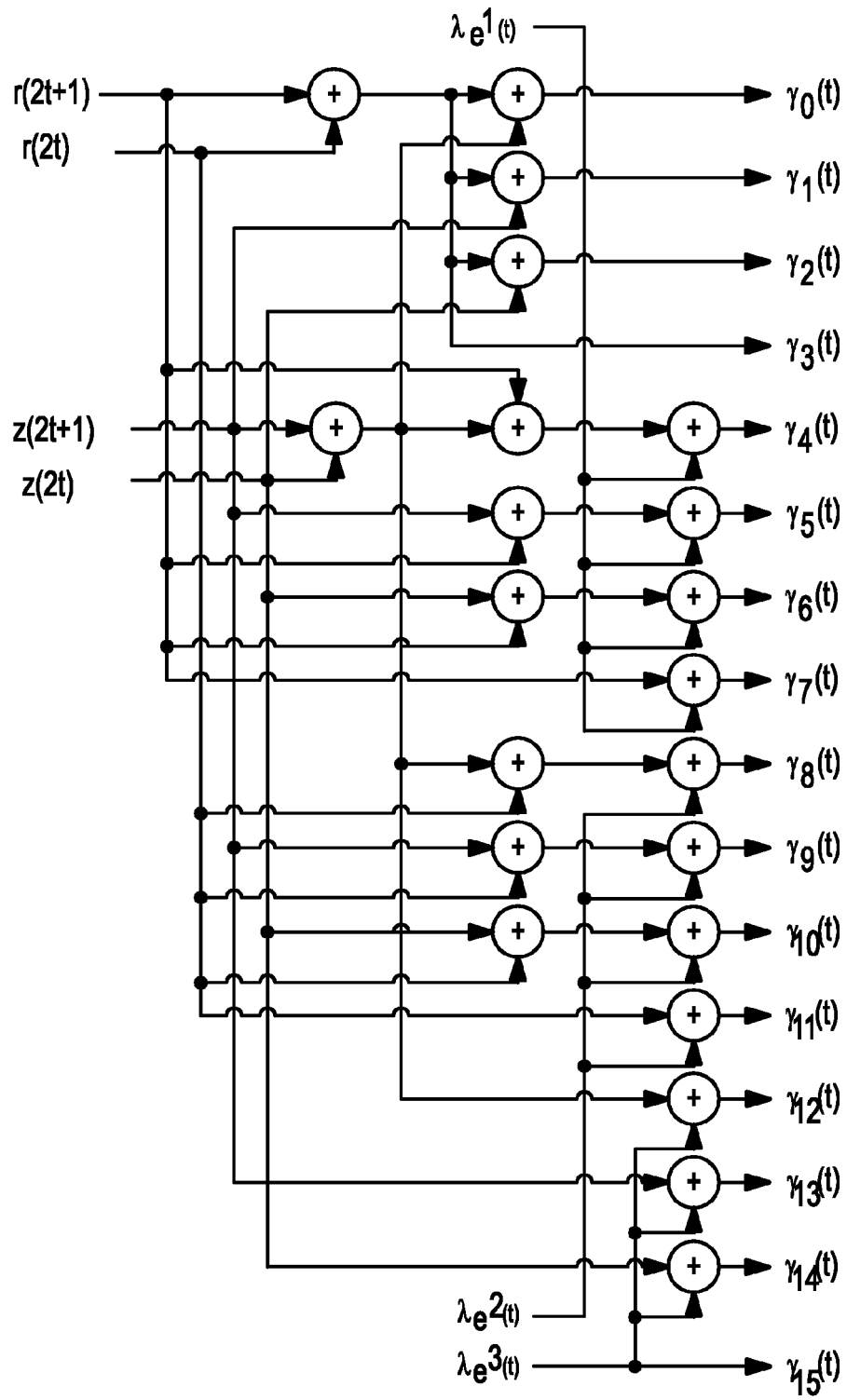
FIG. 20 illustrates an example of a simplified branch metric computation for rate ⅓ code.

Table 17 shows the direct implementation of the branch metric computation for rate ⅓ code. Since a common term in the branch metric eventually cancels in LLR computation, we can add $(r(2t+1)+r(2t)+z(2t+1)+z(20)/2-APP0$ to all branch metrics. Table 18 is the resultant simplified branch metric computation. Three stages of adders are needed which take approximately 3.6 ns in 45 nm. At the cost of more adders, the three stages can be reduced to two stages since each branch metric is a sum of up to 4 terms. FIG. 20 illustrates an example of a simplified branch metric computation for rate ⅓ code.

TABLE 17

| Branch metric tag [x(2t + 1), x(2t), y(2t + 1), y(2t)] | Branch metric |
|---|---|
| 0000 | $\gamma_0(t) = (2 * APP0 + r(2t + 1) + r(2t) + z(2t + 1) + z(2t))/2$ |
| 0001 | $\gamma_1(t) = (2 * APP0 + r(2t + 1) + r(2t) + z(2t + 1) - z(2t))/2$ |
| 0010 | $\gamma_2(t) = (2 * APP0 + r(2t + 1) + r(2r) - z(2t + 1) + z(2t))/2$ |
| 0011 | $\gamma_3(t) = (2 * APP0 + r(2t + 1) + r(2t) - z(2t + 1) - z(2t))/2$ |
| 0100 | $\gamma_4(t) = (2 * APP1 + r(2t + 1) - r(2t) + z(2t + 1) + z(2t))/2$ |
| 0101 | $\gamma_5(t) = (2 * APP1 + r(2t + 1) - r(2t) + z(2t + 1) - z(2t)/2$ |
| 0110 | $\gamma_6(t) = (2 * APP1 + r(2t + 1) - r(2t) - z(2t + 1) + z(2t))/2$ |
| 0111 | $\gamma_7(t) = (2 * APP1 + r(2t + 1) - r(2t) - z(2t + 1) - z(2t))/2$ |
| 1000 | $\gamma_8(t) = (2 * APP2 - r(2t + 1) + r(2t) + z(2t + 1) + z(2t))/2$ |
| 1001 | $\gamma_9(t) = (2 * APP2 - r(2t + 1) + r(2t) + z(2t + 1) - z(2t))/2$ |
| 1010 | $\gamma_{10}(t) = (2 * APP2 - r(2t + 1) + r(2t) - z(2t + 1) + z(2t))/2$ |
| 1011 | $\gamma_{11}(t) = (2 * APP2 - r(2t + 1) + r(2t) - z(2t + 1) - z(2t))/2$ |
| 1100 | $\gamma_{12}(t) = (2 * APP3 - r(2t + 1) - r(2t) + z(2t + 1) + z(2t))/2$ |
| 1101 | $\gamma_{13}(t) = (2 * APP3 - r(2t + 1) - r(2t) + z(2t + 1) - z(2t))/2$ |
| 1110 | $\gamma_{14}(t) = (2 * APP3 - r(2t + 1) - r(2t) - z(2t + 1) + z(2t))/2$ |
| 1111 | $\gamma_{15}(t) = (2 * APP3 - r(2t + 1) - r(2t) - z(2t + 1) - z(2t))/2$ |

TABLE 18

| Branch metric tag [x(2t + 1), x(2t), y(2t + 1), y(2t)] | Branch metric |
|---|---|
| 0000 | $\gamma_0(t) = r(2t + 1) + r(2t) + z(2t + 1) + z(2t)$ |
| 0001 | $\gamma_1(t) = r(2t + 1) + r(2t) + z(2t + 1)$ |
| 0010 | $\gamma_2(t) = r(2t + 1) + r(2t) + z(2t)$ |
| 0011 | $\gamma_3(t) = r(2t + 1) + r(2t)$ |
| 0100 | $\gamma_4(t) = \lambda_e^1(t) + r(2t + 1) + z(2t + 1) + z(2t)$ |
| 0101 | $\gamma_5(t) = \lambda_e^1(t) + r(2t + 1) + z(2t + 1)$ |
| 0110 | $\gamma_6(t) = \lambda_e^1(t) + r(2t + 1) + z(2t)$ |
| 0111 | $\gamma_7(t) = \lambda_e^1(t) + r(2t + 1)$ |
| 1000 | $\gamma_8(t) = \lambda_e^2(t) + r(2t) + z(2t + 1) + z(2t)$ |
| 1001 | $\gamma_9(t) = \lambda_e^2(t) + r(2t) + z(2t + 1)$ |
| 1010 | $\gamma_{10}(t) = \lambda_e^2(t) + r(2t) + z(2t)$ |
| 1011 | $\gamma_{11}(t) = \lambda_e^2(t) + r(2t)$ |
| 1100 | $\gamma_{12}(t) = \lambda_e^3(t) + z(2t + 1) + z(2t)$ |
| 1101 | $\gamma_{13}(t) = \lambda_e^3(t) + z(2t + 1)$ |
| 1110 | $\gamma_{14}(t) = \lambda_e^3(t) + z(2t)$ |
| 1111 | $\gamma_{15}(t) = \lambda_e^3(t)$ |

Similarly, the simplified branch metric computation for rate ⅕ code is shown in Table 19. The branch metric computation for rate ⅕ needs one more adder stage than the branch metric computation for rate ⅓. Either 3 stages of adders or 4 stages of adders can be used depending on the timing and complexity.

TABLE 19

| Branch metric tag [s2(t), s1(t), s0(t), x(2t + 1), x(2t)] | Branch metric |
|---|---|
| 00000 | $\zeta_0(t) = \gamma_0(t) + z1(2t + 1) + z1(2t)$ |
| 00001 | $\zeta_1(t) = \gamma_7(t)$ |
| 00010 | $\zeta_2(t) = \gamma_{10}(t) + z1(2t)$ |
| 00011 | $\zeta_3(t) = \gamma_{13}(t) + z1(2t + 1)$ |
| 00100 | $\zeta_4(t) = \gamma_2(t) + z1(2t)$ |
| 00101 | $\zeta_5(t) = \gamma_5(t) + z1(2t + 1)$ |
| 00110 | $\zeta_6(t) = \gamma_8(t) + z1(2t + 1) + z1(2t)$ |
| 00111 | $\zeta_7(t) = \gamma_{15}(t)$ |
| 01000 | $\zeta_8(t) = \gamma_3(t) + z1(2t)$ |
| 01001 | $\zeta_9(t) = \gamma_4(t) + z1(2t + 1)$ |
| 01010 | $\zeta_{10}(t) = \gamma_9(t) + z1(2t + 1) + z1(2t)$ |
| 01011 | $\zeta_{11}(t) = \gamma_{14}(t)$ |
| 01100 | $\zeta_{12}(t) = \gamma_1(t) + z1(2t + 1) + z1(2t)$ |
| 01101 | $\zeta_{13}(t) = \gamma_6(t)$ |

TABLE 19-continued

| Branch metric tag [s2(t), s1(t), s0(t), x(2t + 1), x(2t)] | Branch metric |
|---|---|
| 01110 | $\zeta_{14}(t) = \gamma_{11}(t) + z1(2t)$ |
| 01111 | $\zeta_{15}(t) = \gamma_{12}(t) + z1(2t + 1)$ |
| 10000 | $\zeta_{16}(t) = \gamma_3(t) + z1(2t + 1)$ |
| 10001 | $\zeta_{17}(t) = \gamma_4(t) + z1(2t)$ |
| 10010 | $\zeta_{18}(t) = \gamma_9(t)$ |
| 10011 | $\zeta_{19}(t) = \gamma_{14}(t) + z1(2t + 1) + z1(2t)$ |
| 10100 | $\zeta_{20}(t) = \gamma_1(t)$ |
| 10101 | $\zeta_{21}(t) = \gamma_6(t) + z1(2t + 1) + z1(2t)$ |
| 10110 | $\zeta_{22}(t) = \gamma_{11}(t) + z1(2t + 1)$ |
| 10111 | $\zeta_{23}(t) = \gamma_3(t) + z1(2t)$ |
| 11000 | $\zeta_{24}(t) = \gamma_0(t)$ |
| 11001 | $\zeta_{25}(t) = \gamma_7(t) + z1(2t + 1) + z1(2t)$ |
| 11010 | $\zeta_{26}(t) = \gamma_{10}(t) + z1(2t + 1)$ |
| 11011 | $\zeta_{27}(t) = \gamma_{13}(t) + z1(2t)$ |
| 11100 | $\zeta_{28}(t) = \gamma_2(t) + z1(2t + 1)$ |
| 11101 | $\zeta_{29}(t) = \gamma_5(t) + z1(2t)$ |
| 11110 | $\zeta_{30}(t) = \gamma_8(t)$ |
| 11111 | $\zeta_{31}(t) = \gamma_{15}(t) + z1(2t + 1) + z1(2t)$ |

NB: s2(t), s1(t), s0(t) are the encoder states with s0(t) denoting the rightmost state bit.

Regarding APP computation for WiMax, in the WiMAX mode, the extrinsic information for the quaternary symbol is stored. The a priori probability is related to the extrinsic information as follows:

$$\lambda_e^i(t) = \log\left(\frac{Pr(c_t = i)}{Pr(c_t = 0)}\right) \text{ for } i = 1, 2, 3$$

$$\sum_{i=0}^{3} Pr(c_t = i) = 1.$$

Solving the above two equations, yields:

$$APP_0 = \log(Pr(c_t = 0))$$
$$= -\log\left(1 + e^{\lambda_e^1(t)} + e^{\lambda_e^2(t)} + e^{\lambda_e^3(t)}\right)$$

$$APP_i = \log(Pr(c_t = i))$$
$$= APP_0 + \lambda_e^i(t) \text{ for } 9 = 1, 2, 3.$$

Regarding APP computation for non-WiMax, in non-WiMAX mode, the extrinsic information for binary symbols is stored. Thus, the binary extrinsic information is converted to the quaternary extrinsic information. Since the systematic bits are independent, the relationship between the quaternary extrinsic information and the binary extrinsic information is as follows:

$$\lambda_e^1(t) = \log\left(\frac{Pr(c_t = 1)}{Pr(c_t = 0)}\right)$$
$$= \log\left(\frac{Pr(x_{2t+1} = 0, x_{2t} = 1)}{Pr(x_{2t+1} = 0, x_{2t} = 0)}\right)$$
$$= \log\left(\frac{Pr(x_{2t+1} = 0)Pr(x_{2t} = 1)}{Pr(x_{2t+1} = 0)Pr(x_{2t} = 0)}\right)$$
$$= \log\left(\frac{Pr(x_{2t} = 1)}{Pr(x_{2t} = 0)}\right)$$
$$= \lambda_2(2t),$$

$$\lambda_e^2(t) = \lambda_e(2t + 1),$$
$$\lambda_e^3(t) = \lambda_e(2t) + \lambda_e(2t + 1)$$

where $\lambda_e$ is the binary extrinsic information.

Reverse state metric computation starts from the end of a window and moves backward in the trellis. In non-WiMAX mode, the initial reverse state metrics of the last window are loaded with trellis ending states obtained from the trellis termination bits irrespective of iteration. In WiMAX mode, it is loaded with all zeros in the beginning. After the first iteration, it is loaded with the final reverse state metrics of the first window. This is due to the tail-biting trellis in WiMAX mode. If no windowing is used, then the final reverse state metrics are used as the initial reverse state metrics of the same window in WiMAX mode.

Reverse State Metric Computation

Reverse state metric computation starts from the end of a window and moves backward in the trellis. In non-WiMAX mode, the initial reverse state metrics of the last window are loaded with trellis ending states obtained from the trellis termination bits irrespective of iteration. In WiMAX mode, it is loaded with all zeros in the beginning. After the first iteration, it is loaded with the final reverse state metrics of the first window. This is due to the tail-biting trellis in WiMAX mode. If no windowing is used, then the final reverse state metrics are used as the initial reverse state metrics of the same window in WiMAX mode.

Figure 21:
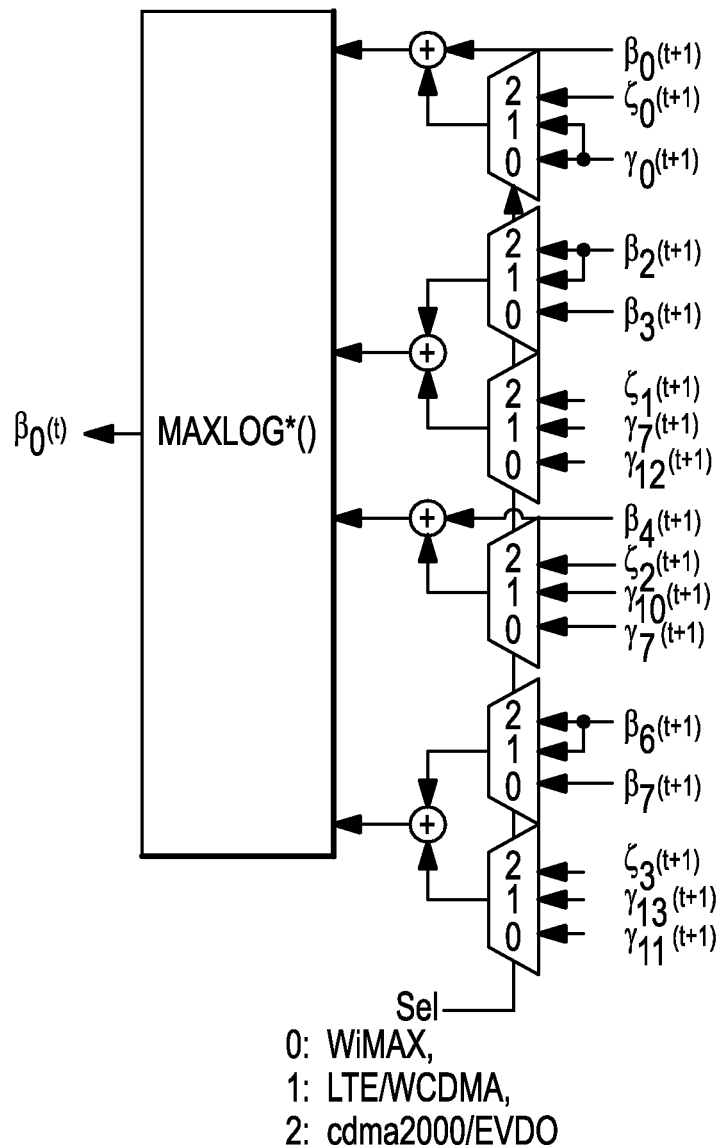
FIG. 21 illustrates an example reverse state metric computation with state 0 shown.

Tables 20, 21 and 22 show the reverse state metric update for LTE/WCDMA, WiMAX, and cdma2000/EVDO, respectively. FIG. 21 illustrates an example reverse state metric computation. FIG. 21 shows the unified update scheme for the RSMC, where update for state 0 is shown. Other states are similarly updated according to Table 20. Note that the RSMC timing is the sum of one mux, one adder, and max log*( ) timings. It will be approximately 0.3+1.2+3.5=5 ns in 45 nm.

TABLE 20

$\beta_0(t) = \text{maxlog} * (\beta_0(t + 1) + \gamma_0(t + 1), \beta_2(t + 1) + \gamma_7(t + 1), \beta_4(t + 1) + \gamma_{10}(t + 1), \beta_6(t + 1) + \gamma_{13}(t + 1))$
$\beta_1(t) = \text{maxlog} * (\beta_0(t + 1) + \gamma_5(t + 1), \beta_2(t + 1) + \gamma_2(t + 1), \beta_4(t + 1) + \gamma_{15}(t + 1), \beta_6(t + 1) + \gamma_8(t + 1))$
$\beta_2(t) = \text{maxlog} * (\beta_0(t + 1) + \gamma_{14}(t + 1), \beta_2(t + 1) + \gamma_9(t + 1), \beta_4(t + 1) + \gamma_4(t + 1), \beta_6(t + 1) + \gamma_3(t + 1))$
$\beta_3(t) = \text{maxlog} * (\beta_0(t + 1) + \gamma_0(t + 1), \beta_2(t + 1) + \gamma_7(t + 1), \beta_4(t + 1) + \gamma_{10}(t + 1), \beta_6(t + 1) + \gamma_{13}(t + 1))$
$\beta_4(t) = \text{maxlog} * (\beta_1(t + 1) + \gamma_9(t + 1), \beta_3(t + 1) + \gamma_{14}(t + 1), \beta_5(t + 1) + \gamma_3(t + 1), \beta_7(t + 1) + \gamma_4(t + 1))$
$\beta_5(t) = \text{maxlog} * (\beta_1(t + 1) + \gamma_{12}(t + 1), \beta_3(t + 1) + \gamma_{11}(t + 1), \beta_5(t + 1) + \gamma_6(t + 1), \beta_7(t + 1) + \gamma_1(t + 1))$
$\beta_6(t) = \text{maxlog} * (\beta_1(t + 1) + \gamma_7(t + 1), \beta_3(t + 1) + \gamma_0(t + 1), \beta_5(t + 1) + \gamma_{13}(t + 1), \beta_7(t + 1) + \gamma_{10}(t + 1))$
$\beta_7(t) = \text{maxlog} * (\beta_1(t + 1) + \gamma_2(t + 1), \beta_3(t + 1) + \gamma_5(t + 1), \beta_5(t + 1) + \gamma_8(t + 1), \beta_7(t + 1) + \gamma_{15}(t + 1))$

TABLE 21

$\beta_0(t) = \text{maxlog} * (\beta_0(t+1) + \gamma_0(t+1), \beta_3(t+1) + \gamma_{12}(t+1), \beta_4(t+1) + \gamma_7(t+1), \beta_7(t+1) + \gamma_{11}(t+1))$
$\beta_1(t) = \text{maxlog} * (\beta_0(t+1) + \gamma_7(t+1), \beta_3(t+1) + \gamma_{11}(t+1), \beta_4(t+1) + \gamma_0(t+1), \beta_7(t+1) + \gamma_{12}(t+1))$
$\beta_2(t) = \text{maxlog} * (\beta_1(t+1) + \gamma_1(t+1), \beta_2(t+1) + \gamma_{13}(t+1), \beta_5(t+1) + \gamma_6(t+1), \beta_6(t+1) + \gamma_{10}(t+1))$
$\beta_3(t) = \text{maxlog} * (\beta_1(t+1) + \gamma_6(t+1), \beta_2(t+1) + \gamma_{10}(t+1), \beta_5(t+1) + \gamma_1(t+1), \beta_6(t+1) + \gamma_{13}(t+1))$
$\beta_4(t) = \text{maxlog} * (\beta_1(t+1) + \gamma_8(t+1), \beta_2(t+1) + \gamma_4(t+1), \beta_5(t+1) + \gamma_{15}(t+1), \beta_6(t+1) + \gamma_3(t+1))$
$\beta_5(t) = \text{maxlog} * (\beta_1(t+1) + \gamma_{15}(t+1), \beta_2(t+1) + \gamma_3(t+1), \beta_5(t+1) + \gamma_8(t+1), \beta_6(t+1) + \gamma_4(t+1))$
$\beta_6(t) = \text{maxlog} * (\beta_0(t+1) + \gamma_9(t+1), \beta_3(t+1) + \gamma_5(t+1), \beta_4(t+1) + \gamma_{14}(t+1), \beta_7(t+1) + \gamma_2(t+1))$
$\beta_7(t) = \text{maxlog} * (\beta_0(t+1) + \gamma_{14}(t+1), \beta_3(t+1) + \gamma_2(t+1), \beta_4(t+1) + \gamma_9(t+1), \beta_7(t+1) + \gamma_5(t+1))$

TABLE 22

$\beta_0(t) = \text{maxlog} * (\beta_0(t+1) + \zeta_0(t+1), \beta_2(t+1) + \zeta_1(t+1), \beta_4(t+1) + \zeta_2(t+1), \beta_6(t+1) + \zeta_3(t+1))$
$\beta_1(t) = \text{maxlog} * (\beta_0(t+1) + \zeta_5(t+1), \beta_2(t+1) + \zeta_4(t+1), \beta_4(t+1) + \zeta_7(t+1), \beta_6(t+1) + \zeta_6(t+1))$
$\beta_2(t) = \text{maxlog} * (\beta_0(t+1) + \zeta_{11}(t+1), \beta_2(t+1) + \zeta_{10}(t+1), \beta_4(t+1) + \zeta_9(t+1), \beta_6(t+1) + \zeta_8(t+1))$
$\beta_3(t) = \text{maxlog} * (\beta_0(t+1) + \zeta_{14}(t+1), \beta_2(t+1) + \zeta_{15}(t+1), \beta_4(t+1) + \zeta_{12}(t+1), \beta_6(t+1) + \zeta_{13}(t+1))$
$\beta_4(t) = \text{maxlog} * (\beta_1(t+1) + \zeta_{18}(t+1), \beta_3(t+1) + \zeta_{19}(t+1), \beta_5(t+1) + \zeta_{16}(t+1), \beta_7(t+1) + \zeta_{17}(t+1))$
$\beta_5(t) = \text{maxlog} * (\beta_1(t+1) + \zeta_{23}(t+1), \beta_3(t+1) + \zeta_{22}(t+1), \beta_5(t+1) + \zeta_{21}(t+1), \beta_7(t+1) + \zeta_{20}(t+1))$
$\beta_6(t) = \text{maxlog} * (\beta_1(t+1) + \zeta_{25}(t+1), \beta_3(t+1) + \zeta_{24}(t+1), \beta_5(t+1) + \zeta_{27}(t+1), \beta_7(t+1) + \zeta_{26}(t+1))$
$\beta_7(t) = \text{maxlog} * (\beta_1(t+1) + \zeta_{28}(t+1), \beta_3(t+1) + \zeta_{29}(t+1), \beta_5(t+1) + \zeta_{30}(t+1), \beta_7(t+1) + \zeta_{31}(t+1))$ Forward State Metric Computation Forward state metric computation starts from the beginning of the window and moves forward in the trellis. The initial forward state metrics of the first window are known in the non-WiMAX mode (state 0 is the starting state). Thus, these known state metrics of the first window are used in all iterations. In WiMAX mode, it is loaded with all zeros in the beginning. After the first iteration, it is loaded with the final forward state metrics of the last window. This is due to the tail-biting trellis in WiMAX mode. If no windowing is used, then the final forward state metrics are used as the initial forward state metrics of the same window in WiMAX mode.

Tables 23, 24 and 25 show the forward state metric update for LTE/WCDMA, WiMAX, and cdma2000/EVDO, respectively. The timing for FSMC and RSMC are the same.

TABLE 23

$\alpha_0(t) = \text{maxlog} * (\alpha_0(t-1) + \gamma_0(t), \alpha_1(t-1) + \gamma_5(t), \alpha_2(t-1) + \gamma_{14}(t), \alpha_3(t-1) + \gamma_{11}(t))$
$\alpha_1(t) = \text{maxlog} * (\alpha_4(t-1) + \gamma_9(t), \alpha_5(t-1) + \gamma_{12}(t), \alpha_6(t-1) + \gamma_7(t), \alpha_7(t-1) + \gamma_2(t))$
$\alpha_2(t) = \text{maxlog} * (\alpha_0(t-1) + \gamma_7(t), \alpha_1(t-1) + \gamma_2(t), \alpha_2(t-1) + \gamma_9(t), \alpha_3(t-1) + \gamma_{12}(t))$
$\alpha_3(t) = \text{maxlog} * (\alpha_4(t-1) + \gamma_{14}(t), \alpha_5(t-1) + \gamma_{11}(t), \alpha_6(t-1) + \gamma_0(t), \alpha_7(t-1) + \gamma_5(t))$
$\alpha_4(t) = \text{maxlog} * (\alpha_0(t-1) + \gamma_{10}(t), \alpha_1(t-1) + \gamma_{15}(t), \alpha_2(t-1) + \gamma_4(t), \alpha_3(t-1) + \gamma_1(t))$
$\alpha_5(t) = \text{maxlog} * (\alpha_4(t-1) + \gamma_3(t), \alpha_5(t-1) + \gamma_6(t), \alpha_6(t-1) + \gamma_{13}(t), \alpha_7(t-1) + \gamma_8(t))$
$\alpha_6(t) = \text{maxlog} * (\alpha_0(t-1) + \gamma_{13}(t), \alpha_1(t-1) + \gamma_8(t), \alpha_2(t-1) + \gamma_3(t), \alpha_3(t-1) + \gamma_6(t))$
$\alpha_7(t) = \text{maxlog} * (\alpha_4(t-1) + \gamma_4(t), \alpha_5(t-1) + \gamma_1(t), \alpha_6(t-1) + \gamma_{10}(t), \alpha_7(t-1) + \gamma_{15}(t))$

TABLE 24

$\alpha_0(t) = \text{maxlog} * (\alpha_0(t-1) + \gamma_0(t), \alpha_1(t-1) + \gamma_7(t), \alpha_6(t-1) + \gamma_9(t), \alpha_7(t-1) + \gamma_{14}(t))$
$\alpha_1(t) = \text{maxlog} * (\alpha_2(t-1) + \gamma_1(t), \alpha_3(t-1) + \gamma_6(t), \alpha_4(t-1) + \gamma_8(t), \alpha_5(t-1) + \gamma_{15}(t))$
$\alpha_2(t) = \text{maxlog} * (\alpha_2(t-1) + \gamma_{13}(t), \alpha_3(t-1) + \gamma_{10}(t), \alpha_4(t-1) + \gamma_4(t), \alpha_5(t-1) + \gamma_3(t))$
$\alpha_3(t) = \text{maxlog} * (\alpha_0(t-1) + \gamma_{12}(t), \alpha_1(t-1) + \gamma_{11}(t), \alpha_6(t-1) + \gamma_5(t), \alpha_7(t-1) + \gamma_2(t))$
$\alpha_4(t) = \text{maxlog} * (\alpha_0(t-1) + \gamma_7(t), \alpha_1(t-1) + \gamma_0(t), \alpha_6(t-1) + \gamma_{14}(t), \alpha_7(t-1) + \gamma_9(t))$
$\alpha_5(t) = \text{maxlog} * (\alpha_2(t-1) + \gamma_6(t), \alpha_3(t-1) + \gamma_1(t), \alpha_4(t-1) + \gamma_{15}(t), \alpha_5(t-1) + \gamma_8(t))$
$\alpha_6(t) = \text{maxlog} * (\alpha_0(t-1) + \gamma_{10}(t), \alpha_3(t-1) + \gamma_{13}(t), \alpha_4(t-1) + \gamma_3(t), \alpha_5(t-1) + \gamma_4(t))$
$\alpha_7(t) = \text{maxlog} * (\alpha_0(t-1) + \gamma_{11}(t), \alpha_1(t-1) + \gamma_{12}(t), \alpha_6(t-1) + \gamma_2(t), \alpha_7(t-1) + \gamma_5(t))$

TABLE 25

$\alpha_0(t) = \text{maxlog} * (\alpha_0(t-1) + \zeta_0(t), \alpha_1(t-1) + \zeta_5(t), \alpha_2(t-1) + \zeta_{11}(t), \alpha_3(t-1) + \zeta_{14}(t))$
$\alpha_1(t) = \text{maxlog} * (\alpha_4(t-1) + \zeta_{18}(t), \alpha_5(t-1) + \zeta_{23}(t), \alpha_6(t-1) + \zeta_{25}(t), \alpha_7(t-1) + \zeta_{28}(t))$
$\alpha_2(t) = \text{maxlog} * (\alpha_0(t-1) + \zeta_1(t), \alpha_1(t-1) + \zeta_4(t), \alpha_2(t-1) + \zeta_{10}(t), \alpha_3(t-1) + \zeta_{15}(t))$
$\alpha_3(t) = \text{maxlog} * (\alpha_4(t-1) + \zeta_{19}(t), \alpha_5(t-1) + \zeta_{22}(t), \alpha_6(t-1) + \zeta_{24}(t), \alpha_7(t-1) + \zeta_{29}(t))$
$\alpha_4(t) = \text{maxlog} * (\alpha_0(t-1) + \zeta_2(t), \alpha_1(t-1) + \zeta_7(t), \alpha_2(t-1) + \zeta_9(t), \alpha_3(t-1) + \zeta_{12}(t))$
$\alpha_5(t) = \text{maxlog} * (\alpha_4(t-1) + \zeta_{16}(t), \alpha_5(t-1) + \zeta_{21}(t), \alpha_6(t-1) + \zeta_{27}(t), \alpha_7(t-1) + \zeta_{30}(t))$
$\alpha_6(t) = \text{maxlog} * (\alpha_0(t-1) + \zeta_3(t), \alpha_1(t-1) + \zeta_6(t), \alpha_2(t-1) + \zeta_8(t), \alpha_3(t-1) + \zeta_{13}(t))$
$\alpha_7(t) = \text{maxlog} * (\alpha_4(t-1) + \zeta_{17}(t), \alpha_5(t-1) + \zeta_{20}(t), \alpha_6(t-1) + \zeta_{26}(t), \alpha_7(t-1) + \zeta_{31}(t))$ LLR Computation LLRC starts to compute the LLR and the extrinsic information as soon as the forward state metric at trellis time t and the reverse state metric at trellis time t+1 are available. In one example, state by computing APP. Tables 26, 27 and 28 show the APP computations for LTE/WCDMA, WiMax and CDMA2000/EVDO, respectively.

TABLE 26

$p_0(t)$ = maxlog * $(\alpha_0(t) + \beta_0(t + 1) + \gamma_0(t + 1), \alpha_1(t) + \beta_2(t + 1) + \gamma_2(t + 1), \alpha_2(t) + \beta_6(t + 1) + \gamma_3(t + 1),$
$\alpha_3(t) + \beta_4(t + 1) + \gamma_1(t + 1), \alpha_4(t) + \beta_5(t + 1) + \gamma_3(t + 1), \alpha_5(t) + \beta_7(t + 1) + \gamma_1(t + 1),$
$\alpha_6(t) + \beta_3(t + 1) + \gamma_0(t + 1), \alpha_7(t) + \beta_1(t + 1) + \gamma_2(t + 1))$
$p_1(t)$ = maxlog * $(\alpha_0(t) + \beta_2(t + 1) + \gamma_7(t + 1), \alpha_1(t) + \beta_0(t + 1) + \gamma_5(t + 1), \alpha_2(t) + \beta_4(t + 1) + \gamma_4(t + 1),$
$\alpha_3(t) + \beta_6(t + 1) + \gamma_6(t + 1), \alpha_4(t) + \beta_7(t + 1) + \gamma_4(t + 1), \alpha_5(t) + \beta_5(t + 1) + \gamma_6(t + 1),$
$\alpha_6(t) + \beta_1(t + 1) + \gamma_7(t + 1), \alpha_7(t) + \beta_3(t + 1) + \gamma_5(t + 1))$
$p_2(t)$ = maxlog * $(\alpha_0(t) + \beta_4(t + 1) + \gamma_{10}(t + 1), \alpha_1(t) + \beta_6(t + 1) + \gamma_8(t + 1), \alpha_2(t) + \beta_2(t + 1) + \gamma_9(t + 1),$
$\alpha_3(t) + \beta_0(t + 1) + \gamma_{11}(t + 1), \alpha_4(t) + \beta_1(t + 1) + \gamma_9(t + 1), \alpha_5(t) + \beta_3(t + 1) + \gamma_{11}(t + 1),$
$\alpha_6(t) + \beta_7(t + 1) + \gamma_{10}(t + 1), \alpha_7(t) + \beta_5(t + 1) + \gamma_8(t + 1))$
$p_3(t)$ = maxlog * $(\alpha_0(t) + \beta_6(t + 1) + \gamma_{13}(t + 1), \alpha_1(t) + \beta_4(t + 1) + \gamma_{15}(t + 1),$
$\alpha_2(t) + \beta_0(t + 1) + \gamma_{14}(t + 1), \alpha_3(t) + \beta_2(t + 1) + \gamma_{12}(t + 1), \alpha_4(t) + \beta_3(t + 1) + \gamma_{14}(t + 1),$
$\alpha_5(t) + \beta_1(t + 1) + \gamma_{12}(t + 1), \alpha_6(t) + \beta_5(t + 1) + \gamma_{13}(t + 1), \alpha_7(t) + \beta_7(t + 1) + \gamma_{15}(t + 1))$

TABLE 27

$p_0(t)$ = maxlog * $(\alpha_0(t) + \beta_0(t + 1) + \gamma_0(t + 1), \alpha_1(t) + \beta_4(t + 1) + \gamma_0(t + 1), \alpha_2(t) + \beta_1(t + 1) + \gamma_1(t + 1),$
$\alpha_3(t) + \beta_5(t + 1) + \gamma_1(t + 1), \alpha_4(t) + \beta_6(t + 1) + \gamma_3(t + 1), \alpha_5(t) + \beta_2(t + 1) + \gamma_3(t + 1),$
$\alpha_6(t) + \beta_7(t + 1) + \gamma_2(t + 1), \alpha_7(t) + \beta_3(t + 1) + \gamma_2(t + 1))$
$p_1(t)$ = maxlog * $(\alpha_0(t) + \beta_4(t + 1) + \gamma_7(t + 1), \alpha_1(t) + \beta_0(t + 1) + \gamma_7(t + 1), \alpha_2(t) + \beta_5(t + 1) + \gamma_6(t + 1),$
$\alpha_3(t) + \beta_1(t + 1) + \gamma_6(t + 1), \alpha_4(t) + \beta_2(t + 1) + \gamma_4(t + 1), \alpha_5(t) + \beta_6(t + 1) + \gamma_4(t + 1),$
$\alpha_6(t) + \beta_3(t + 1) + \gamma_5(t + 1), \alpha_7(t) + \beta_7(t + 1) + \gamma_5(t + 1))$
$p_2(t)$ = maxlog * $(\alpha_0(t) + \beta_7(t + 1) + \gamma_{11}(t + 1), \alpha_1(t) + \beta_3(t + 1) + \gamma_{11}(t + 1),$
$\alpha_2(t) + \beta_6(t + 1) + \gamma_{10}(t + 1), \alpha_3(t) + \beta_2(t + 1) + \gamma_{10}(t + 1), \alpha_4(t) + \beta_1(t + 1) + \gamma_8(t + 1),$
$\alpha_5(t) + \beta_5(t + 1) + \gamma_8(t + 1), \alpha_6(t) + \beta_0(t + 1) + \gamma_9(t + 1), \alpha_7(t) + \beta_4(t + 1) + \gamma_9(t + 1))$
$p_3(t)$ = maxlog * $(\alpha_0(t) + \beta_3(t + 1) + \gamma_{12}(t + 1), \alpha_1(t) + \beta_7(t + 1) + \gamma_{12}(t + 1),$
$\alpha_2(t) + \beta_2(t + 1) + \gamma_{13}(t + 1), \alpha_3(t) + \beta_6(t + 1) + \gamma_{13}(t + 1), \alpha_4(t) + \beta_5(t + 1) + \gamma_{15}(t + 1),$
$\alpha_5(t) + \beta_1(t + 1) + \gamma_{15}(t + 1), \alpha_6(t) + \beta_4(t + 1) + \gamma_{14}(t + 1), \alpha_7(t) + \beta_0(t + 1) + \gamma_{14}(t + 1))$

TABLE 28

$p_0(t)$ = maxlog * $(\alpha_0(t) + \beta_0(t + 1) + \zeta_0(t + 1), \alpha_1(t) + \beta_2(t + 1) + \zeta_4(t + 1), \alpha_2(t) + \beta_6(t + 1) + \zeta_8(t + 1),$
$\alpha_3(t) + \beta_4(t + 1) + \zeta_{12}(t + 1), \alpha_4(t) + \beta_5(t + 1) + \zeta_{16}(t + 1), \alpha_5(t) + \beta_7(t + 1) + \zeta_{20}(t + 1),$
$\alpha_6(t) + \beta_3(t + 1) + \zeta_{24}(t + 1), \alpha_7(t) + \beta_1(t + 1) + \zeta_{28}(t + 1))$
$p_1(t)$ = maxlog * $(\alpha_0(t) + \beta_2(t + 1) + \zeta_1(t + 1), \alpha_1(t) + \beta_0(t + 1) + \zeta_5(t + 1), \alpha_2(t) + \beta_4(t + 1) + \zeta_9(t + 1),$
$\alpha_3(t) + \beta_6(t + 1) + \zeta_{13}(t + 1), \alpha_4(t) + \beta_7(t + 1) + \zeta_{17}(t + 1), \alpha_5(t) + \beta_5(t + 1) + \zeta_{21}(t + 1),$
$\alpha_6(t) + \beta_1(t + 1) + \zeta_{25}(t + 1), \alpha_7(t) + \beta_3(t + 1) + \zeta_{29}(t + 1))$
$p_2(t)$ = maxlog * $(\alpha_0(t) + \beta_4(t + 1) + \zeta_2(t + 1), \alpha_1(t) + \beta_6(t + 1) + \zeta_6(t + 1),$
$\alpha_2(t) + \beta_2(t + 1) + \zeta_{10}(t + 1), \alpha_3(t) + \beta_0(t + 1) + \zeta_{14}(t + 1), \alpha_4(t) + \beta_1(t + 1) + \zeta_{18}(t + 1),$
$\alpha_5(t) + \beta_3(t + 1) + \zeta_{22}(t + 1), \alpha_6(t) + \beta_7(t + 1) + \zeta_{26}(t + 1), \alpha_7(t) + \beta_5(t + 1) + \zeta_{30}(t + 1))$
$p_3(t)$ = maxlog * $(\alpha_0(t) + \beta_6(t + 1) + \zeta_3(t + 1), \alpha_1(t) + \beta_4(t + 1) + \zeta_7(t + 1),$
$\alpha_2(t) + \beta_0(t + 1) + \zeta_{11}(t + 1), \alpha_3(t) + \beta_2(t + 1) + \zeta_{15}(t + 1), \alpha_4(t) + \beta_3(t + 1) + \zeta_{19}(t + 1),$
$\alpha_5(t) + \beta_1(t + 1) + \zeta_{23}(t + 1), \alpha_6(t) + \beta_5(t + 1) + \zeta_{27}(t + 1), \alpha_7(t) + \beta_7(t + 1) + \zeta_{31}(t + 1))$ LLR is obtained by:

$\lambda^i(t) = p_i(t) - p_o(t)$ for $i = 1, 2, 3$.

The extrinsic information is obtained by:

$\lambda_e^i(t) = \lambda^i(t) - \lambda_{ie}^i(t) - r_t^T \cdot s_t^i$.

where $\lambda_{ie}$ is the intrinsic information.

The LLRC uses a max log of 8 elements that is obtained by a cascade of max log* of 2 elements with two max logs of 4 elements. Max log is an approximation of the log of the sum of the exponential terms (i.e., $\log(e^{a_1} + \ldots + e^{a_n}) = \max(a_1, \ldots, a_n)$).

$$\text{maxlog}^*\left(\sum_{i=0}^{7} a_i\right) \simeq \text{maxlog}^*\left(\text{maxlog}^*\left(\sum_{i=0}^{3} a_i\right), \text{maxlog}^*\left(\sum_{i=4}^{7} a_i\right)\right).$$

Figure 22A:
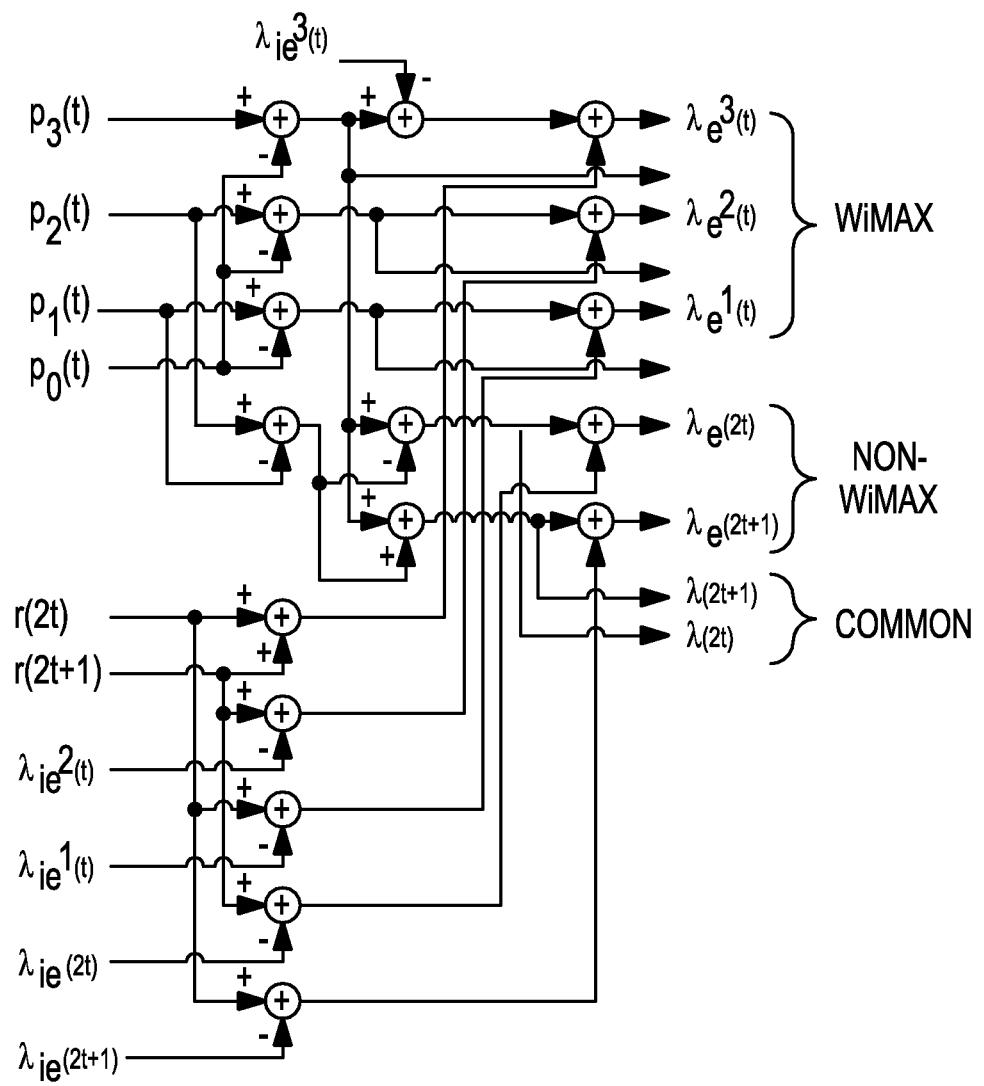
FIG. 22a illustrated an example diagram of log likelihood ratio (LLR) computation.
Figure 22B:
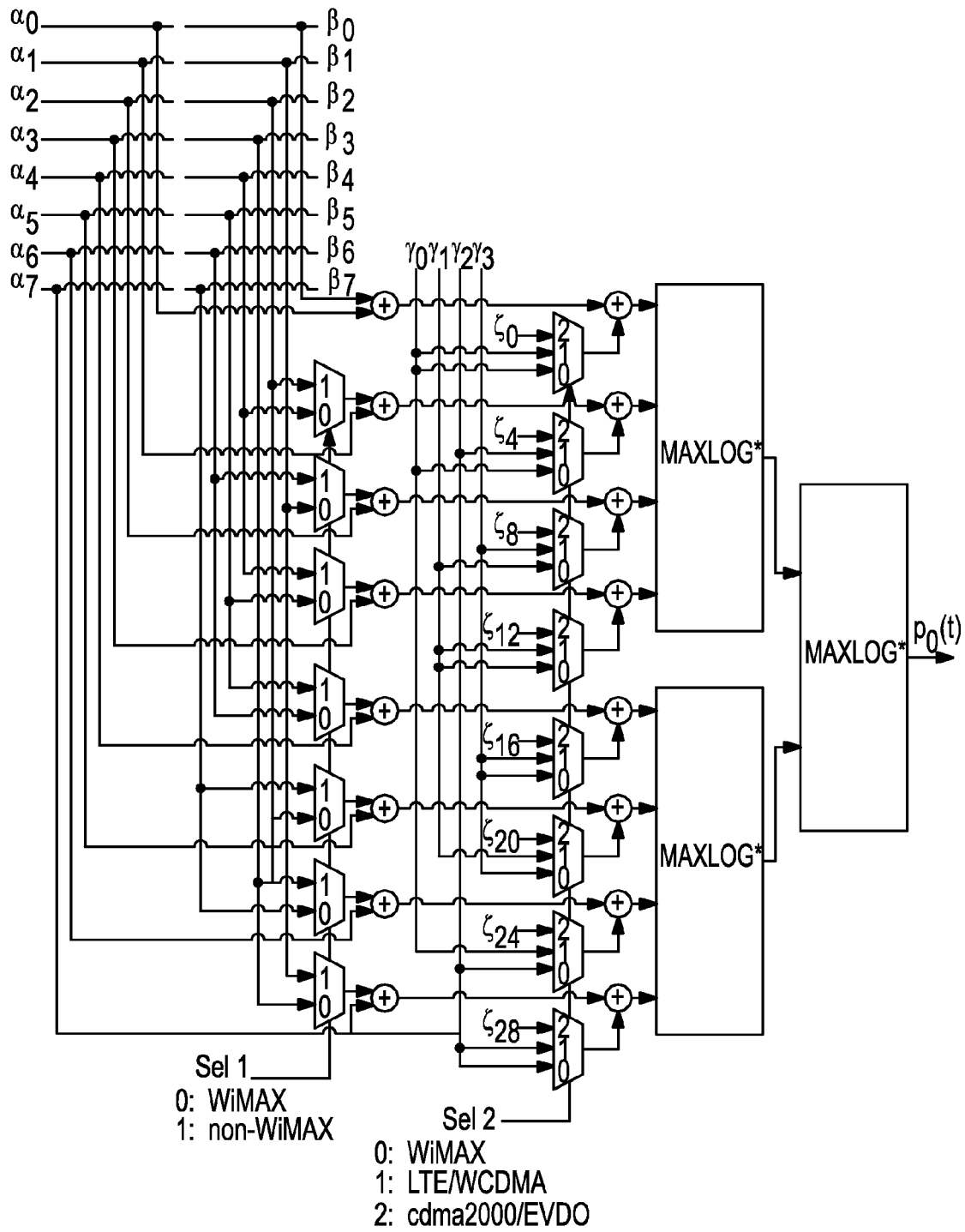
FIG. 22b illustrates an example diagram of APP computation for symbol value 0.

As understood by one skilled in the art, max log* is max log with compensation term(s). Then, the LLRC timing is the sum of two stages of adders, 2 stages of max log*s, and three stages of adders. The LLRC computation is divided into four pipeline stages as:
1. Two stages of adders for the sum of $\alpha$, $\beta$, and $\gamma$
2. Two max log*s of 4 elements
3. One max log* of two elements
4. Three stages of adders for $\lambda$ and $\lambda_e$ FIG. 22a illustrates an example diagram of log likelihood ratio (LLR) computation. FIG. 22b illustrates an example diagram of APP computation for symbol value 0.

Figure 23:
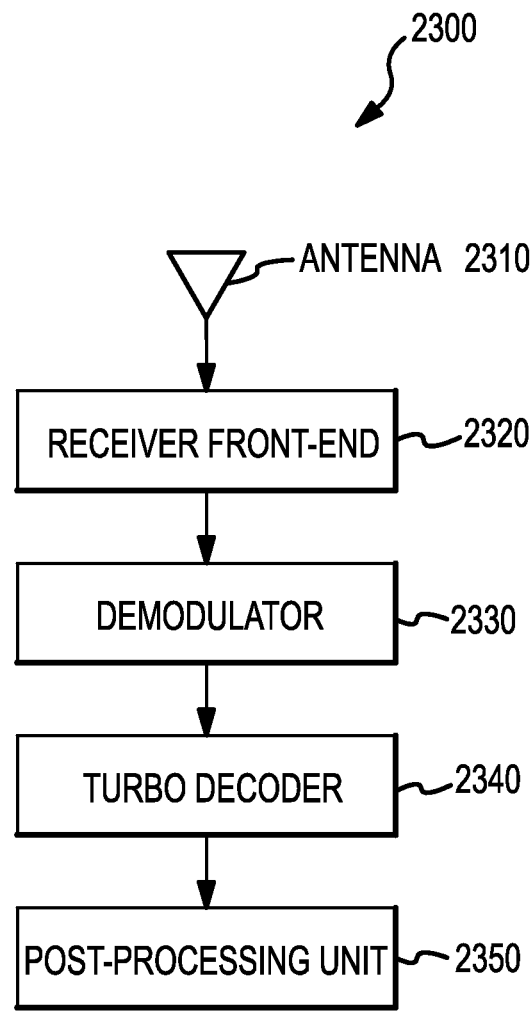
FIG. 23 illustrates an example receiver block diagram for implementing turbo decoding.

FIG. 23 illustrates an example receiver block diagram for implementing turbo decoding. In one aspect, the receiver 2300 comprises an antenna 2310, a receiver front-end 2320, a demodulator 2330, a turbo decoder 2340 and a post-processing unit 2350. The antenna 2310 receives electromagnetic waves comprising a received signal which are inputted to the receiver front-end. In the receiver front-end 2320, the received signal is amplified, downconverted, filtered and/or analog-to-digital converted to output a digital waveform. From the output of the receiver front-end, the digital waveform is then inputted into the demodulator 2330. The demodulator 2330 demodulates the digital waveform according to the modulation techniques previously applied, for example, binary phase shift keying (BPSK), quadrature phase shift keying (QPSK), M-ary phase shift keying (M-PSK), quadrature amplitude modulation (QAM), or frequency shift keying (FSK), etc.

The output of the demodulator 2330, a demodulated bit stream, is then inputted to the turbo decoder 2340. High throughput unified turbo decoding techniques are disclosed in the present disclosure. The decoded bits outputted from the turbo decoder are inputted to a post-processing unit 2350. In one example, the decoded bits are further processed by the post-processing unit 2350 which deinterleaves, decrypts, and/or decompresses, etc. In one aspect, the decoded bits or the post-processed decoded bits are routed to another destination, such as but not limited to, a network node, a router and/or switch, etc.

Figure 24:
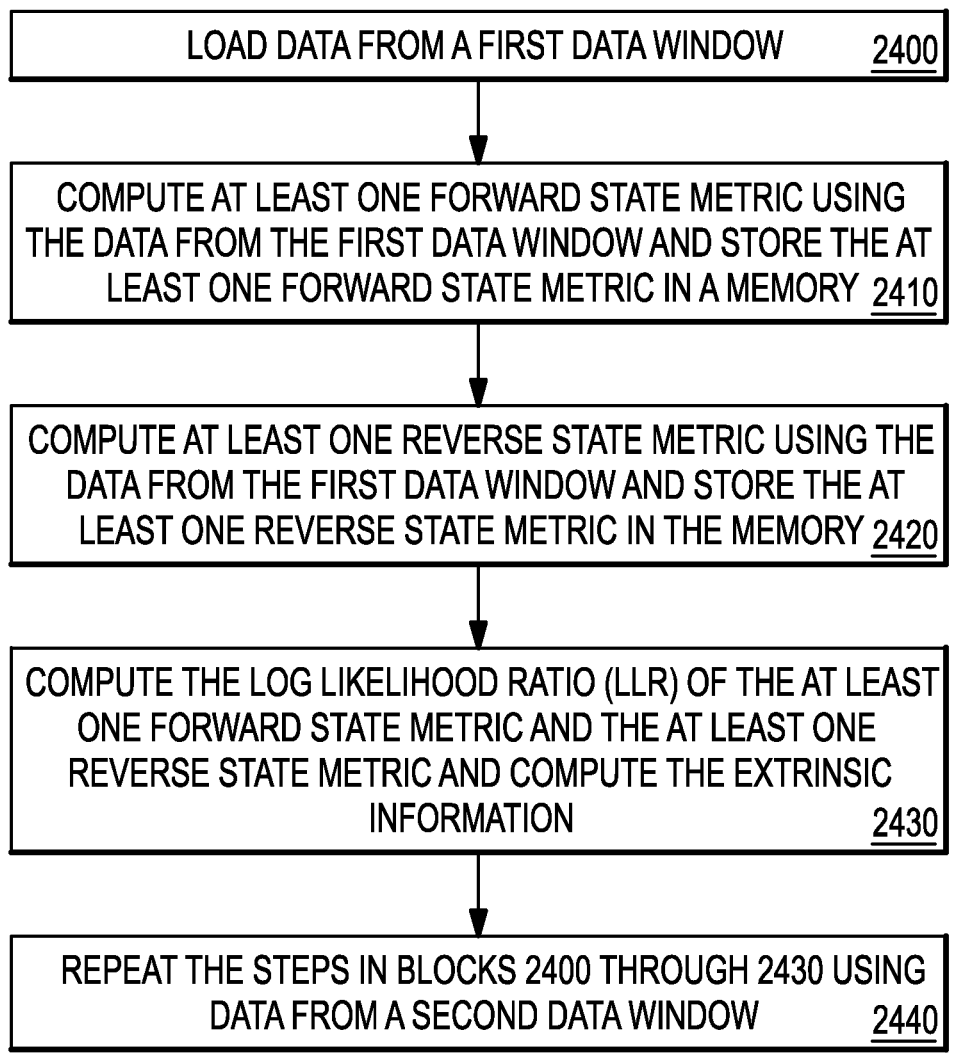
FIG. 24 is an example flow diagram for high throughput unified turbo decoding.

FIG. 24 is an example flow diagram for high throughput unified turbo decoding. In block 2400, load data from a first data window. In one aspect, a data window is a time interval portion of a demodulated bit stream inputted to a turbo decoder. In block 2410, compute at least one forward state metric using the data from the first data window and store the at least one forward state metric in a memory. Following block 2410, in block 2420, compute at least one reverse state metric using the data from the first data window and store the at least one reverse state metric in the memory. In another aspect, the reverse state metric is computed before the forward state metric and stored in the memory before proceeding to computing the forward state metric and storing it in the memory. One skilled in the art would understand that the sequential order of computing the forward state metric and the reverse state metric can be done in any order without affecting the spirit and scope of the present disclosure.

Following block 2420, in block 2430, compute the log likelihood ratio (LLR) of the at least one forward state metric and the at least one reverse state metric and compute the extrinsic information. The extrinsic information is fed back to the decoder input. In one aspect, the extrinsic information is defined by equation (1)

$$\lambda_e^i(t) = \lambda^i(t) - \log\left(\frac{Pr(c_t = i)}{Pr(c_t = 0)}\right) - r_t^T \cdot (s_t^i - s_t^0). \quad (1)$$

Following block 2430, in block 2440, repeat the steps in blocks 2400 through 2430 using data from a second data window. One skilled in the art would understand that the steps in blocks 2400 through 2430 can be repeated multiple times using data from multiple data windows. In one aspect, the computed LLR is further inputted into a post processing unit. In another aspect, the extrinsic information is fed back to the decoder input.

Figure 25:
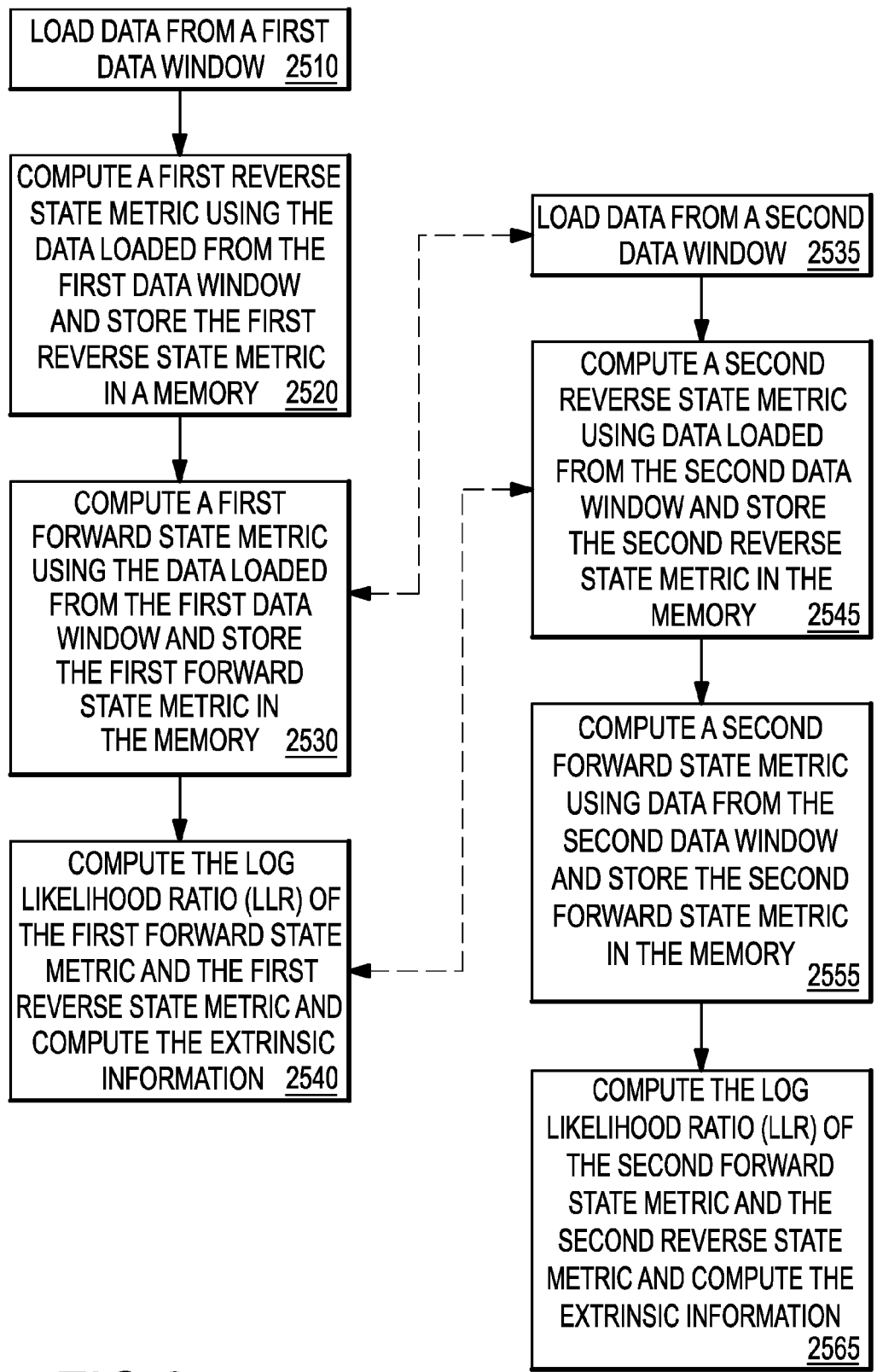
FIG. 25 is an example flow diagram for high throughput unified turbo decoding for a single maximum a posteriori (MAP), single log likelihood ratio computation (LLRC) architecture.

FIG. 25 is an example flow diagram for high throughput unified turbo decoding for a single maximum a posteriori (MAP), single log likelihood ratio computation (LLRC) architecture. In block 2510, load data from a first data window. Following block 2510, in block 2520, compute a first reverse state metric using the data loaded from the first data window and store the first reverse state metric in a memory. Following block 2520, in block 2530, compute a first forward state metric using the data loaded from the first data window and store the first forward state metric in the memory. In parallel with the step of block 2530, perform the step in block 2535. In block 2535, load data from a second data window. Following block 2530, in block 2540, compute the log likelihood ratio (LLR) of the first forward state metric and the first reverse state metric and compute the extrinsic information. In one aspect, the extrinsic information is defined by equation (1).

In parallel with the step of block 2540, perform the step in block 2545. In block 2545, compute a second reverse state metric using data from the second data window and store the second reverse state metric in the memory. Following block 2545, in block 2555, compute a second forward state metric using data from the second data window and store the second forward state metric in the memory. In one aspect, the memory used for storing the second reverse state metric and the second forward state metric is the same as the memory for storing the first reverse state metric and the first forward state metric. In another aspect, different memories are used. Following block 2555, in block 2565, compute the log likelihood ratio (LLR) of the second forward state metric and the second reverse state metric and compute the extrinsic information. In one aspect, the computed LLR and is further inputted to a post processing unit. In another aspect, the extrinsic information is fed back to the decoder input.

Figure 26:
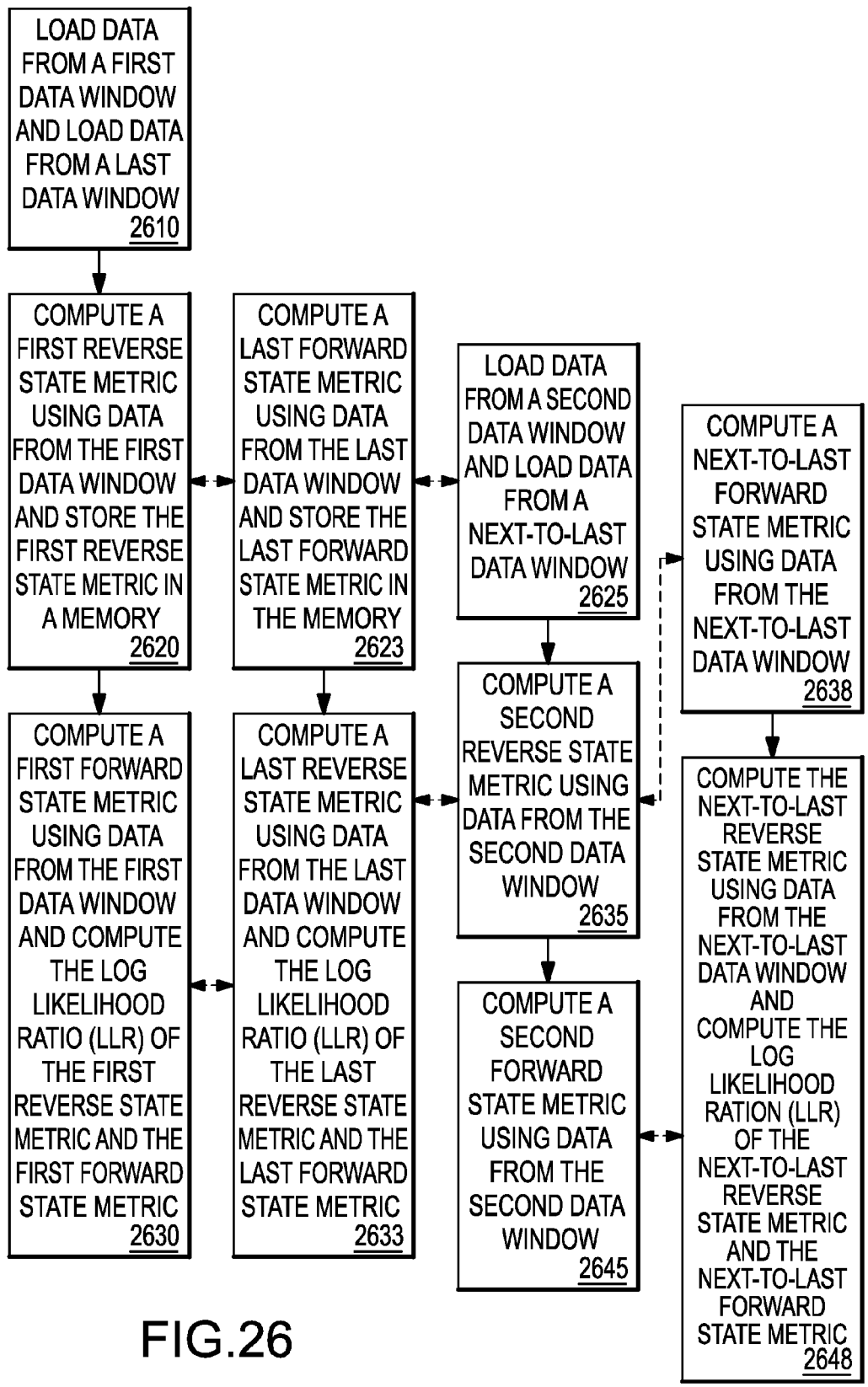
FIG. 26 is an example flow diagram for high throughput unified turbo decoding for a dual maximum a posteriori (MAP), single log likelihood ratio computation (LLRC) architecture.

FIG. 26 is an example flow diagram for high throughput unified turbo decoding for a dual maximum a posteriori (MAP), single log likelihood ratio computation (LLRC) architecture. In block 2610, load data from a first data window and load data from a last data window. The last data window is the data window that is the last in a sequence of data windows in a data stream received by a turbo decoder. Following block 2610, in block 2620, compute a first reverse state metric using data from the first data window and store the first reverse state metric in a memory. In parallel to the step of block 2620, perform the step of block 2623 and the step of block 2625. In block 2623, compute a last forward state metric using data from the last data window and store the last forward state metric in the memory. In block 2625, load data from a second data window and load data from a next-to-last data window. The next-to-last data window is the data window that is the second to the last in a sequence of data windows in the data stream received by the turbo decoder.

Following block 2620, in block 2630, compute a first forward state metric using data from the first data window and compute the log likelihood ratio (LLR) of the first reverse state metric and the first forward state metric. In one aspect, the first forward state metric is stored in the memory. In parallel to the step of block 2630, perform the steps of block 2633, block 2635 and block 2638. In block 2633, compute a last reverse state metric using data from the last data window and compute the log likelihood ratio (LLR) of the last reverse state metric and the last forward state metric. In one aspect, the last reverse state metric is stored in the memory. In block 2635, compute a second reverse state metric using data from the second data window. In block 2638, compute a next-to-last forward state metric using data from the next-to-last data window. In one aspect, the second reverse state metric and the next-to-last forward state metric are stored in the memory.

Following block 2635, in block 2645, compute a second forward state metric using data from the second data window. In one aspect, the second forward state metric is stored in the memory. In parallel to the step of block 2645, perform the step of block 2648. In block 2648, compute the next-to-last reverse state metric using data from the next-to-last data window and compute the log likelihood ratio (LLR) of the next-to-last reverse state metric and the next-to-last forward state metric. In one aspect, the next-to-last reverse state metric is stored in the memory. In one aspect, the same memory is used for storing all the reverse state metrics and the forward state metrics. In another aspect, one or more different memories are used. In one aspect, one or more of the computed LLR is inputted into a post-processing unit for further processing.

Figure 27:
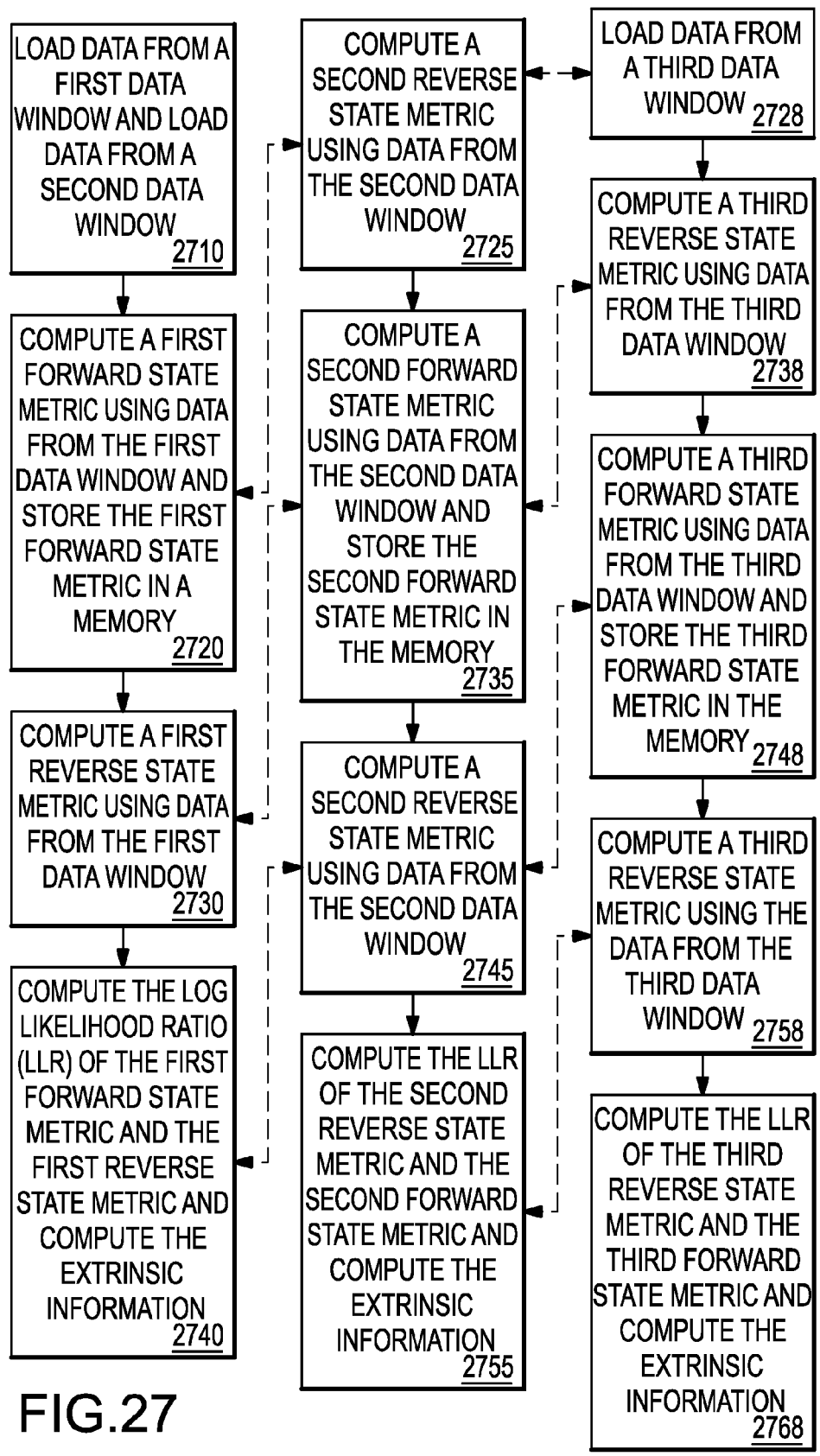
FIG. 27 is an example flow diagram for high throughput unified turbo decoding for a single maximum a posteriori (MAP) architecture.

FIG. 27 is an example flow diagram for high throughput unified turbo decoding for a single maximum a posteriori (MAP) architecture. In block 2710, load data from a first data window and load data from a second data window. Following block 2710, perform the steps of block 2720, block 2725 and block 2728 in parallel. In block 2720, compute a first forward state metric using data from the first data window and store the first forward state metric in a memory. In block 2725, compute a second reverse state metric using data from the second data window. In block 2728, load data from a third data window.

Following blocks 2720, 2725 and 2728, perform the steps of block 2730, block 2735 and block 2738 in parallel. In block 2730, compute a first reverse state metric using data from the first data window. In block 2735, compute a second forward state metric using data from the second data window and store the second forward state metric in the memory. In block 2738, compute a third reverse state metric using data from the third data window.

Following blocks 2730, 2735 and 2738, perform the steps from block 2740, block 2745 and block 2748. In block 2740, compute the log likelihood ratio (LLR) of the first forward state metric and the first reverse state metric and compute the extrinsic information. In one aspect, the extrinsic information is defined by equation (1).

In block 2745, compute a second reverse state metric using data from the second data window. In block 2748, compute a third forward state metric using data from the third data window and store the third forward state metric in the memory. Following blocks 2740, 2745 and 2748, perform the steps of block 2755 and block 2758 in parallel. In block 2755, compute the LLR of the second reverse state metric and the second forward state metric and compute the extrinsic information. In one aspect, the extrinsic information is defined by equation (1).

In block 2758, compute a third reverse state metric using the data from the third data window. Following block 2758, in block 2768, compute the LLR of the third reverse state metric and the third forward state metric and compute the extrinsic information. In one aspect, the extrinsic information is defined by equation (1). In one aspect, one or more of the computed LLR is inputted into a post-processing unit for further processing.

One skilled in the art would understand that the steps disclosed in each of the example flow diagrams in FIGS. 24-27 can be interchanged in their order without departing from the scope and spirit of the present disclosure. Also, one skilled in the art would understand that the steps illustrated in the flow diagram are not exclusive and other steps may be included or one or more of the steps in the example flow diagram may be deleted without affecting the scope and spirit of the present disclosure.

Those of skill would further appreciate that the various illustrative components, logical blocks, modules, circuits, and/or algorithm steps described in connection with the examples disclosed herein may be implemented as electronic hardware, firmware, computer software, or combinations thereof. To clearly illustrate this interchangeability of hardware, firmware and software, various illustrative components, blocks, modules, circuits, and/or algorithm steps have been described above generally in terms of their functionality. Whether such functionality is implemented as hardware, firmware or software depends upon the particular application and design constraints imposed on the overall system. Skilled artisans may implement the described functionality in varying ways for each particular application, but such implementation decisions should not be interpreted as causing a departure from the scope or spirit of the present disclosure.

For example, for a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described therein, or a combination thereof. With software, the implementation may be through modules (e.g., procedures, functions, etc.) that perform the functions described therein. The software codes may be stored in memory units and executed by a processor unit. Additionally, the various illustrative flow diagrams, logical blocks, modules and/or algorithm steps described herein may also be coded as computer-readable instructions carried on any computer-readable medium known in the art or implemented in any computer program product known in the art.

Figure 28:
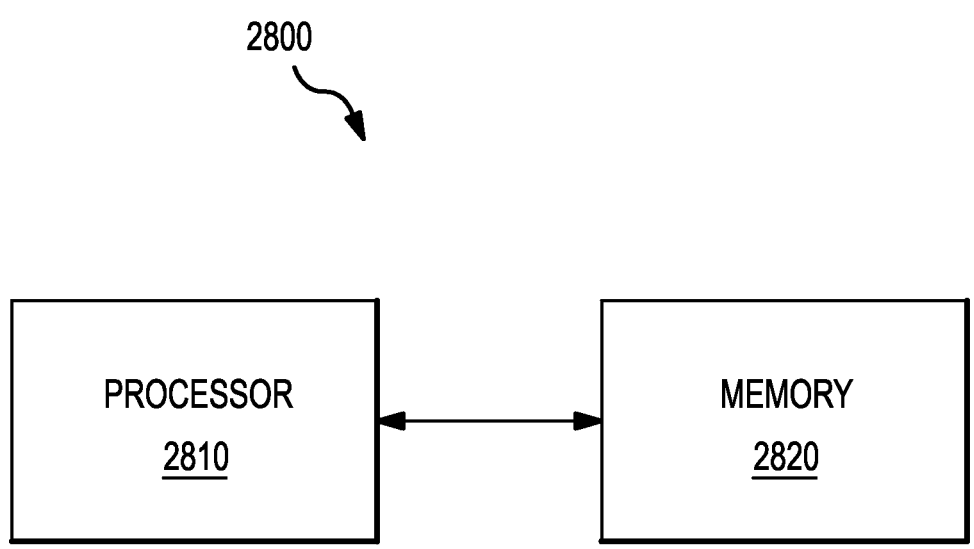
FIG. 28 illustrates an example of a device comprising a processor in communication with a memory for executing the processes for high throughput unified turbo decoding.

In one example, the illustrative components, flow diagrams, logical blocks, modules and/or algorithm steps described herein are implemented or performed with one or more processors. In one aspect, a processor is coupled with a memory which stores data, metadata, program instructions, etc. to be executed by the processor for implementing or performing the various flow diagrams, logical blocks and/or modules described herein. FIG. 28 illustrates an example of a device 2800 comprising a processor 2810 in communication with a memory 2820 for executing the processes for high throughput unified turbo decoding. In one example, the device 2800 is used to implement any of the algorithms illustrated in FIGS. 24-27. In one aspect, the memory 2820 is located within the processor 2810. In another aspect, the memory 2820 is external to the processor 2810. In one aspect, the processor includes circuitry for implementing or performing the various flow diagrams, logical blocks and/or modules described herein.

In one aspect, each of the blocks illustrated in FIGS. 24-27 are replaced with modules wherein each module comprises hardware, firmware, software, or any combination thereof for implementing the steps in the corresponding blocks. In one example, the blocks are implemented by at least one memory in communication with the at least one processor.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

The invention claimed is:

1. A method for high throughput unified turbo decoding comprising:
   loading data from a first data window;
   computing a first forward state metric using the data from the first data window;
   storing the first forward state metric in a memory;
   computing a first reverse state metric using the data from the first data window;
   storing the first reverse state metric in the memory;
   computing a log likelihood ratio (LLR) of the first data window using the first forward state metric and the first reverse state metric;
   loading data from a last data window;
   transferring the first reverse state metric from the first data window to the last data window; and computing extrinsic information for the first data window associated with the unified turbo decoding, wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

2. The method of claim 1 further comprising repeating the steps of claim 1 with data from a second data window.

3. The method of claim 1 further comprising loading data from a second data window in parallel with the computing the first forward state metric.

4. The method of claim 3 further comprising computing a second reverse state metric using data from the second data window in parallel with the computing the LLR of the first data window using the first forward state metric and the first reverse state metric.

5. The method of claim 4 further comprising computing a second forward state metric using data from the second data window.

6. The method of claim 5 further comprising computing an LLR of the second data window using the second forward state metric and the second reverse state metric.

7. The method of claim 6 further comprising computing extrinsic information for the second data window associated with the unified turbo decoding.

8. The method of claim 7 wherein the extrinsic information is fed back to a turbo decoder input.

9. The method of claim 1 further comprising:
computing a last forward state metric using the data from the last data window in parallel with the computing the first reverse state metric;
storing the last forward state metric in the memory;
computing a last reverse state metric using the data from the last data window in parallel with the computing the first forward state metric; and
computing an LLR of the last data window using the last forward state metric and the last reverse state metric.

10. The method of claim 9 wherein the last data window is adjacent to the first data window.

11. The method of claim 10 wherein the turbo decoding operates in a WiMax mode.

12. The method of claim 11 further comprising transferring the last forward state metric from the last data window to the first data window.

13. The method of claim 9 further comprising:
loading data from a second data window and loading data from a next-to-last data window in parallel with the computing the last forward state metric;
computing a second reverse state metric using the data from the second data window in parallel with the computing the last reverse state metric; and
computing a second forward state metric using the data from the second data window.

14. The method of claim 13 further comprising:
computing a next-to-last forward state metric using the data from the next-to-last data window in parallel with the computing the second reverse state metric;
computing a next-to-last reverse state metric using the data from the next-to-last data window in parallel with the computing the second forward state metric; and
computing an LLR of the next-to-last data window using the next-to-last forward state metric and the next-to-last reverse state metric.

15. The method of claim 1 further comprising:
loading data from a second data window;
computing a second reverse state metric using the data from the second data window in parallel with the computing the first forward state metric;
computing a second forward state metric using the data from the second data window in parallel with the computing the first reverse state metric;
computing another second reverse state metric using the data from the second data window in parallel with the computing the LLR of the first data window using the first forward state metric and the first reverse state metric; and
computing an LLR of the second data window using the second forward state metric and the second reverse state metric.

16. The method of claim 15 further comprising:
loading data from a third data window;
computing a third reverse state metric using the data from the third data window
in parallel with the computing the second forward state metric;
computing a third forward state metric using the data from the third data window in parallel with the computing the second reverse state metric;
computing another third reverse state metric using the data from the third data window in parallel with the computing the LLR of the second data window using the second forward state metric and the second reverse state metric; and
computing an LLR of the third data window using the third forward state metric and the third reverse state metric.

17. The method of claim 16 further comprising computing extrinsic information for the second data window associated with the unified turbo decoding.

18. The method of claim 17 wherein the extrinsic information for the second data window is defined by $$\lambda_e^i(t) = \lambda^i(t) - \log\left(\frac{Pr(c_t = i)}{Pr(c_t = 0)}\right) - r_t^T \cdot (s_t^i - s_t^0).$$

19. A receiver for high throughput unified turbo decoding comprising:
an antenna for receiving an electromagnetic wave comprising a received signal;
a receiver front-end for generating a digital signal from the received signal;
a demodulator coupled to the receiver front-end for demodulating the digital signal and outputting a demodulated bit stream; and
a turbo decoder for performing the following:
loading data from a first data window of the demodulated bit stream;

computing a first forward state metric using the data from the first data window;
storing the first forward state metric in a memory;
computing a first reverse state metric using the data from the first data window;
storing the first reverse state metric in the memory;
computing a log likelihood ratio (LLR) of the first data window using the first forward state metric and the first reverse state metric;
loading data from a last data window of the demodulated bit stream;
transferring the first reverse state metric from the first data window to the last data window; and
computing extrinsic information for the first data window associated with the unified turbo decoding,
wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

20. The receiver of claim 19 wherein the turbo decoder further performs repeating the steps of claim 19 with data from a second data window of the demodulated bit stream.

21. The receiver of claim 19 wherein the turbo decoder further performs loading data from a second data window of the demodulated bit stream in parallel with the computing the first forward state metric.

22. The receiver of claim 21 wherein the turbo decoder further performs computing a second reverse state metric using data from the second data window in parallel with the computing the LLR of the first data window using the first forward state metric and the first reverse state metric.

23. The receiver of claim 22 wherein the turbo decoder further performs computing a second forward state metric using data from the second data window.

24. The receiver of claim 23 wherein the turbo decoder further performs computing an LLR of the second data window using the second forward state metric and the second reverse state metric.

25. The receiver of claim 24 wherein the turbo decoder further performs computing extrinsic information for the second data window associated with the unified turbo decoding.

26. The receiver of claim 25 wherein the extrinsic information is fed back to a turbo decoder input.

27. The receiver of claim 19 wherein the turbo decoder further performs:
computing a last forward state metric using the data from the last data window in parallel with the computing the first reverse state metric;
storing the last forward state metric in the memory;
computing a last reverse state metric using the data from the last data window in parallel with the computing the first forward state metric; and
computing an LLR of the last data window using the last forward state metric and the last reverse state metric.

28. The receiver of claim 27 wherein the last data window is adjacent to the first data window.

29. The receiver of claim 28 wherein the turbo decoder operates in a WiMax mode.

30. The receiver of claim 29 wherein the turbo decoder further performs transferring the last forward state metric from the last data window to the first data window.

31. The receiver of claim 27 wherein the turbo decoder further performs:
loading data from a second data window of the demodulated bit stream and loading data from a next-to-last data window of the demodulated bit stream in parallel with the step of computing the last forward state metric;
computing a second reverse state metric using the data from the second data window in parallel with the computing the last reverse state metric; and
computing a second forward state metric using the data from the second data window.

32. The receiver of claim 31 wherein the turbo decoder further performs:
computing a next-to-last forward state metric using the data from the next-to-last data window in parallel with the computing the second reverse state metric;
computing a next-to-last reverse state metric using the data from the next-to-last data window in parallel with the computing the second forward state metric; and
computing an LLR of the next-to-last data window using the next-to-last forward state metric and the next-to-last reverse state metric.

33. The receiver of claim 19 wherein the turbo decoder further performs:
loading data from a second data window of the demodulated bit stream;
computing a second reverse state metric using the data from the second data window in parallel with the computing the first forward state metric;
computing a second forward state metric using the data from the second data window in parallel with the computing the first reverse state metric;
computing another second reverse state metric using the data from the second data window in parallel with the computing the LLR of the first data window using the first forward state metric and the first reverse state metric; and
computing an LLR of the second data window using the second forward state metric and the second reverse state metric.

34. The receiver of claim 33 wherein the turbo decoder further performs:
loading data from a third data window of the demodulated bit stream;
computing a third reverse state metric using the data from the third data window in parallel with the computing the second forward state metric;
computing a third forward state metric using the data from the third data window in parallel with the computing the second reverse state metric;
computing another third reverse state metric using the data from the third data window in parallel with the computing the LLR of the second data window using the second forward state metric and the second reverse state metric; and
computing an LLR of the third data window using the third forward state metric and the third reverse state metric.

35. The receiver of claim 34 wherein the turbo decoder further performs computing extrinsic information for the second data window associated with the unified turbo decoding.

36. The receiver of claim 35 wherein the extrinsic information for the second data window is defined by $$\lambda_e^i(t) = \lambda^i(t) - \log\left(\frac{Pr(c_t = i)}{Pr(c_t = 0)}\right) - r_t^T \cdot (s_t^i - s_t^0).$$

37. A receiver for high throughput unified turbo decoding comprising:
   means for receiving an electromagnetic wave comprising a received signal;
   means for generating a digital signal from the received signal;
   means for demodulating the digital signal and outputting a demodulated bit stream; and
   means for performing the following:
      loading data from a first data window of the demodulated bit stream;
      computing a first forward state metric using the data from the first data window;
      storing the first forward state metric in a memory;
      computing a first reverse state metric using the data from the first data window;
      storing the first reverse state metric in the memory;
      computing a log likelihood ratio (LLR) of the first data window using the first forward state metric and the first reverse state metric;
      loading data from a last data window of the demodulated bit stream;
      transferring the first reverse state metric from the first data window to the last data window; and
      computing extrinsic information for the first data window associated with the unified turbo decoding, wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

38. The receiver of claim 37 further comprising means for repeating the steps of claim 37 with data from a second data window of the demodulated bit stream.

39. The receiver of claim 37 further comprising means for loading data from a second data window of the demodulated bit stream in parallel with the computing the first forward state metric.

40. The receiver of claim 39 further comprising means for computing a second reverse state metric using data from the second data window in parallel with the computing the LLR of the first data window using the first forward state metric and the first reverse state metric.

41. The receiver of claim 40 further comprising means for computing a second forward state metric using data from the second data window.

42. The receiver of claim 41 further comprising means for computing a log likelihood ratio of the second data window using the second forward state metric and the second reverse state metric.

43. The receiver of claim 42 further comprising means for computing extrinsic information for the second data window associated with the unified turbo decoding.

44. The receiver of claim 43 wherein the extrinsic information is fed back to a turbo decoder input.

45. The receiver of claim 37 further comprising:
   means for computing a last forward state metric using the data from the last data window in parallel with the computing the first reverse state metric;
   means for storing the last forward state metric in the memory;
   means for computing a last reverse state metric using the data from the last data window in parallel with the computing the first forward state metric; and
   means for computing an LLR of the last data window using the last forward state metric and the last reverse state metric.

46. The receiver of claim 45 wherein the last data window is adjacent to the first data window.

47. The receiver of claim 46 wherein the receiver operates in a WiMax mode.

48. The receiver of claim 47 further comprising means for transferring the last forward state metric from the last data window to the first data window.

49. The receiver of claim 45 further comprising:
   means for loading data from a second data window of the demodulated bit stream and loading data from a next-to-last data window of the demodulated bit stream in parallel with the computing the last forward state metric;
   means for computing a second reverse state metric using the data from the second data window in parallel with the computing the last reverse state metric; and
   means for computing a second forward state metric using the data from the second data window.

50. The receiver of claim 49 further comprising:
   means for computing a next-to-last forward state metric using the data from the next-to-last data window in parallel with the computing the second reverse state metric;
   means for computing a next-to-last reverse state metric using the data from the next-to-last data window in parallel with the computing the second forward state metric; and
   means for computing an LLR of the next-to-last data window using the next-to-last forward state metric and the next-to-last reverse state metric.

51. The receiver of claim 37 further comprising:
   means for loading data from a second data window of the demodulated bit stream;
   means for computing a second reverse state metric using the data from the second data window in parallel with the computing the first forward state metric;
   means for computing a second forward state metric using the data from the second data window in parallel with the computing the first reverse state metric;
   means for computing another second reverse state metric using the data from the second data window in parallel with the computing the LLR of the first data window using the first forward state metric and the first reverse state metric; and means for computing an LLR of the second data window using the second forward state metric and the second reverse state metric.

52. The receiver of claim 51 further comprising:
means for loading data from a third data window of the demodulated bit stream;
means for computing a third reverse state metric using the data from the third data window in parallel with the computing the second forward state metric;
means for computing a third forward state metric using the data from the third data window in parallel with the computing the second reverse state metric;
means for computing another third reverse state metric using the data from the third data window in parallel with the computing the LLR of the second data window using the second forward state metric and the second reverse state metric; and
means for computing an LLR of the third data window using the third forward state metric and the third reverse state metric.

53. The receiver of claim 52 further comprising means for computing extrinsic information for the second data window associated with the unified turbo decoding.

54. The receiver of claim 53 wherein the extrinsic information for the second data window is defined by $$\lambda_e^i(t) = \lambda^i(t) - \log\left(\frac{Pr(c_t = i)}{Pr(c_t = 0)}\right) - r_t^T \cdot (s_t^i - s_t^0).$$

55. A non-transitory computer-readable medium storing a computer program, wherein execution of the computer program is for:
loading data from a first data window;
computing a first forward state metric using the data from the first data window;
storing the first forward state metric in a memory;
computing a first reverse state metric using the data from the first data window;
storing the first reverse state metric in the memory;
computing a log likelihood ratio (LLR) of the first data window using the first forward state metric and the first reverse state metric;
loading data from a last data window;
transferring the first reverse state metric from the first data window to the last data window; and
computing extrinsic information for the first data window associated with unified turbo decoding,
wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

56. The non-transitory computer-readable medium of claim 55 wherein execution of the computer program is also for repeating the steps of claim 55 with data from a second data window.

57. The non-transitory computer-readable medium of claim 55 wherein execution of the computer program is also for loading data from a second data window in parallel with the computing the first forward state metric.

58. The non-transitory computer-readable medium of claim 57 wherein execution of the computer program is also for computing a second reverse state metric using data from the second data window in parallel with the computing the LLR of the first data window using the first forward state metric and the first reverse state metric.

59. The non-transitory computer-readable medium of claim 58 wherein execution of the computer program is also for computing a second forward state metric using data from the second data window.

60. The non-transitory computer-readable medium of claim 59 wherein execution of the computer program is also for computing an LLR of the second data window using the second forward state metric and the second reverse state metric.

61. The non-transitory computer-readable medium of claim 60 wherein execution of the computer program is also for computing extrinsic information for the second data window associated with the unified turbo decoding.

62. The non-transitory computer-readable medium of claim 61 wherein the extrinsic information is fed back to a turbo decoder input.

63. The non-transitory computer-readable medium of claim 55 wherein execution of the computer program is also for:
computing a last forward state metric using the data from the last data window in parallel with the computing the first reverse state metric;
storing the last forward state metric in the memory;
computing a last reverse state metric using the data from the last data window in parallel with the computing the first forward state metric; and
computing an LLR of the last data window using the last forward state metric and the last reverse state metric.

64. The non-transitory computer-readable medium of claim 63 wherein the last data window is adjacent to the first data window.

65. The non-transitory computer-readable medium of claim 64 wherein the execution of the computer program operates in a WiMax mode.

66. The non-transitory computer-readable medium of claim 65 wherein execution of the computer program is also for transferring the last forward state metric from the last data window to the first data window.

67. The non-transitory computer-readable medium of claim 63 wherein execution of the computer program is also for:
loading data from a second data window and loading data from a next-to-last data window in parallel with the computing the last forward state metric;
computing a second reverse state metric using the data from the second data window in parallel with the computing the last reverse state metric; and
computing a second forward state metric using the data from the second data window.

68. The non-transitory computer-readable medium of claim 67 wherein execution of the computer program is also for:
computing a next-to-last forward state metric using the data from the next-to-last data window in parallel with the computing the second reverse state metric;
computing a next-to-last reverse state metric using the data from the next-to-last data window in parallel with the computing the second forward state metric; and
computing an LLR of the next-to-last data window using the next-to-last forward state metric and the next-to-last reverse state metric.

69. The non-transitory computer-readable medium of claim 55 wherein execution of the computer program is also for:
loading data from a second data window;
computing a second reverse state metric using the data from the second data window in parallel with the computing the first forward state metric;
computing a second forward state metric using the data from the second data window in parallel with the computing the first reverse state metric;
computing another second reverse state metric using the data from the second data window in parallel with the computing the LLR of the first data window using the first forward state metric and the first reverse state metric; and
computing an LLR of the second data window using the second forward state metric and the second reverse state metric.

70. The non-transitory computer-readable medium of claim 69 wherein execution of the computer program is also for:
loading data from a third data window;
computing a third reverse state metric using the data from the third data window in parallel with the computing the second forward state metric;
computing a third forward state metric using the data from the third data window in parallel with the computing the second reverse state metric;
computing another third reverse state metric using the data from the third data window in parallel with the computing the LLR of the second data window using the second forward state metric and the second reverse state metric; and
computing an LLR of the third data window using the third forward state metric and the third reverse state metric.

71. The non-transitory computer-readable medium of claim 70 wherein execution of the computer program is also for computing extrinsic information for the second data window associated with the unified turbo decoding.

72. The non-transitory computer-readable medium of claim 71 wherein the extrinsic information for the second data window is defined by $$\lambda_e^i(t) = \lambda^i(t) - \log\left(\frac{Pr(c_t = i)}{Pr(c_t = 0)}\right) - r_t^T \cdot (s_t^i - s_t^0).$$

73. A method for high throughput unified turbo decoding comprising:
loading data from a previous data window, wherein the previous data window occurs previous in time to a current data window;
loading data from the current data window;
loading data from a next data window, wherein the next data window occurs next in time to the current data window;
computing a current data window forward state metric using the data from the current data window;
storing the current data window forward state metric in a memory;
transferring the computed current data window forward state metric to the next data window to be used as a beginning forward state for computing a forward state metric in the next data window;
computing a current data window reverse state metric using the data from the current data window;
storing the current data window reverse state metric in the memory;
transferring the computed current data window reverse state metric to the previous data window to be used as a beginning reverse state for computing a reverse state metric in the previous data window;
computing a log likelihood ratio (LLR) of the current data window using the current data window forward state metric and the current data window reverse state metric; and
computing extrinsic information for the current data window,
wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$,
$r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

74. The method of claim 73 wherein the turbo decoding operates in one of the following modes: long term evolution (LTE), wideband code division multiple access (WCDMA), code division multiple access 2000 (CDMA2000) or wireless microwave access (WiMax) mode.

75. The method of claim 73 wherein the steps of claim 73 are repeated for another set of data windows.

76. A method for high throughput unified turbo decoding comprising:
loading data from a first data window, wherein the first data window occurs previous in time to a last data window;
loading data from the last data window;
computing a first data window reverse state metric using the data from the first data window;
storing the first data window reverse state metric in a memory;
transferring the computed first data window reverse state metric to the last data window to be used as a beginning reverse state for computing a last data window reverse state metric;
computing a last data window forward state metric using the data from the last data window;

storing the last data window forward state metric in the memory;
transferring the computed last data window forward state metric to the first data window to be used as a beginning forward state for computing a first data window forward state metric; and
computing extrinsic information for the first data window associated with the unified turbo decoding,
wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

77. The method of claim 76 wherein the first data window is adjacent to the last data window.

78. The method of claim 77 wherein the turbo decoding operates in a wireless microwave access (WiMax) mode.

79. A receiver for high throughput unified turbo decoding comprising:
an antenna for receiving an electromagnetic wave comprising a received signal;
a receiver front-end for generating a digital signal from the received signal;
a demodulator coupled to the receiver front-end for demodulating the digital signal and outputting a demodulated bit stream; and
a turbo decoder for performing the following:
loading data from a previous data window of the demodulated bit stream, wherein the previous data window occurs previous in time to a current data window;
loading data from the current data window of the demodulated bit stream;
loading data from a next data window of the demodulated bit stream, wherein the next data window occurs next in time to the current data window;
computing a current data window forward state metric using the data from the current data window;
transferring the computed current data window forward state metric to the next data window to be used as a beginning forward state for computing a forward state metric in the next data window;
computing a current data window reverse state metric using the data from the current data window;
transferring the computed current data window reverse state metric to the previous data window to be used as a beginning reverse state for computing a reverse state metric in the previous data window;
computing a log likelihood ratio (LLR) of the current data window using the current data window forward state metric and the current data window reverse state metric; and
computing extrinsic information for the current data window, wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

80. The receiver of claim 79 wherein the turbo decoder operates in one of the following modes: long term evolution (LTE), wideband code division multiple access (WCDMA), code division multiple access 2000 (CDMA2000) or wireless microwave access (WiMax) mode.

81. The receiver of claim 79 wherein the steps performed by the turbo decoder are repeated for another set of data windows of the demodulated bit stream.

82. A receiver for high throughput unified turbo decoding comprising:
an antenna for receiving an electromagnetic wave comprising a received signal;
a receiver front-end for generating a digital signal from the received signal;
a demodulator coupled to the receiver front-end for demodulating the digital signal and outputting a demodulated bit stream; and
a turbo decoder for performing the following:
loading data from a first data window of the demodulated bit stream, wherein the first data window occurs previous in time to a last data window;
loading data from the last data window of the demodulated bit stream;
computing a first data window reverse state metric using the data from the first data window;
transferring the computed first data window reverse state metric to the last data window to be used as a beginning reverse state for computing a last data window reverse state metric;
computing a last data window forward state metric using the data from the last data window;
transferring the computed last data window forward state metric to the first data window to be used as a beginning forward state for computing a first data window forward state metric; and
computing extrinsic information for the first data window associated with the unified turbo decoding,
wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

83. The receiver of claim 82 wherein the first data window is adjacent to the last data window.

84. The receiver of claim 83 wherein the turbo decoder operates in a wireless microwave access (WiMax) mode.

85. A receiver for high throughput unified turbo decoding comprising:
   means for loading data from a previous data window, wherein the previous data window occurs previous in time to a current data window;
   means for loading data from the current data window;
   means for loading data from a next data window, wherein the next data window occurs next in time to the current data window;
   means for computing a current data window forward state metric using the data from the current data window;
   means for transferring the computed current data window forward state metric to the next data window to be used as a beginning forward state for computing a forward state metric in the next data window;
   means for computing a current data window reverse state metric using the data from the current data window;
   means for transferring the computed current data window reverse state metric to the previous data window to be used as a beginning reverse state for computing a reverse state metric in the previous data window;
   means for computing a log likelihood ratio (LLR) of the current data window using the current data window forward state metric and the current data window reverse state metric; and
   means for computing extrinsic information for the current data window,
   wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

86. The receiver of claim 85 wherein the receiver operates in one of the following modes: long term evolution (LTE), wideband code division multiple access (WCDMA), code division multiple access 2000 (CDMA2000) or wireless microwave access (WiMax) mode.

87. A receiver for high throughput unified turbo decoding comprising:
   loading data from a first data window, wherein the first data window occurs previous in time to a last data window;
   loading data from the last data window;
   computing a first data window reverse state metric using the data from the first data window;
   storing the first data window reverse state metric in a memory;
   transferring the computed first data window reverse state metric to the last data window to be used as a beginning reverse state for computing a last data window reverse state metric;
   computing a last data window forward state metric using the data from the last data window;
   storing the last data window forward state metric in the memory;
   transferring the computed last data window forward state metric to the first data window to be used as a beginning forward state for computing a first data window forward state metric; and
   computing extrinsic information for the first data window associated with the unified turbo decoding,
   wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$,
$r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

88. The receiver of claim 87 wherein the first data window is adjacent to the last data window.

89. The receiver of claim 88 wherein the receiver operates in a wireless microwave access (WiMax) mode.

90. A non-transitory computer-readable medium storing a computer program, wherein execution of the computer program is for:
   loading data from a previous data window, wherein the previous data window occurs previous in time to a current data window;
   loading data from the current data window;
   loading data from a next data window, wherein the next data window occurs next in time to the current data window;
   computing a current data window forward state metric using the data from the current data window;
   transferring the computed current data window forward state metric to the next data window to be used as a beginning forward state for computing a forward state metric in the next data window;
   computing a current data window reverse state metric using the data from the current data window;
   transferring the computed current data window reverse state metric to the previous data window to be used as a beginning reverse state for computing a reverse state metric in the previous data window;

computing a log likelihood ratio (LLR) of the current data window using the current data window forward state metric and the current data window reverse state metric; and computing extrinsic information for the current data window, wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

91. A non-transitory computer-readable medium storing a computer program, wherein execution of the computer program is for:

loading data from a first data window, wherein the first data window occurs previous in time to a last data window;

loading data from the last data window;

computing a first data window reverse state metric using the data from the first data window;

transferring the computed first data window reverse state metric to the last data window to be used as a beginning reverse state for computing a last data window reverse state metric;

computing a last data window forward state metric using the data from the last data window;

transferring the computed last data window forward state metric to the first data window to be used as a beginning forward state for computing a first data window forward state metric; and computing extrinsic information for the first data window, wherein the extrinsic information is defined by $$\lambda_e^i(t) = \lambda^i(t) - \log\left(\frac{Pr(c_t = i)}{Pr(c_t = 0)}\right) - r_t^T \cdot (s_t^i - s_t^0),$$

where $\lambda_e^i(t)$ is the extrinsic information, $\lambda^i(t)$ is a quaternary LLR, $$\log\left(\frac{Pr(c_t = i)}{Pr(c_t = 0)}\right)$$

is an input extrinsic LLR defined by a logarithm of a ratio of probabilities for systematic symbol $c_t$, $r_t^T \cdot (s_t^i - s_t^0)$ is a systematic LLR defined by a vector dot product between systematic bit LLR vector $r_t$ and a difference between two systematic bit vectors $s_t^i$ and $s_t^0$.

* * * * *